United States Patent [19]

Kimura et al.

[11] Patent Number: 5,592,163
[45] Date of Patent: Jan. 7, 1997

[54] CODING SYSTEM

[75] Inventors: Tomohiro Kimura; Shigenori Kino; Masayuki Yoshida; Fumitaka Ono, all of Kanagawa, Japan

[73] Assignee: Mitsubishi Denki Kabushiki Kaisha, Tokyo, Japan

[21] Appl. No.: 284,086

[22] Filed: Aug. 1, 1994

[30] Foreign Application Priority Data

Aug. 6, 1993 [JP] Japan ................................. 5-196406
Jun. 22, 1994 [JP] Japan ................................. 6-140311

[51] Int. Cl.$^6$ ............................................. H03M 7/00
[52] U.S. Cl. ............................................. 341/107
[58] Field of Search ...................... 341/107, 51, 65, 341/64, 67, 87; 364/260.6, 513.5; 370/83, 84

[56] References Cited

U.S. PATENT DOCUMENTS

| | | |
|---|---|---|
| 4,247,908 | 1/1981 | Lockhart, Jr. et al. |
| 4,800,441 | 1/1989 | Sato ............................. 358/261.1 |
| 5,059,976 | 10/1991 | Ono et al. ........................ 341/51 |
| 5,206,742 | 4/1995 | Soga et al. ...................... 358/427 |
| 5,445,577 | 10/1995 | Slivka et al. ..................... 341/51 |

FOREIGN PATENT DOCUMENTS 0480115  4/1992  European Pat. Off.

Primary Examiner—Brian K. Young
Attorney, Agent, or Firm—Wolf, Greenfield & Sacks, P.C.

[57] ABSTRACT

This invention relates to a coding system and the coding method in encoding information source symbols of an image. When the total number of original information source symbols cannot be known at the decoding site just from the encoded symbols, it is an object to finish the decoding process correctly and decode the symbols equal to the number of original information source symbols.

At an encoding site, the total number of information source unit composed of a finite number of information source symbols is placed at the tail of code at the completion of encoding process. For example, at the encoding site, the number of horizontal pels of an image are transmitted in advance as an information source unit and the total number of lines are placed at the tail of code at the completion of encoding process. At the decoding site, the number of decoded lines is counted and decoded up to the number of lines placed at the tail of code. As a result, it is possible to judge the end of information source symbols without missing the total number.

35 Claims, 45 Drawing Sheets

FIG. 14

ENCODING SYMBOL 2, DECODING SYMBOL 5

| SYMBOLS OF ONE STRIPE | E0 52 | SYMBOLS OF ONE STRIPE | E0 52 | — — — — | SYMBOLS OF ONE STRIPE | E1 51 |

ONE STRIPE INCLUDES H×K NUMBER OF SYMBOLS

E1: EOS SYMBOL (TERMINATION) 51
E0: EOS SYMBOL (CONTINUATION) 52

FIG. 21

ENCODING SYMBOL 2, DECODING SYMBOL 5

| M | L | X0 | M | L | X0 | M | L | L | X0 | M | L | X1 |
|---|---|----|---|---|----|---|---|---|----|---|---|----|
| 53| 54| 57 | 53| 54| 57 | 53| 54| 54| 57 | 53| 54| 56 |

N=2    N=2    N=2

TERMINATE SYMBOL SEQUENCE 55

N+2 = 4

M : MPS (MORE PROBABLE SYMBOL) 53

L : LPS (LESS PROBABLE SYMBOL) 54

X1: MARKER SYMBOL (TERMINATION) 56

X0: MARKER SYMBOL (DUMMY) 57

FIG. 33(a)
| THE NUMBER OF INSERTION TIMES | STATE S |
|---|---|
| 1 ~ 3 | S1 |
| 4 ~ 6 | S2 |
| 7 ~ 10 | S3 |
| 11 ~ 20 | S4 |
| 21 ~ 50 | S5 |
| ⋮ | ⋮ |
S1 < S2 < S3 < S4 < S5 ····
FIG. 33(b)
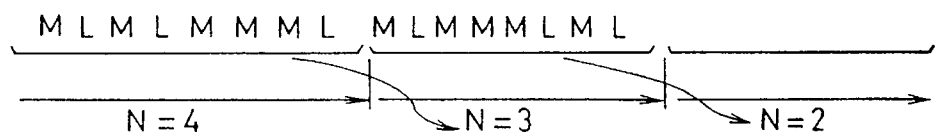
FIG. 33(c)
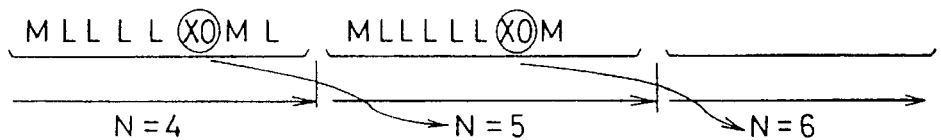
FIG. 33(d)
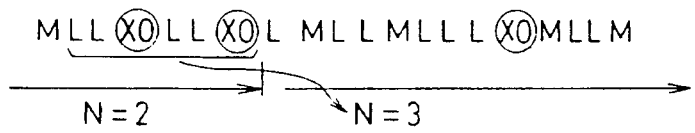
FIG. 33(e)
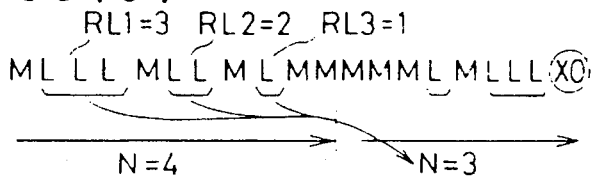

FIG. 34(a)

| RELATION OF RUN LENGTH | N (N>0) |
|---|---|
| RL1 = RL2 = RL3 | NOT CHANGED |
| RL1 > RL2 > RL3 | DECREASE |
| RL1 < RL2 < RL3 | INCREASE |
| RL1 < RL2 > RL3 | NOT CHANGED |
| RL1 > RL2 < RL3 | NOT CHANGED |
| RL1 = RL2 ≷ RL3 | NOT CHANGED |
| RL1 ≷ RL2 = RL3 | NOT CHANGED |

FIG. 34(b)

| RL1 RL2 | RL2 RL3 | N (N>0) |
|---|---|---|
| > | >> | − 2 |
| >> | > | − 1 |
| < | << | + 2 |
| << | < | + 1 |
| = | = | NOT CHANGED |
| ⋮ | ⋮ | ⋮ |

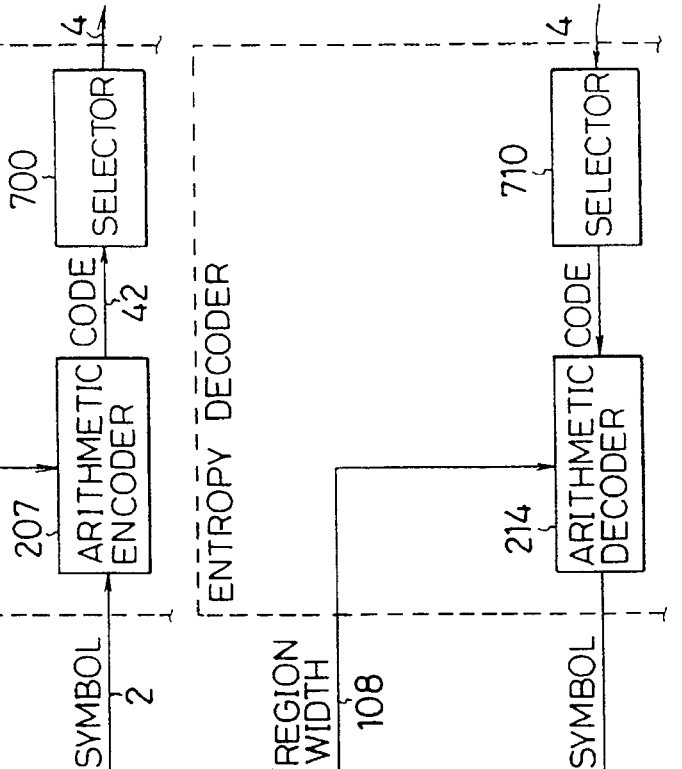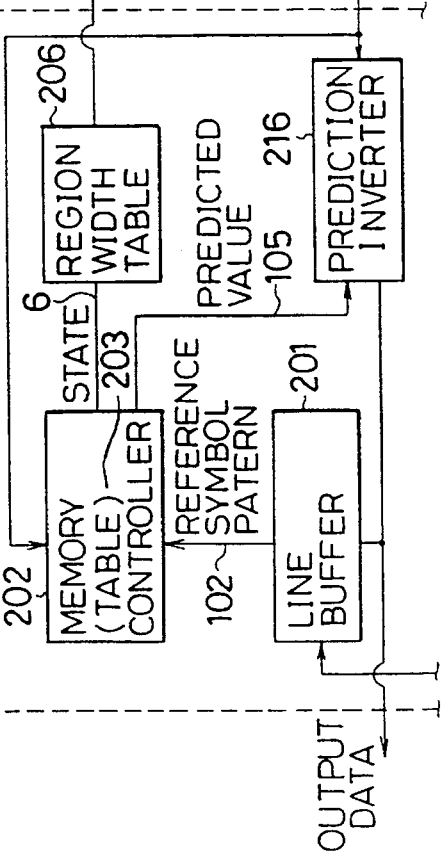
FIG. 35(a) / FIG. 35(b)

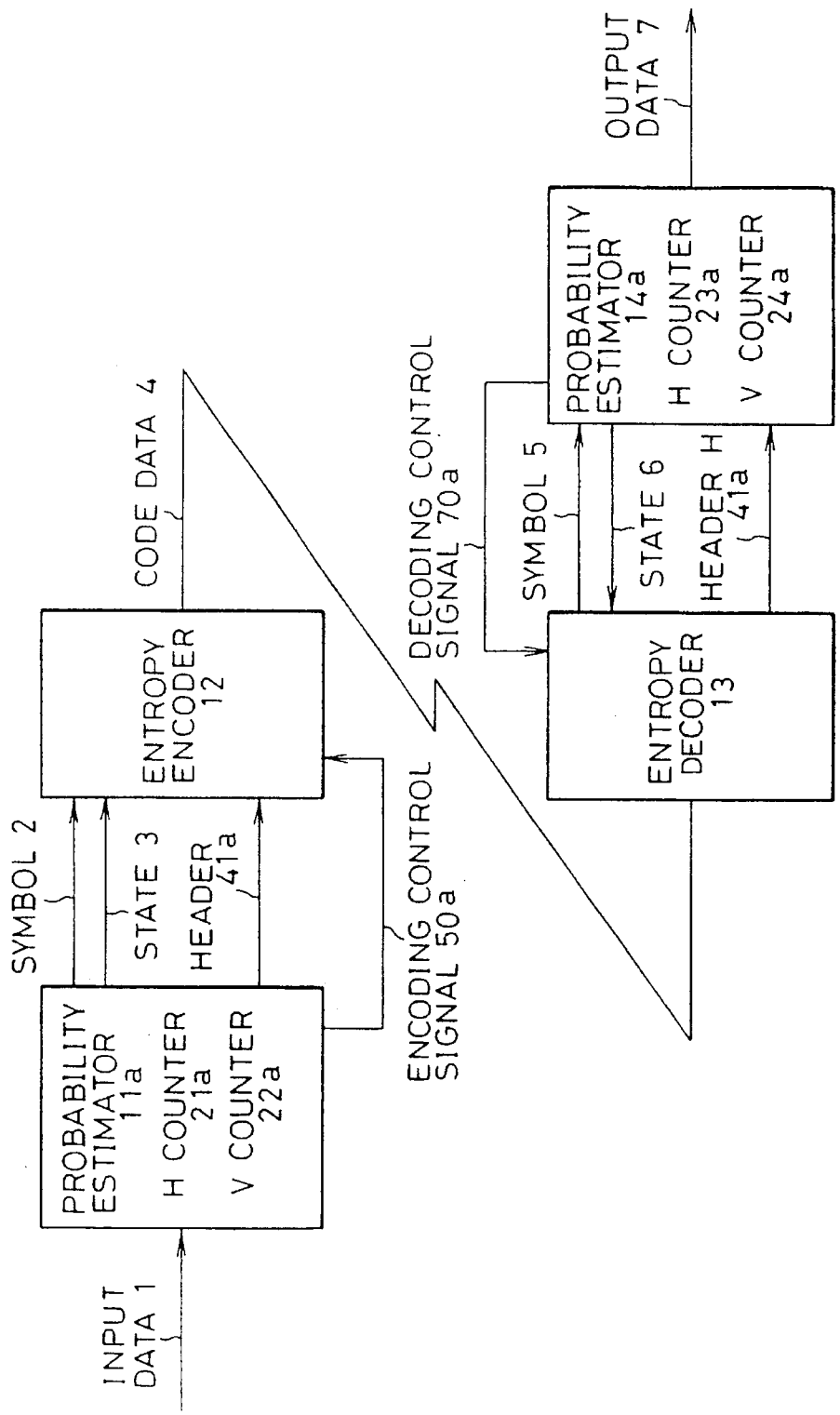

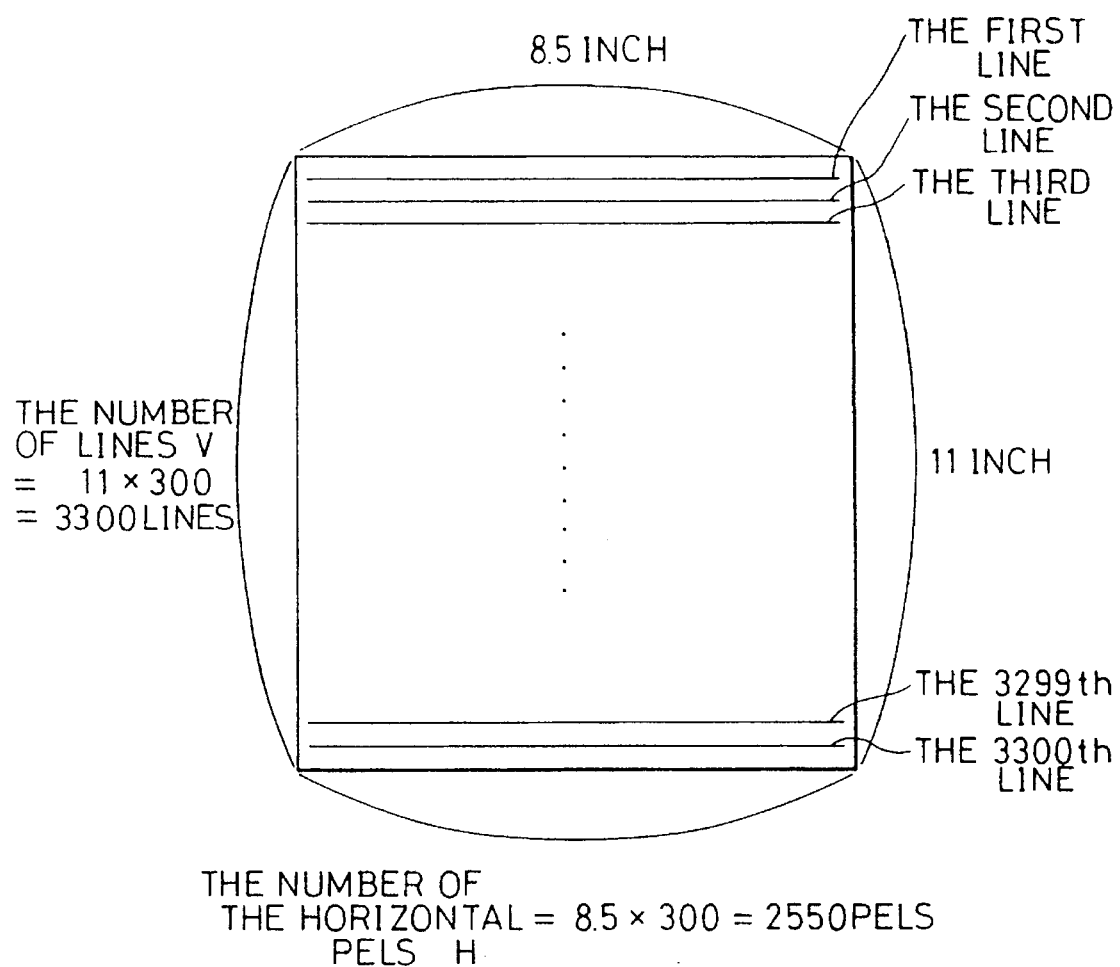

X : CODING PEL
A~E : REFERENCE SYMBOL

FIG. 41
RELATED ART

| A | B | C | D | E | STATE | PREDICTED VALUE |
|---|---|---|---|---|-------|-----------------|
| 0 | 0 | 0 | 0 | 0 | 15 | 0 |
| 0 | 0 | 0 | 0 | 1 | 13 | 0 |
| 0 | 0 | 0 | 1 | 0 | 9 | 1 |
| ⋮ | ⋮ | ⋮ | ⋮ | ⋮ | ⋮ | ⋮ |
| 1 | 1 | 1 | 1 | 0 | 5 | 1 |
| 1 | 1 | 1 | 1 | 1 | 15 | 1 |

FIG. 42
RELATED ART

| STATE | REGION WIDTH Qe CORRESPONDED TO THE STATE |
|---|---|
| 1 | 8000 hex |
| 2 | 4000 hex |
| 3 | 2000 hex |
| ⋮ | ⋮ |
| 15 | 2 hex |
| 16 | 1 hex |

CODING SYSTEM

BACKGROUND OF THE INVENTION

1. Field of the Invention

This invention relates to a coding system and the coding method in encoding information source symbols of an image. Specifically, this invention relates to a coding system and the coding method which finishes the decoding correctly when a transmitter site does not transmit the total number of information source symbols to a receiver site at the beginning of the code transmission.

2. Description of the Related Art

In a conventional coding system, there is a case which cannot know the total number of the original information source symbols from the code symbols at decoding time. For an example of image coding, as shown in ISO/IEC DIS 11544: "Progressive Bi-level Image Compression", a horizontal size H (the number of horizontal pels) and a vertical size V (the number of lines) of the image are previously transmitted from the transmitter site to the receiver site by using given fields in a header before the code transmission. Herein, pels stand for picture elements.

At the receiver site, the total number of the source symbols can be calculated as the product of the horizontal size by the vertical size. Therefore, the receiver site can judge an end of the source symbols correctly. Thus, at the receiver site, the decoding finishes according to the code received from the transmitter site without missing the end of the information source symbols. (The above-described system will be called as a conventional system, hereinafter).

In the above-described conventional system, a binary symbol stream is treated as the information source symbols and an enough memory which can store one page of the image as an object of coding is provided at the transmitter site. As pre-conditions to get the number of lines, a prescan of one page of the image must be performed. The number of lines can be transmitted through the header with the number of horizontal pels.

There is shown a block diagram of a configuration of an apparatus according to the above-described conventional system in FIG. 36. In the figure, an input data 1 is a pel of an input image. A symbol 2 is a binary symbol transferred from a probability estimator 11a (described later) to an entropy encoder 12 (described later) as an object of coding. A state 3 is a representative value of the estimated occurrence probability ratio of the symbol 2 output from the probability estimator 11a and input to the entropy encoder 12 (described later). A code data 4 is output from the entropy encoder 12 (described later) and input to an entropy decoder 13 (described later). A symbol 5 is a binary symbol transferred From an entropy decoder 13 (described later) as an object of decoding to a probability estimator 14a (described later). A state 6 is a representative value of the estimated occurrence probability ratio for the symbol 5 output from the probability estimator 14a (described later) and input to the entropy decoder 13 (described later). An output data 7 is a pel of an output image. The entropy encoder 11a outputs the symbol 2 which is an object of encoding after a predicted conversion. The entropy encoder 11a outputs the state 3 which is a representative value of the estimated occurrence probability ratio of the symbol 2. The entropy encoder 11a has a H counter 21a (described later) and a V counter 22a (described later) inside. The entropy encoder 12 inputs the symbol 2 and the state 3 and outputs the code data 4. The entropy decoder 13 inputs the code data 4 and the state 6 output from the probability estimator 14a for the symbol 5 and outputs the symbol 5 as an object of decoding. The probability estimator 14a outputs the state 6 which is a representative value of the estimated occurrence probability ratio for the symbol 5. The probability estimator 14a performs a predicted inversion of the symbol 5 input from the entropy decoder 13. And the probability estimator 14a outputs the output data 7 got after the predicted inversion. The probability estimator 14a has a H counter 23a (described later) and a V counter 24a (described later) inside. The H counter 21a counts the number of pels by every processing of input data up to the number of horizontal pels (H) transmitted through the header. The V counter 22a counts the number of lines by every processing of lines up to the number of lines (V) transmitted through the header. The H counter 23a counts the number of pels by every processing of output data up to the number of horizontal pels (H) received through the header. The V counter 24a counts the number of lines by every processing of lines up to the number of lines (V) received through the header.

A header 41a includes the number of horizontal pels (H) and the number of lines (V). A plurality of encoding control signals 50a are output for controlling the entropy encoder from the probability estimator 11a. A plurality of decoding control signals 70a are output for controlling the entropy decoder 13 from a probability estimator 14a.

FIG. 37 illustrates the number of horizontal pels (H) and the number of lines (V). In FIG. 37, there is shown a page input to a facsimile or a scanner. In this case, the page is scanned in the vertical direction and the horizontal direction by 300 dots per inch. When the size of the page is assumed to be 8.5 inch×11 inch, the number of horizontal pels (H) and the number of lines (V) can be got according to the following formula.

The number of horizontal pels (H)=8.5×300=2550 pels

The number of lines (V)=11×300=3300 lines

A sequence of the code data according to the conventional method is shown in FIG. 38.

The code data 4 contains a header 41 and a code 42 (described later). The number of the horizontal pels (H) 43a and the number of lines (V) are transmitted through the header 41.

Before the entropy encoder 12 transmits the code 42 to the entropy decoder 13, the header 41 of the code data 4 is transmitted and the number of horizontal pels 43a and the number of lines 44a are transmitted before beginning the decoding process of the entropy decoder 13, The operation of a configuration of the figure will be explained, The probability estimator 11a performs the predicted conversion from the predicted value that is predicted for the input data 1. The probability estimator 11a outputs the symbol 2. The symbol 2 is an object of coding and indicates the conformity or nonconformity as a result of comparison between a predicted value and an actual value of the information source symbol 1. The probability estimator 11a outputs the state 3 predicted for the symbol 2 to the entropy encoder 12. The entropy encoder 12 inputs the symbol 2 and the state 3 from the probability estimator 11a as parameters of encoding. The entropy encoder 12 produces the code data 4 and outputs the code data 4 to an entropy decoder 13. The entropy decoder 13 inputs the code data 4 output from the entropy encoder 12 and the state 6 output from the probability estimator 14a for the symbol 5 which is an object of decoding. The entropy decoder 13 outputs the symbol 5 to the probability estimator 14a. The probability estimator 14a outputs the state 6 predicted for the symbol 5 to the entropy decoder 13. The probability estimator 14a performs a predicted inversion based on the symbol 5 input from the entropy decoder 13 and a predicted value that is predicted for the symbol 5. If the symbol 5 indicates conformity with the predicted value, the predicted value is output as the output data 7. If the symbol 5 indicates nonconformity with the predicted value, the non-predicted value (which is an inverted value of the predicted value) is output as the output data 7.

FIG. 39 shows a block diagram of a conventional encoder. To simplify the explanation, as shown In FIG. 40, reference symbols are assumed to be symbols A, B, C, D, E located on the same scanning line and the previous scanning line which are correlated with object symbol X.

In FIG. 39, a line buffer 201 stores at least two lines of the information source symbols (corresponding to the input data 1 in FIG. 36) from the image data. The line buffer 201 selects reference symbols A, B, C, D, E in FIG. 40 and outputs the reference symbols A, B, C, D, E as a reference symbol pattern 102. A memory controller 202 outputs a state 3 and a predicted value 105 from the reference symbol pattern 102. A table 203 for each pair of the state 3 and the predicted value indicated by the reference symbol pattern 102 is stored in the memory controller 202. A prediction convertor 205 produces a predicted conversion symbol 2 (corresponding to the symbol 2 in FIG. 36) from the information source symbol 1 based on the predicted value 105. A table 206 for a region width 108 outputs a region width 108 of an arithmetic code based on the state 3 output from the memory controller 202. An arithmetic encoder 207 performs arithmetic encoding.

A H count controller 300 sets the number of horizontal pels (H) at a H register 21r and controls the count in the H counter 21a. A V count controller 400 sets the number of lines (V) at a V register 22r and controls the count in a V counter 22a. A header generator 500 generates the header 41a with the number of horizontal pels (H) and the number of lines (V). An encoding controller 600 controls encoding process by issuing the encoding control signal 50a.

A selector 700 selects a header 41a output by the header generator 500 or a code 42 output by the arithmetic encoder 207 according to a select signal 51 in the encoding control signals 50a output from the encoding controller 600. The selector 700 outputs the code data 4 which is the selected code 42 or header 41a.

There is shown an example of a table 203 for the predicted value in FIG. 41. The table 203 for the predicted value stores a state 3 and a predicted value 105, corresponding to the reference symbol pattern 102. That is, the table 203 for a predicted value stores the state 3 and the predicted value 105 corresponding to the value of the reference symbols A, B, C, D, E.

As shown in FIG. 41, a state identifies a group of 16. In this case, the higher the predicted occurrence probability ratio of the predicted value is, the higher the value of the state is.

Next, the operation will be explained. The information symbol 1 (the image data 1) is stored in the line buffer 201 in units of lines. From the line buffer 201, symbols A, B, C, D, E in FIG. 39 are selected and output as the reference symbol pattern 102. The predicted value 105 and the state 3 for the coding symbol are output from the memory controller 202. And, the state 3 is converted to the region width 108 at the table 206 for the region width shown In FIG. 6. The region width 108 is output to the arithmetic encoder 207.

On the other, the prediction convertor 205 takes exclusive OR of the predicted value 105 and the information symbol 1 and produces the predicted conversion symbol 2. The predicted conversion symbol indicates zero (MPS: More Probable Symbol) when the predicted value conforms with the actual value of the information source symbol 1. And, the predicted conversion symbol indicates one (LPS: Less Probable Symbol) when the predicted value doesn't conform with the actual value of the information source symbol 1. Further, the reference symbol pattern is used as an index of the table 203. The predicted value and the state are cited from the table 203. The predicted conversion symbol 2 is input to the memory controller 202 to update the predicted value and the state dynamically. The memory controller 202 judges the timing point of the update and updates the predicted value and the state, The arithmetic encoder 207 performs encoding process based on the region width 108 by mapping the predicted conversion symbol 2 on number line. Hereafter, the next information symbol is encoded as described above.

The H count controller 300 has the H register 21r which registers the number of horizontal pels (H). The V count controller 400 has the V register 22r which registers the number of lines (V). The number of horizontal pels (H) and the number of lines (V) are previously stored through the prescan at the H register 21r and the V register 22r, respectively.

The header generator 500 refers the number of horizontal pels and the number of lines set at the registers and generates the header 41a. The generated header 41a is selected at the selector 700 and output as the code data 4. After that, encoding process of the image data is performed by the arithmetic encoder 207 and the code 42 output from the arithmetic encoder 207 is selected by the selector 700. Then, the code 42 is output as the code data 4.

The encoding controller 600 outputs a signal 52 by every processing of a pel to the H count controller 300. And a signal 53 is output by every processing of one symbol to the arithmetic encoder 207. Because processing of one symbol is performed, corresponding to one pel, the signal 52 is identical with the signal 53. That is, in this example, the number of information source symbols 1 is equal to the number of predicted conversion symbols 2. The H count controller 300 counts either the number of information source symbols 1 or the number of predicted conversion symbols 2.

The H count controller 300 increments the value in the H counter by every receiving of the signal 52. When the value in the H counter reaches the number of horizontal pels set at the H register, the H count controller 300 issues a carry signal 109.

The V count controller 400 increments the value in the V counter by every receiving of the carry signal 109. When the value in the V counter reaches the number of lines set at the V register, the V count controller 400 issues a carry signal 110. When the carry signal 110 is issued, the encoding controller judges the end of the encoding process. Thus, the encoding process is completed.

The carry signal 109 is input to the line buffer 201. The line buffer 201 judges the end of the processing of one line by every input of the carry signal 109. The line buffer 201 deletes the processed line which is not needed for referring pels and starts to store new lines. Thus, the line buffer 201 is updated.

Herein, the arithmetic encoding will be described in detail.

In case that the i-th symbol in the predicted conversion symbol stream is assumed to be $a_i$ and the mapping region (assigned region) of the LPS at the i-th point is assumed to be Qe, if the region for the MPS is set under the effective region, the mapping region (effective region) $A_i$ of the symbol stream at the i-th point and the lower bound coordinates value $C_i$ are, when the symbol $a_i$ indicates the MPS and initial-values are set as $A_0=1$, $C_O=0$, $A_i=A_{i-1}-Qe$ $C_i=C_{i-1}$ when the symbol $a_i$ indicates the LPS, $A_i=Qe$ $C_i=C_{i-1}+(A_{i-1}-Qe)$ Here, in case that the value in the effective region $A_i$ indicates less than ½, the value is multiplied by exponentiation of 2 to improve the arithmetic calculation accuracy. In this case, an overflow of the coordinates value $C_i$(a portion above the radix point) is output as a bit stream of code data. Hereafter, the process of the exponentiation is called as a renormalization.

renormalized value of $A_i=A_i* 2^■$ (½<=renormalized value of $A_i*1$)

renormalized value of $C_i=C_i*2^■$

In arithmetic codes, it is known that the highly effective encoding process can be performed when the value Qe is set to be the occurrence probability ratio of the LPS (the predicted error probability ratio). The length of the code can be nearly equal to the value of the information source entropy. As a result, an arithmetic encoding process can be performed according to the above-described processing by selecting the value Qe suitable for the predicted error probability ratio or the approximate value corresponding to the state.

FIG. 42 illustrates an example of a table of a state S and a region width Qe. On the table, the value in the above-described formula is multiplied by $2^{16}$. In this case, the region calculation on number line is performed with 16 bit precision. And, each of the value $A_i$ and $C_i$ attains 16 bit precision below the radix point.

FIG. 43 is a block diagram of a decoder. An arithmetic decoder 214 reproduces the predicted conversion symbol 5 (the decoded symbol) based on a region width 108 from the code data 4. A prediction invertor 216 reproduces the information source symbol 1 according to an exclusive OR operation. A decoding controller 610 controls decoding issuing a decoding control signals 70a. A selector 710 selects a header 41a and a code 42. A header decoder 510 extracts the number of horizontal pels and the number of lines from the header 41a. Other elements are the same as in the encoding apparatus shown in FIG. 39.

An arithmetic decoder 214 performs an arithmetic decoding by every one symbol.

In case of decoding arithmetic codes, it is assumed that the relative coordinates value is assumed to be and $C_i$, the region width of the LPS for the i-th predicted conversion symbol $a_i$ is assumed to be Qe and initial-values are set as $A_0=1$, $C_0$=code output from the encoder.

When $C_1<(A_{i-1}-Qe)$, $a_i$ indicates the MPS, $A_i=A_{i-1}-Qe$ $C_i=C_{i-1}$ when $C_{i-1}>=(A_{i-1}-Qe)$, $a_i$ indicates the LPS, $A_i=Qe$ $C_i=C_{i-1}-(A_{i-1}-Qe)$ Here, when the value in the effective region $A_i$ is less than ½, the value is multiplied by exponentiation of 2 as the renormalization process. In this case, code data of m bit is input as the least or less significant of the value $C_i$.

renormalized value of $A_i=A_i* 2^■$ (½<=renormalized value of $A_1<1$)

renormalized value of $C_i=C_i* 2^■$

A prediction invertor 216 reproduces the information source symbol 1 bit by bit. The prediction invertor 216 outputs a predicted value 105 when the predicted conversion symbol is the MPS. The prediction invertor 216 outputs the inversion when the predicted conversion symbol is the LPS.

There is shown a processing flow chart in FIG. 44. As shown in FIG. 44, the number of horizontal pels (H) and the number of lines (V) are set through the prescan at the H register 21r and the V register 22r, respectively. The probability estimator 11a produces the header that includes number of horizontal pels (H) set at the H register 21r and number of lines (V) set at the V register 22r and transmits the header to the receiver site. And, the probability estimator 11a clears the value in the H counter 21a and in the V counter 22a. Then, when the encoding process of the input data 1 is performed, the value of the H counter 21a is incremented by one, and when the value in the H counter 21a reaches the number of horizontal pels (H) transmitted through the header, the value in the V counter 22a is incremented by one and the value in the H counter 21a is cleared. Then, when the value in the V counter 22a reaches the number of lines (V) transmitted through the header, the input data 1 comes to an end. Thus, encoding process is completed.

There is shown a processing flow chart of the decoding process in FIG. 45. A probability estimator 14a, as shown in FIG. 45, detects the number of horizontal pels and the number of lines (V) from the header at the beginning of decoding process and stores each of them at the H register 23r and the V register 24r, respectively. The probability estimator 14a clears the value in the H counter 23a and in the V counter 24a. When the decoding process of the output data 7 is performed, the value in the H counter 23a is incremented.

When the value in the H counter 23a reaches the number of horizontal pels (H) transmitted through the header, the value in the V counter 24a is incremented and the value in the H counter 23a is cleared. Then, the decoding process comes to an end when the value in the V counter 24a reaches the number of lines (V) received through the header.

Problems to be Solved by the Invention

So that the end of information source symbols is judged at the receiver site for decoding information source symbol, the decoding termination method which notifies the total number of information source symbols as a parameter information Is adapted. For example, when the image is treated as information source symbols, as shown in the conventional example, the total number of information source symbols is previously transmitted by indicating the horizontal size (the number of horizontal pels) and the vertical size (the number of lines) in the header. At the transmitter site, the only method to detect the total number of lines is by storing one page of the image in the memory at once. In an apparatus which does not have an enough memory to store one page of the image, the detection of the number of lines can't be performed by using the conventional header notification.

SUMMARY OF THE INVENTION

It is an object of this invention to provide a system and method that can judge the end of information source symbols correctly without transmitting the total number of lines per page so as to solve the forgoing problems.

According to one aspect of this invention, In the coding system, the number of lines is placed at an tail of transmitted code and transmitted. The end of information source symbols is judged by the placed number of lines.

According to one aspect of this invention, in the coding system, the end of information source symbols is judged by inserting one or plural EOS symbols (EOS: End Of Sequence) that indicates if it is the last stripe or not whenever one stripe of information source symbols is encoded. The stripe is calculated as the product of the horizontal pels by the number of lines for one stripe transmitted through the header. The end of information source symbols is judged by checking the EOS symbol. If a stripe line number is one, the EOS symbol is inserted whenever one line of information source symbols is encoded.

According to one aspect of this invention, in the coding system, terminate symbol sequence is added, which can be detected only at an end of code, by inserting one or plural marker symbols. The end of information source symbol is judged by the terminate symbol sequence. In this case, the detection of the end of information source symbols can be performed without transmitting the number of horizontal pels and the number of lines.

According to one aspect of this invention, a coding system may include an encoder for encoding information source symbols, and a decoder for decoding information source symbols, wherein a total number of the information source symbols for encoding and decoding is not known before coding begins, wherein the encoder may include:

encoder information source unit memory means for storing a given number of information source symbols as an information source unit;

encoder information source unit count means for counting a number of information source units of the encoding information source symbols referring to the information source unit stored by the information source unit memory means; and notify means for transmitting the number of information source units counted by the information source unit count means to the decoder, and wherein the decoder may include:

decoder Information source unit memory means for storing the information source unit;

decoder information source unit count means for counting the number of information source units stored in the decoder information source unit memory means; and decode terminate means receiving the number of information source units from the notify means, for comparing the number of information source units counted by the decoder information source unit count means and the number of information source units notified by the notify means, and for terminating the decoding according to a result of the comparison.

According to another aspect of this invention, a coding system may include an encoder and a decoder, wherein the encoder may include:

encoder probability estimator means including means for inputting a plurality of information source symbols to be encoded, means for selecting a finite number of encoded information source symbols as reference symbols, means for predicting an encoded information source symbol based on the reference symbols, means for estimating an occurrence probability of the predicted symbol, means for representing the estimated occurrence probability by one of a finite number of representing values, means for performing a conversion from the information source symbol to a predicted conversion symbol according to the information source symbol and the predicted information source symbol, and means for outputting the predicted conversion symbol and the representing value;

entropy encoding means including means for receiving the predicted conversion symbol and the representing value from the probability estimator means, means for performing an entropy encoding of the predicted conversion symbol according to the representing value and outputting an encoded symbol, and means for placing a terminate code, which is distinguishable from the encoded symbol stream, at the end of the encoded symbol stream at the end of encoding; and notify means including means for defining a size of an information source unit, means for counting a total number of information source units during encoding, means for placing the total number of information source units in the terminate code at the end of the entropy encoding; and, wherein the decoder may include:

decoder probability estimator means including means for selecting a finite number of decoded symbols, corresponding to the reference symbols, means for predicting a decoding information source symbol based on the reference symbols, means for estimating an occurrence probability of a predicted symbol, means for representing the estimated occurrence probability by one of a finite number of representing values, means for outputting the representing value of the occurrence probability for the predicted information source symbol to an entropy decoding means, means for estimating the conversion from the information source symbol to the predicted conversion symbol performed in the encoder based on the predicted symbol and a predicted conversion symbol received from an entropy decoding means;

means for performing an inversion from the predicted conversion symbol to the information source symbol, which is opposite of the estimated conversion, means for outputting information source symbols inverted as the original information source symbol;

the entropy decoding means including means for receiving the encoded symbol from the encoder and the representing value of the predicted occurrence probability for the decoding symbol from the probability estimator means, means for performing an entropy decoding of the encoded symbol received from the encoder based on the representing value of the predicted occurrence probability for the decoding symbol received from the probability estimator means, means for generating a predicted conversion symbol and outputting the predicted conversion symbol to the probability estimator means; and decode terminate means including means for determining a total number of decoded information source units, means for receiving the total number of information source units in the terminate code, and means for terminating the decoding when the determined number of information source units is equal to the total number of information source units received in the terminate code.

According to another aspect of this invention, a coding system may include an encoder for encoding information source symbols, and a decoder for decoding information source symbols, wherein a total number of the information source symbols for encoding and decoding may not be known prior to commencement of encoding, wherein the encoder may include:

encoder information source unit memory means for storing an information source unit which is a number of information source symbols;

End Of Sequence symbol insert means for inserting an End Of Sequence symbol after each information source unit to indicate whether the information source unit is the last one;

encoding means for encoding the information source symbols including the End Of Sequence symbols inserted by the End Of Sequence symbol insert means; and wherein the decoder may include:

decoder information source unit memory means for storing an information source unit which corresponds to the information source unit of the encoder;

decode terminate means for recognizing the End Of Sequence symbols inserted between the information source units and for deciding the termination of the information source symbols decoding based on the End Of Sequence symbols.

According to another aspect of this invention, a coding system may include an encoder and a decoder, wherein the encoder may include:

probability estimator means including means for inputting a plurality of information source symbols to be encoded, means for selecting a finite number of information source symbols as reference symbols, means for predicting an incoming information source symbol based on the reference symbols, means for estimating an occurrence probability of the predicted symbol, means for representing the estimated occurrence probability by one of a finite number of representing values, means for performing a conversion from the information source symbol to predicted conversion symbol according to the information source symbol and the predicted symbol, means for outputting the predicted conversion symbol and the representing value of the estimated occurrence probability for the predicted information source symbol to entropy encoding means;

entropy encoding means including means for receiving the predicted conversion symbol and the representing value.

means for performing an entropy encoding of the predicted conversion symbol according to the representing value and outputting an encoded symbol, and End Of Sequence symbol insert means including means for defining an information source unit having a plurality of information source symbols, means for inserting an End Of Sequence symbol after each information source unit of the information source symbols during the entropy encoding, means for assigning a predefined representing value of a predicted occurrence probability to the End Of Sequence symbol and encoding the End Of Sequence symbols; and wherein the decoder may include:

probability estimator means including means for selecting a finite number of decoded symbols corresponding to the reference symbols of the decoder, means for predicting a decoding information source symbol based on the reference symbols, means for estimating an occurrence probability of a predicted symbol.

means for representing the estimated occurrence probability by one of the representing values.

means for outputting the representing value of the occurrence probability for the predicted information source symbol to an entropy decoding means, means for estimating the conversion from the information source symbol to the predicted conversion symbol performed in the encoder based on the predicted symbol and a predicted conversion symbol which are received from entropy decoding means, means for performing an inversion from the predicted conversion symbol to the information source symbol, which is opposite of the estimated conversion, means for outputting information source symbols inverted as the original information source symbol;

the entropy decoding means including means for receiving the encoded symbol from the encoder and the representing value of the predicted occurrence probability for the decoding symbol from the probability estimator means, means for performing an entropy decoding of the encoded symbol received from the encoder based on the representing value of the predicted occurrence probability for the decoding symbol received from the probability estimator means, means for generating a predicted conversion symbol and outputting the predicted conversion symbol to the probability estimator means, and decode terminate means including means for counting a number of information source symbols decoded, means for recognizing that the next decoding symbol is the End Of Sequence symbol if the number of the decoded symbols is same as the predefined information source unit, means for decoding the End Of Sequence symbol based on a representative value of the predicted occurrence probability for the End Of Sequence symbol, means for ending the decoding if a value of the decoded End Of Sequence symbol indicates the termination of the information source symbols, and means for deleting the End Of Sequence symbol inserted as the predicted conversion symbol by the encoder, if the value of the decoder End Of Sequence symbols does not indicate the termination of the information source symbols.

According to another aspect of this invention, a coding system may include an encoder for encoding information source symbols, and a decoder for decoding information source symbols, wherein a total number of the information source symbols for encoding and decoding is not known prior to commencement of encoding, wherein the encoder may include:

detect means for detecting an occurrence of predefined encoding pattern during a information source symbol encoding;

dummy symbol adding means for adding a dummy symbol to the predefined encoding pattern detected by the detect means in the encoder;

terminate symbol sequence adding means for adding a terminate symbol sequence which has the predefined encoding pattern and terminate symbol indicating a termination of information source symbols at the end of the information source symbol encoding; and wherein the decoder may include:

detect means for detecting an occurrence of predefined encoding pattern during a information source symbol decoding;

decode terminate means for determining whether a symbol after the predefined encoding pattern detected by the detect means is the dummy symbol or the terminate symbol, and for terminating the information source symbol decoding based on the determination result.

According to another aspect of this invention, a coding system may include an encoder and a decoder, wherein the encoder may include:

probability estimator means including means for inputting each of information source symbols to be encoded, means for selecting a finite number of information source symbols as reference symbols from the source symbols already encoded, means for predicting a Information source symbol to be encoded based on the reference symbols, means for estimating an occurrence probability of the predicted symbol, means for representing the estimated occurrence probability by one of a finite number of representing values, means for performing a conversion from the information source symbol to predicted conversion symbol according to the actual information source symbol to be encoded and the predicted information source symbol, means for outputting the predicted conversion symbol and the representing value of the estimated occurrence probability for the predicted information source symbol to entropy encoding means;

entropy encoding means including means for receiving the predicted conversion symbol and the representing value, means for performing an entropy encoding of the predicted conversion symbol according to the representing value and outputting an encoded symbol, and for placing terminate code, which is distinguishable from the encoded symbol stream, at the end of the encoded symbol stream at the end of encoding; and termination indicate means including means for receiving the information source symbol, means for classifying the received the information source symbol using the probability estimation means to a More Probable Symbol whose predicted occurrence probability is equal or more than 0.5 or a Less Probable Symbol whose predicted occurrence probability is less than 0.5, means for finding an N number of continuous Less Probable Symbols as a predefined coding pattern from the predicted conversion symbol stream, means for inserting one More Probable Symbol, when the predefined coding pattern is found, into the information source symbol stream so as to indicate the continuation of the information source symbol stream, means for outputting the predefined coding pattern of a one More Probable Symbol and N number of Less Probable Symbols and a terminate symbol of one Less Probable Symbol as a terminate symbol sequence which indicates a termination of information source symbol stream, and wherein the decoder may include:

probability estimator means including means for selecting a finite number of symbols, which are same as the one selected in the encoder as reference symbols from the information source symbols already decoded for a decoding information source symbol, means for predicting a decoding information source symbol based on the reference symbols, means for estimating an occurrence probability of a predicted symbol, means for representing the estimated occurrence probability by one of the representing values, means for outputting the representing value of the estimated occurrence probability for the predicted information source symbol to an entropy decoding means, means for estimating the conversion from the information source symbol to the predicted conversion symbol performed in the encoder based on the predicted symbol and a predicted conversion symbol which are received from an entropy decoding means, means for performing an inversion from the predicted conversion symbol to the information source symbol, which is opposite of the estimated conversion.

means for outputting information source symbols inverted as the original information source symbol;

the entropy decoding means including means for receiving the encoded symbol from the encoder and the representing value of the predicted occurrence probability for the decoding symbol from the probability estimator means, means for performing an entropy decoding of the encoded symbol received from the encoder based on the representing value of the predicted occurrence probability for the decoding symbol received from the probability estimator means, means for generating a predicted conversion symbol and outputting the predicted conversion symbol to the probability estimator means;

decode terminate means including
> means for counting a number of continuous Less Probable Symbols and finding the N number of continuous Less Probable Symbols as the predefined coding pattern from the predicted conversion symbols,
> means for decoding the N+1 th symbol if the predefined coding pattern is found,
> means for deciding the symbol sequence after the previous More Probable Symbol as the terminate symbol sequence, deleting the terminate symbol sequence, and terminating the decoding, If the decoded symbol is a Less Probable Symbols.
> means for deleting a More Probable Symbol and continuing the decoding if the decoded symbol is a More Probable Symbols.

In the coding system, the entropy encoding means and entropy decoding means may perform encoding and decoding based on a binary arithmetic coding method respectively.

In the coding system, information source symbol may represent image data, and the information source unit may be a number of pels in a line which is one of format information of image data.

In the coding system, the encoder may transmit the size of the information source unit to the decoder prior to transmitting encoded data.

In the coding system, the information source symbols may represent image data, and the information source unit may be based on a stripe having at least single line, in which the information source unit may be a number of pels per line and a number of lines per stripe.

In the coding system, the encoder may transmit the size of the information source unit and the End Of Sequence symbol to the decoder prior to transmitting encoded data.

In the coding system, the encoder may transmit the predefined coding pattern and the terminate symbol to the decoder prior to transmitting encoded data.

In the coding system, the End Of Sequence symbol insert means may utilize a representing value of the predicted occurrence probability used for encoding of the previous predicted conversion symbol as the representing value of the predicted occurrence probability to be assigned to the End Of Sequence symbol inserted into the predicted conversion symbol stream, and the decode terminate means may utilize a representing value of the predicted occurrence probability used for decoding of the previous predicted conversion symbol as the representing value of the predicted occurrence probability for the next decoding symbol which may be identified as the End Of Sequence symbol.

In the coding system, the termination indicate means may assign a representing value of the predicted occurrence probability used for encoding of the previous More Probable Symbol as the representing value of the predicted occurrence probability for the More Probable Symbol to be inserted as the N+1 th symbol if the Less Probable Symbol continuously appears more than number N, and assigns a representing value of the predicted occurrence probability used for the previous Less Probable Symbol as the representing value of the predicted occurrence probability for the Less Probable Symbol if the Less Probable Symbol is inserted, and the decode terminate means in the decoder may use a representing value of the predicted occurrence probability used for decoding of the previous symbol as the representing value of the predicted occurrence probability for each of the More Probable Symbol and the Less Probable Symbol For decoding of the N+1 th symbol if the number of the continuous Less Probable Symbols becomes the number N.

In the coding system, the termination indicate means in the encoder may insert predefined K number of symbols from the N+1 th symbol if the Less Probable Symbol continuously appears more than predefined number N, and may define one or more than one symbol stream out of $2^K$ number of symbol streams represented by the K number of More Probable Symbols and Less Probable Symbols as a symbol stream to indicate the termination of the information source symbols, and the decode terminate means in the decoder may decode K number of symbols from N+1 th symbol as the symbol stream inserted for indicating the termination of the information source symbols if the number of continuous Less Probable Symbols becomes the predefined number N, and may detect one or more than one symbol stream, defined by the encoder, out of $2^K$ number of symbol streams represented by the K number of More Probable Symbols and Less Probable Symbols as a symbol stream to indicate the termination of the Information source symbols.

In the coding system, the End Of Sequence symbol insert means in the encoder may utilize a predefined value as the representing value of the predicted occurrence probability to be assigned to the End Of Sequence symbol inserted into the predicted conversion symbol stream, and the decode terminate means in the decoder may utilize the predefined value as the representing value of the predicted occurrence probability for the next decoding symbol which is identified as the End Of Sequence symbol.

In the coding system, the End Of Sequence symbol insert means in the encoder may utilize a dynamically predicted value based on an occurrence tendency of the information source symbols as the representing value of the predicted occurrence probability to be assigned to the End Of Sequence symbol inserted into the predicted conversion symbol stream, and the decode terminate means in the decoder may utilize a dynamically predicted value based on an occurrence tendency of the information source symbols as the representing value of the predicted occurrence probability for the next decoding symbol which is identified as the End Of Sequence symbol.

In the coding system, the termination indicate means in the encoder may assign a predefined value as the representing value of the predicted occurrence probability for the More Probable Symbol to be inserted as the N+1 th symbol if the Less Probable Symbol continuously appears more than number N, and may assign a predefined value as the representing value of the predicted occurrence probability for the Less Probable Symbol if the Less Probable Symbol is inserted, and the decode terminate means in the decoder may use the predefined value as the representing value of the predicted occurrence probability for each of the More Probable Symbol and the Less Probable Symbol for decoding of N+1 th symbol if the number of the continuous Less Probable Symbols becomes the number N.

In the coding system, the termination indicate means in the encoder may assign a dynamically predicted value based on an occurrence tendency of the information source symbols as the representing value of the predicted occurrence probability for the More Probable Symbol to be inserted as the N+1 th symbol if the Less Probable Symbol continuously appears more than number N, and may assign a dynamically predicted value based on an occurrence tendency of the information source symbols as the representing value of the predicted occurrence probability for the Less Probable Symbol if the Less Probable Symbol is inserted, and the entropy decoding means in the decoder may use a dynamically predicted value based on an occurrence tendency of the information source symbols as the representing value of the predicted occurrence probability for each the More Probable Symbol and the Less Probable Symbol for decoding of the N+1 th symbol if the number of the continuous Less Probable Symbols becomes the number N.

In the coding system, the termination indicate means in the encoder and the decode terminate means in the decoder may define the number N as a predefined fixed value.

In the coding system, the termination indicate means in the encoder and the decode terminate means in the decoder may change the value of the number N.

According to another aspect of this invention, a method for coding and decoding, may include the steps of:

storing a common number of information source symbols as an information source unit in both of an encoder and a decoder;

counting a number of information source symbols for encoding and counting a number of information source units of the information source symbols;

transmitting the number of counted information source units the decoder at the end of the encoding;

counting a number of information source symbols decoded and counting a number of information source units of the information source symbols decoded; and terminating decoding based on a comparison of the counted number of decoded information source units and the transmitted number of information source units.

According to another aspect of this invention, an encoding and decoding method of a system having an encoder and a decoder, may include the steps of:

storing a common number of information source symbols as an information source unit in both of the encoder and the decoder;

counting a number of information source symbols to detect a boundary of the information source units, and inserting a specific symbol which indicates whether or not the information source unit is last between the information source symbols, and counting a number of decoded Information source symbols to detect a boundary of the information source units and terminating decoding when the symbol after an information source unit indicates the last information source unit, According to another aspect of this invention, an encoding and decoding method of a system having an encoder and a decoder may include the steps of:

storing a common specific symbol sequence and a common termination symbol in both of the encoder and the decoder;

detecting the specific symbol sequence occurred in the information source symbol sequence during the encoding process and placing a dummy symbol, which is different from the termination symbol after the information source symbol sequence;

placing the specific symbol sequence and the termination symbol at the end of the encoding;

detecting the specific symbol sequence in the information source symbol sequence during the decoding process and terminating decoding when the next decoding symbol is the termination symbol.

BRIEF DESCRIPTION OF THE DRAWINGS

FIG. 14 shows a configuration of an encoding and decoding symbol stream of the second embodiment.

FIG. 21 shows a configuration of an encoding and decoding symbol stream of the third embodiment.

FIG. 33(a) shows an example of changing a state.

FIG. 33(b) shows an example of changing the value of the LPS pattern length (N).

FIG. 33(c) shows an example of changing the value of the LPS pattern length (N).

FIG. 33(d) shows an example of changing the value of the LPS pattern length (N).

FIG. 33(e) shows an example of changing the value of the LPS pattern length (N).

FIG. 34(a) shows an example of changing the value of the LPS pattern length (N).

FIG. 34(b) shows another example of changing the value of the LPS pattern length (N).

FIG. 35(a) shows an internal block diagram of an encoder.

FIG. 35(b) shows an internal block diagram of a decoder.

FIG. 36 shows a block diagram of a configuration of an apparatus according to the related art.

FIG. 37 shows an example of input data.

FIG. 41 shows an example of a predicted table.

FIG. 42 shows a figure of a region width corresponding to a state.

DESCRIPTION OF THE PREFERRED EMBODIMENTS

Embodiment 1

In Embodiment 1, the end of information source symbols are judged by placing the number of lines (V) to the tail of the code as the footer and transferring it (This system will be called a line count system).

Through the header, the number of horizontal pels (H) which constitutes a line and information about the method for selecting the reference symbols, the method for predicting the predicted value for pels, and the method for estimating the occurrence probability ratio of the predicted pels are transmitted. Decoding comes to an end without missing the end of information source symbols by detecting the number of lines (V) placed to the tail of the code.

In the description below, it is assumed that the method for selecting reference symbols, the method for predicting the predicted value for pels, and the method for estimating the occurrence probability ratio of the predicted pels are common both at the encoding site and the decoding site. It is assumed that only the number of horizontal pels (H) are transmitted through the header.

Figure 1:
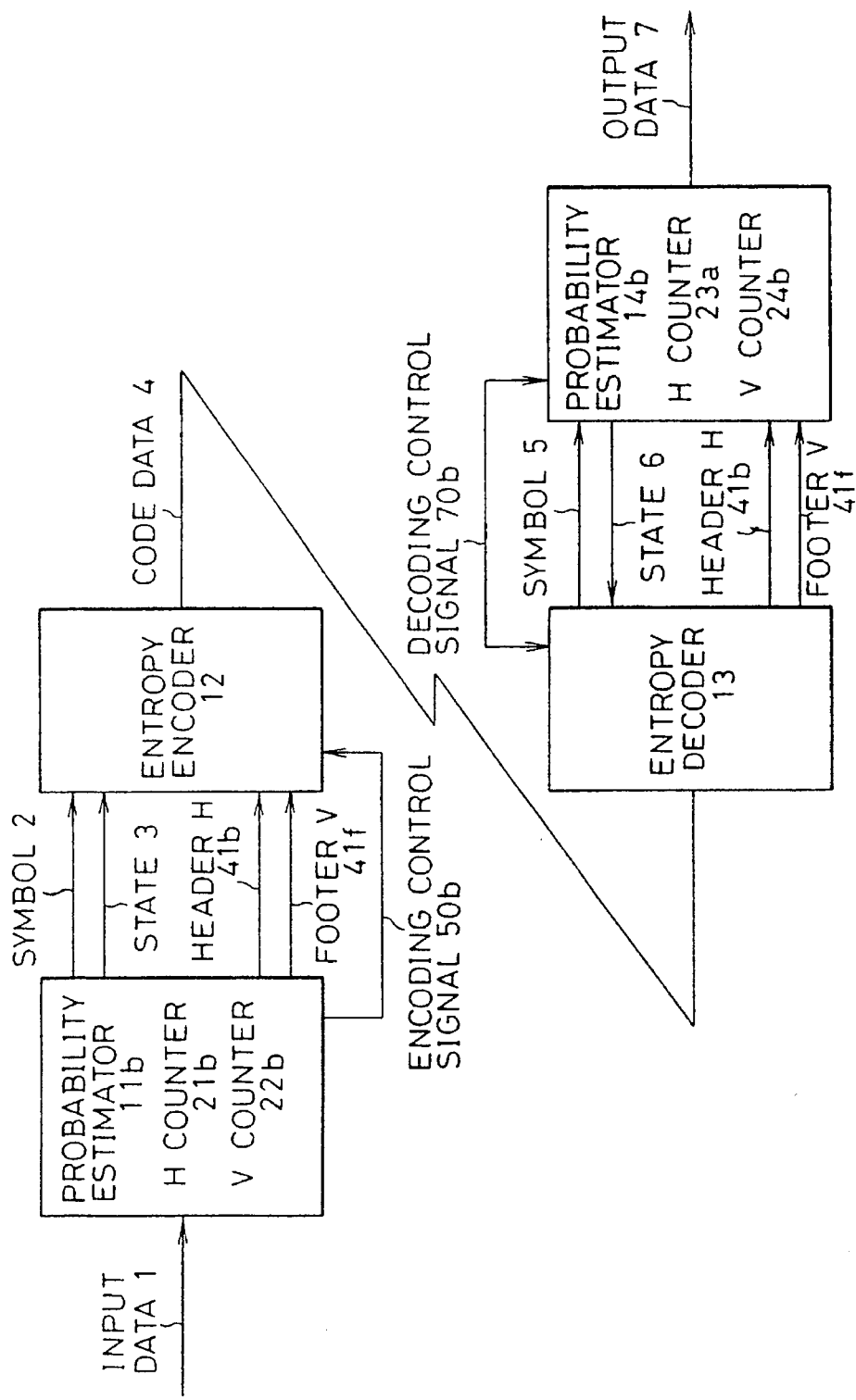
FIG. 1 shows a block diagram of a configuration of an apparatus of a first embodiment of the present invention.

A block diagram of a configuration of an apparatus according to the line count system is shown in FIG. 1.

In the figure, a probability estimator 11b outputs a symbol 2 which is an object of encoding after the predicted conversion. The probability estimator 11b outputs a state 3 which is a representative value of the estimated occurrence probability ratio of the symbol 2. The probability estimator 11b has an H counter 21b (described later) and a V counter 22b (described later) inside. An entropy decoder 13 outputs a symbol 5. A probability estimator 14b outputs a state 6 which is a representative value of the estimated occurrence probability ratio for a symbol 5. The probability estimator 14b outputs an output data 7 after the predicted conversion of the symbol 5 input from an entropy decoder 13. The probability estimator 14b has an H counter 23b (described later) and a V counter 24b inside. The H counter 21b counts the number of pels by every processing of input data up to the number of horizontal pels (H) transmitted through the header. The V counter 22b counts the number of pels by every processing of input data up to the number of horizontal pels (H). The H counter 23b counts the number of pels by every processing of output data up to the number of horizontal pels (H). The V counter 24b counts the number of lines by every processing of lines up to the number of lines (V).

Other elements in FIG. 1 have the same reference numbers as in the conventional systems shown in FIG. 36, and the operations are the same as In the conventional systems.

Figure 2:
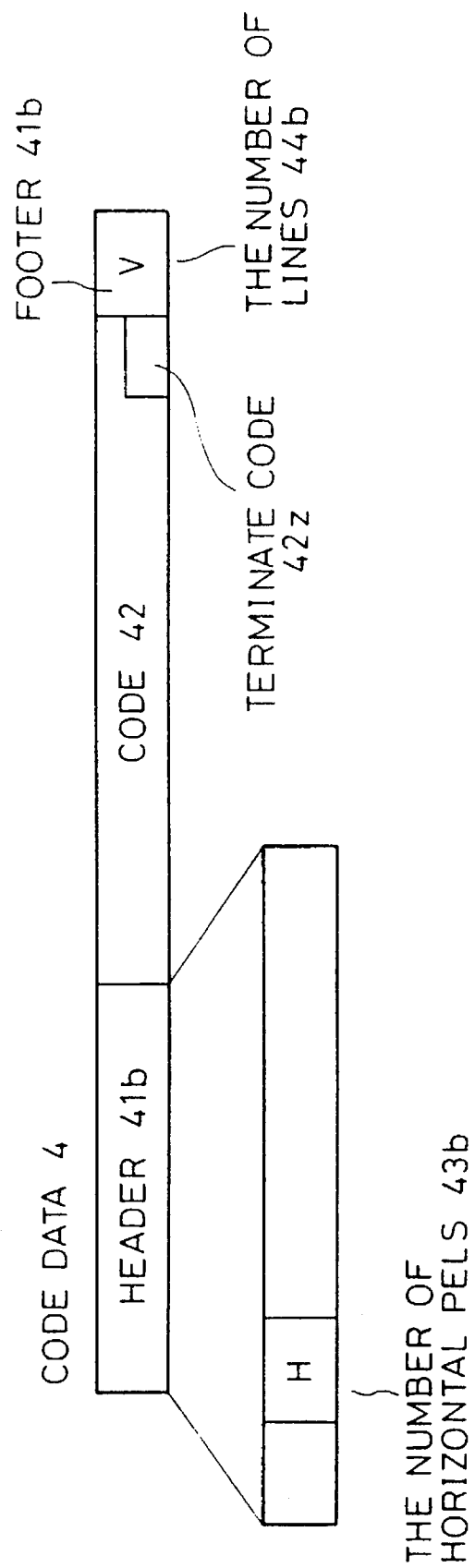
FIG. 2 shows a code data format of the first embodiment.

There is shown a code data format in the line count system in FIG. 2.

In FIG. 2, a code data 4 contains a header 41b and a code 42 (described later), the number of horizontal pels (H) 43b is transmitted through the header 41b, the number of lines (V) 44b is placed to the tail of the code data 4. The header 41b of the code data 4 is transmitted before an entropy encoder 12 transmits the code 42 to an entropy decoder 13. The number of horizontal pels (H) 43b is transmitted before beginning of the decoding process in the entropy decoder 13. A location of the number of horizontal pels (H) 43b need not be as described in the figure as long as a predetermined format is used in the header 41. The receiver site has to monitor the code data 4 input to the entropy decoder 13 to find out the end of the code 42 to detect the number of lines 44b, which is placed at the tail of the code data.

The operation of the configuration of FIG. 1 will be explained.

The probability estimator 11b performs the predicted conversion from the predicted value for the input data 1. The probability estimator 11b outputs the symbol 2 and the state 3 to the entropy encoder 12. The symbol 2 is an object of coding which shows conformity or nonconformity as a result of comparison between a predicted value and an actual value of the information source symbol 1. The state 3 is predicted for the symbol 2. The entropy encoder 12 inputs the symbol 2 and the state 3 from the probability estimator 11b as a parameter of encoding. The entropy encoder 12 outputs the code data 4 to the entropy decoder 13 after the encoding process. The entropy decoder 13 inputs the code data 4 from the entropy encoder 12. The entropy decoder 13 inputs the state 6 as a parameter of decoding. The state 6 is output from the probability estimator 14b for the symbol 5 which is an object of decoding. The entropy decoder 13 outputs the symbol 5 to the probability estimator 14b. The probability estimator 14b outputs the state 6 predicted for the symbol 5 to the entropy decoder 13. The probability estimator 14b performs the predicted inversion based on the symbol 5 input from the entropy decoder 13 as a result of decoding and the predicted value that was predicted for the symbol 5.

If the symbol 5 indicates conformity with the predicted value, the predicted value is output as the output data 7, and if the symbol 5 indicates nonconformity with the predicted value, the non-predicted value (which is an inverted value of the predicted value) is output as the output data 7.

Figure 3:
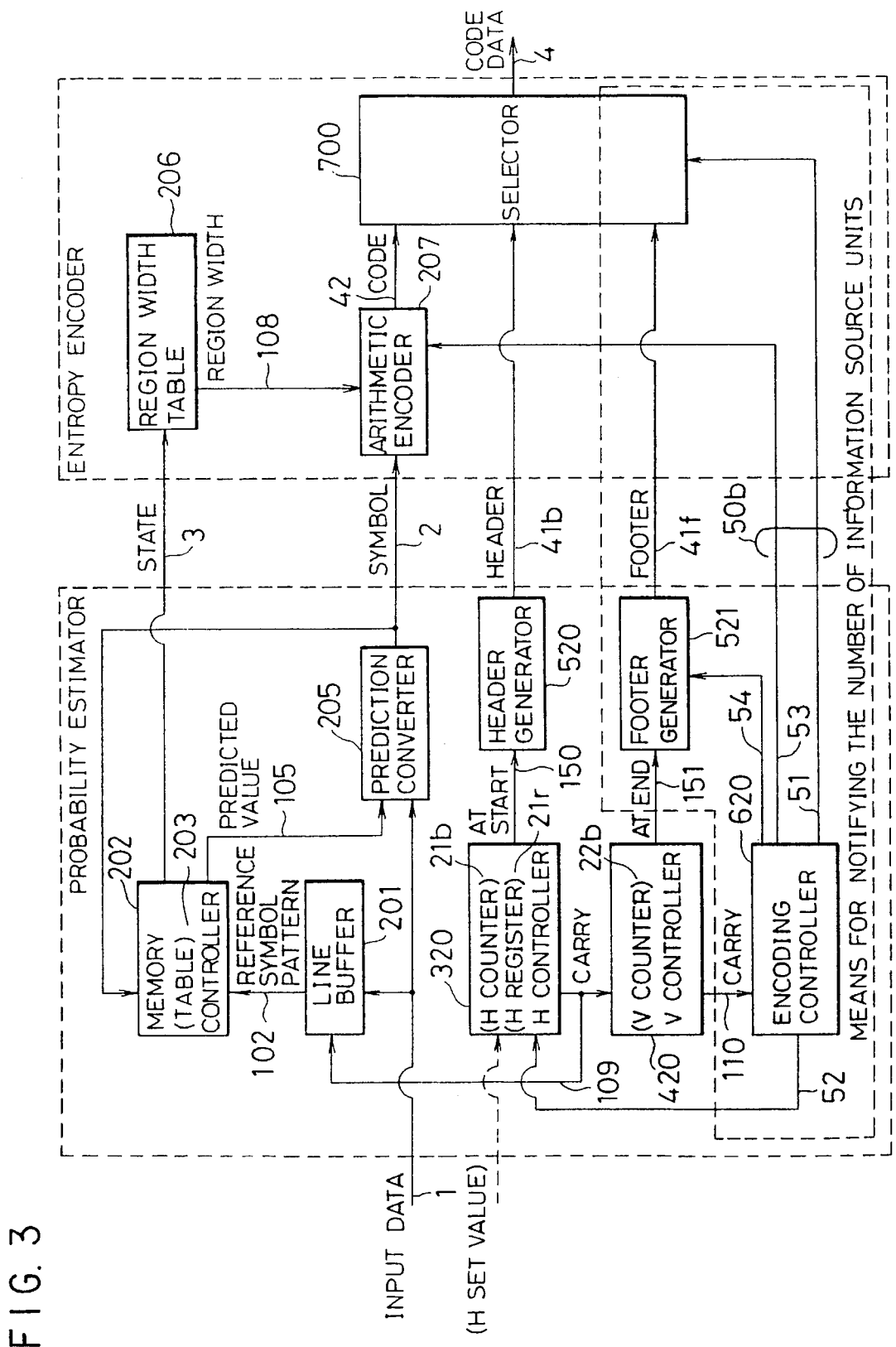
FIG. 3 shows an internal block diagram of an encoder of the first embodiment.

There is shown a block diagram of an encoder according to Embodiment 1 in FIG. 3. In FIG. 3, a header generator 520 generates a header with the number of horizontal pels (H) to be encoded is registered at an H register 21r at the beginning of encoding. A footer generator 521 generates a footer including the number of lines (V), which is counted by a V counter 22b, and places it to the tail of code data 4 at the end of encoding. A selector 700 produces the code data 4 by selecting a header 41b, a footer 41f and the code 42. The header 41b and the footer 41f are output as the code data 4 without being encoded. The encoding controller 620 outputs a signal 52 at every processing of a pel to the H count controller 320. A signal 53 is output at every processing of one symbol to the arithmetic encoder 207. Because processing of one symbol corresponds to one pel, the signal 52 is identical with the signal 53. That is, in this example the number of input data 1 is equal to the number of the symbols 2. The H count controller 320 counts either the number of pels of input data 1 or the number of the symbols 2.

Figure 4:
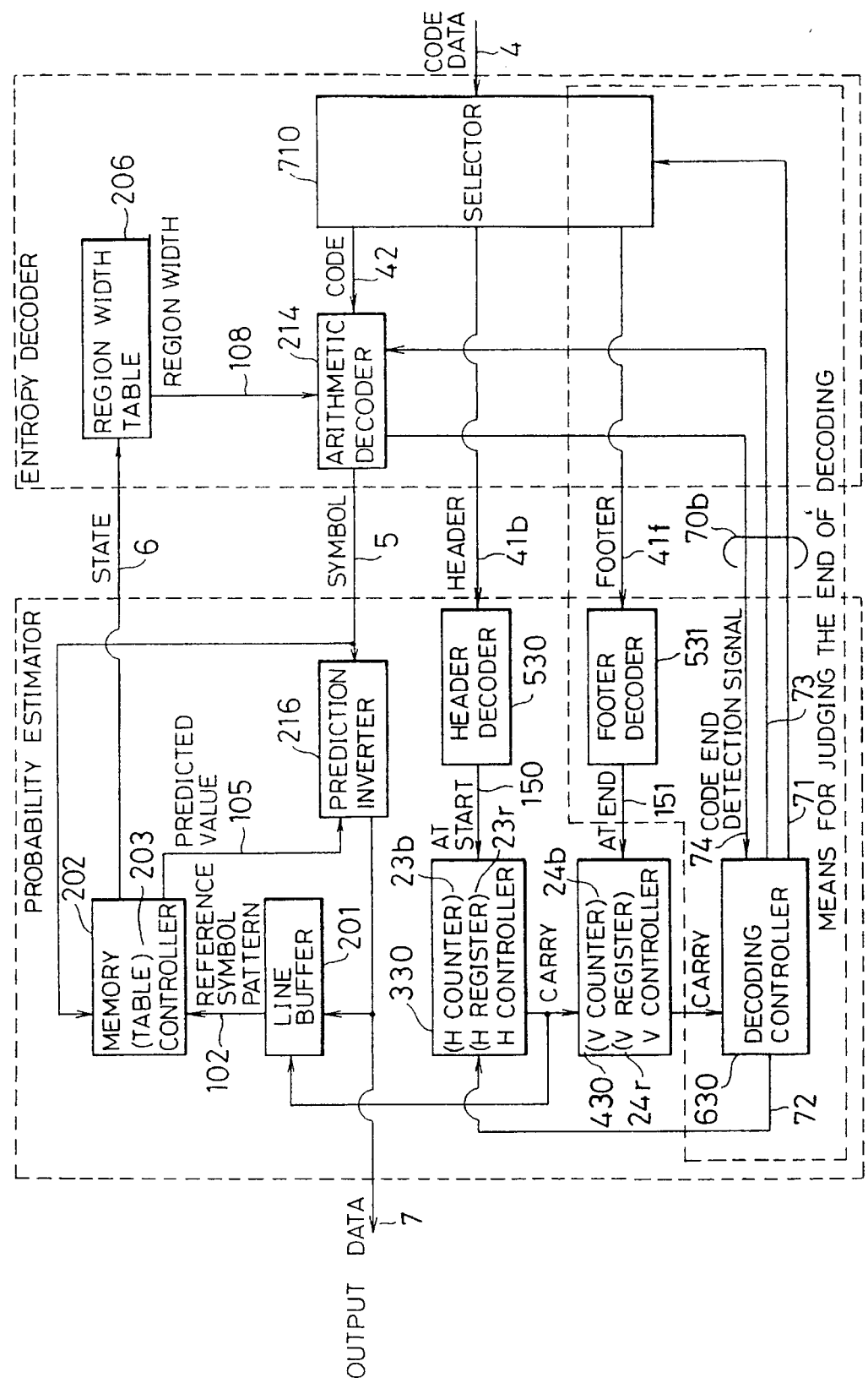
FIG. 4 shows an internal block diagram of a decoder of the first embodiment.

There is shown a block diagram of a decoder in FIG. 4. In FIG. 4, a selector 710 selects the header 41b, the footer 41f, and the code 42 from the code data 4. A header decoder 530 extracts the number of horizontal pels (H) to be decoded from the header 41b. The horizontal pels (H) is registered at an H register 23r at the beginning of decoding. A footer decoder 531 extracts the number of lines (V) to be decoded from the footer 41f. The number of lines (V) is registered at a V register 24r in the V count controller 430. A detection signal 74 for terminate code is output when an terminate code 42z placed at the tail of the code 42 is detected.

Figure 5:
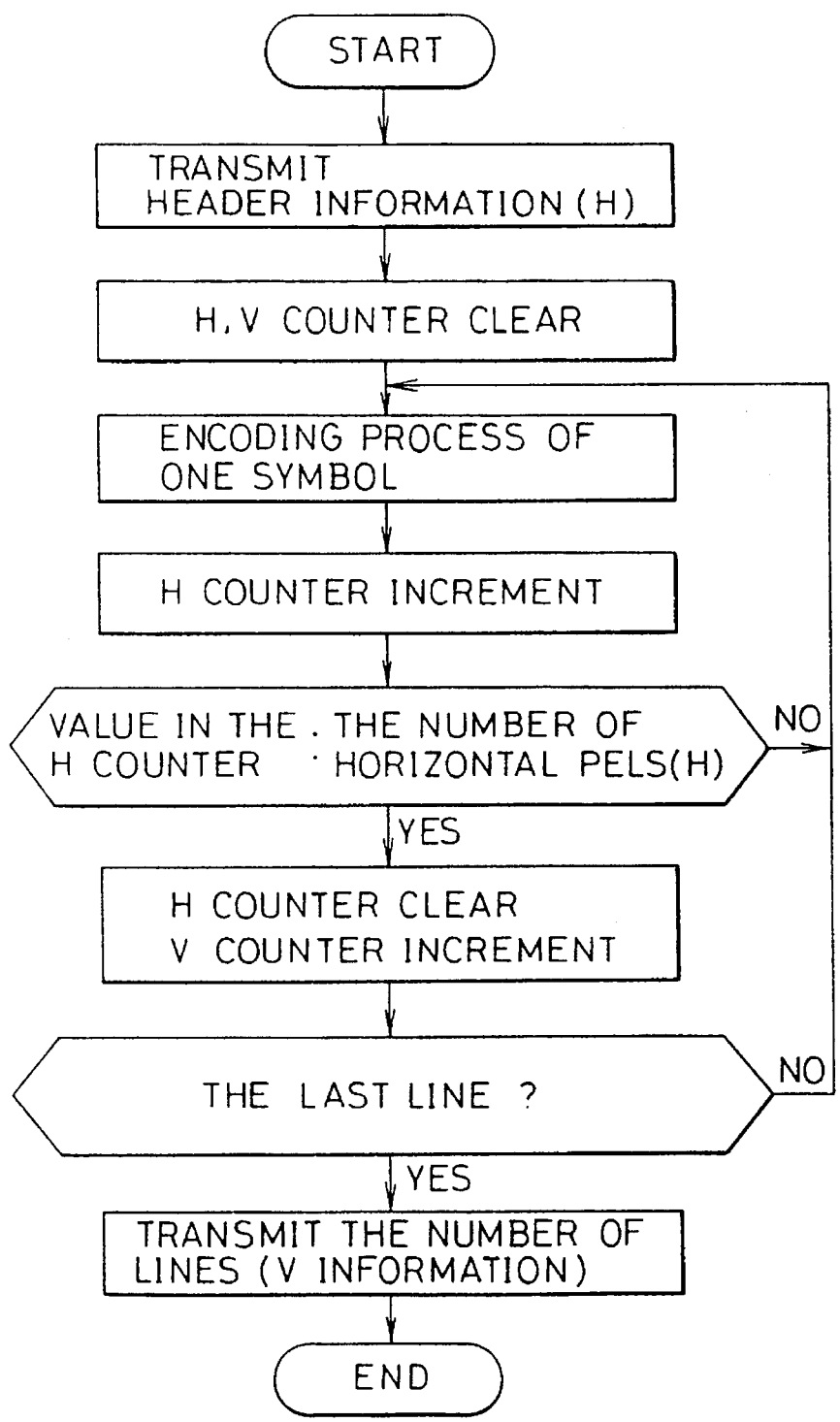
FIG. 5 shows a flow chart at the encoding site of the first embodiment.
Figure 6:
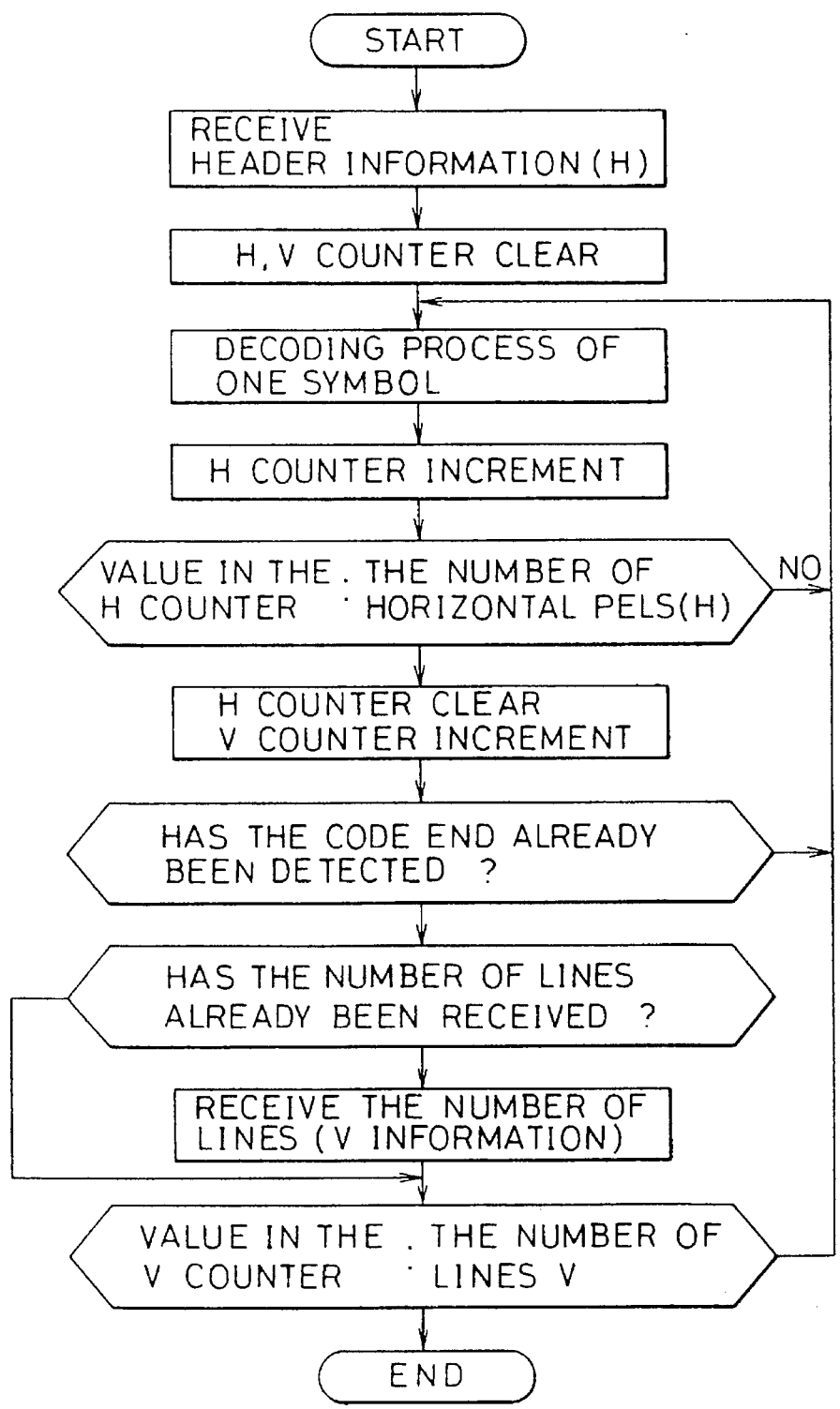
FIG. 6 shows a flow chart at the decoding site of the first embodiment.

There is shown a flow chart of the encoding process of Embodiment 1 in FIG. 5, and a flow chart of the decoding process In FIG. 6.

The encoding process in this embodiment will be explained. It is assumed that the number of horizontal pels (H) is registered previously from the outside. As shown in FIG. 5, the probability estimator 11b transmits the header which includes the number of horizontal pels (H) at the beginning of the coding process to the receiver site. The probability estimator 11b clears the value in the H counter 21b and in the V counter 22b. Then, when coding process of the input data 1 is performed, the value in the H counter 21b is incremented, and when the numerical value in the it counter 21b reaches the number of horizontal pels (H) transmitted through the header, the value in the V counter 22b is incremented and the value in the H counter 21b is cleared. Above-mentioned procedure is repeated for plural lines until the input data 1 comes to an end. When the input data 1 comes to an end, the encoding process finishes and the number of lines (V) shown as the value in the V counter 22b is placed to the tail of the code data 4 and transmitted.

As shown in FIG. 6, at the beginning of the decoding process, the probability estimator 14b detects the number of horizontal pels (H) from the header and stores at an H register 24r. Then, the probability estimator 14b clears the value in the H counter 23b and the V counter 24b. Then, when the decoding process of the output data 7 is performed, the value in the H counter 23b is incremented, and when the value in the H counter 23b reaches the number of horizontal pels (H) received through the header, the value in the V counter 24b is incremented while the value in the H counter 23b is cleared. When the value in the V counter 24b is incremented, it is checked whether the terminate code 42z is detected and the number of lines (V) is received at the end of the code data 4. Then, when the value in the V counter 24b reaches the number of lines (V) received at the end of the code data 4, the decoding process is completed.

In Embodiment 1, the method for selecting reference symbols, the method for predicting pels as an object of coding and the method for estimating the predicted occurrence probability ratio are commonly set at both the coding site and the decoding site. Therefore, they need not be transmitted through the header. If the number of horizontal pels (H) is a fixed value, the number of horizontal pels (H) does not need to be transmitted, either.

Figure 7:
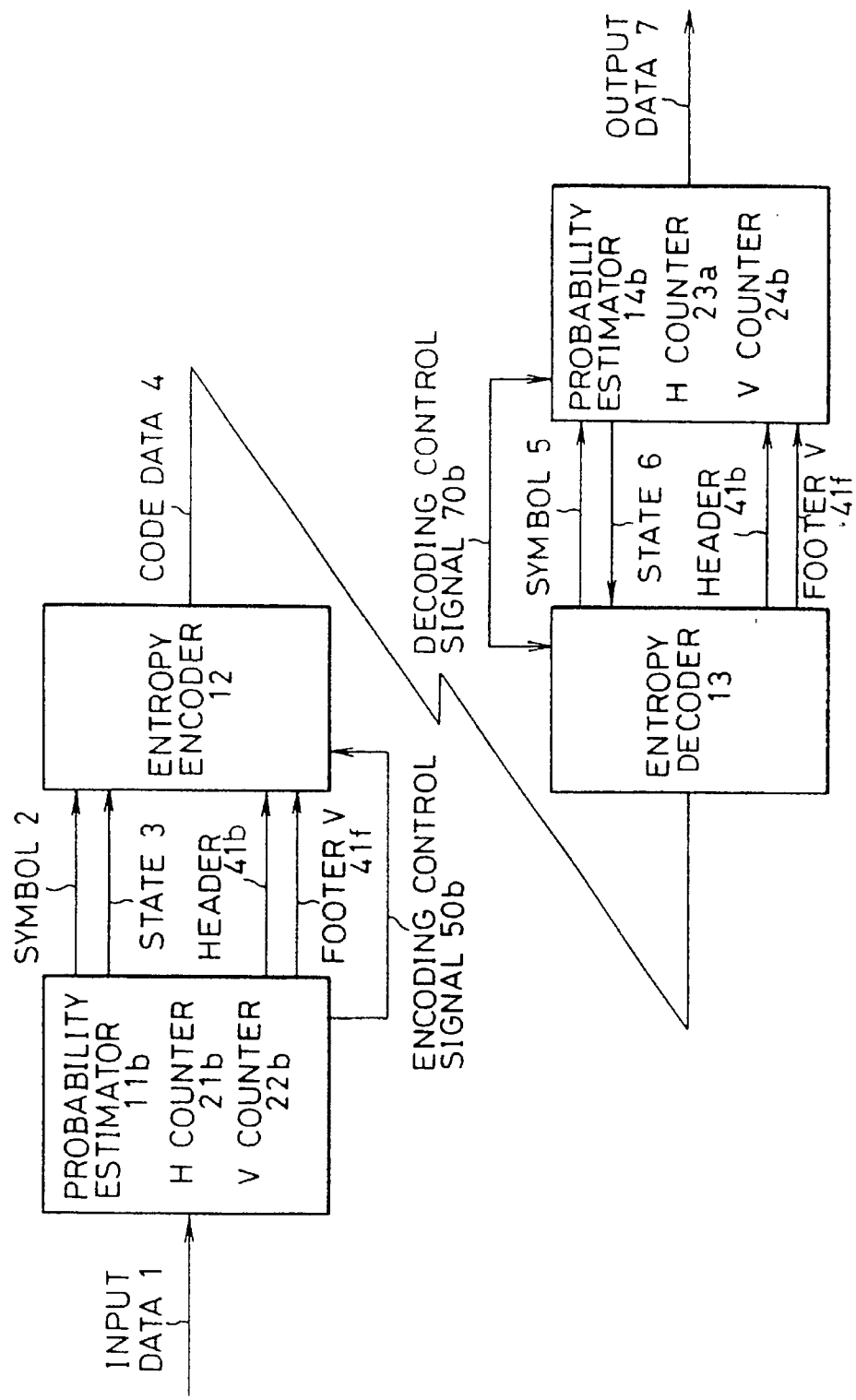
FIG. 7 shows a block diagram of a configuration of a second apparatus implementing the first embodiment of the present invention.
Figure 8:
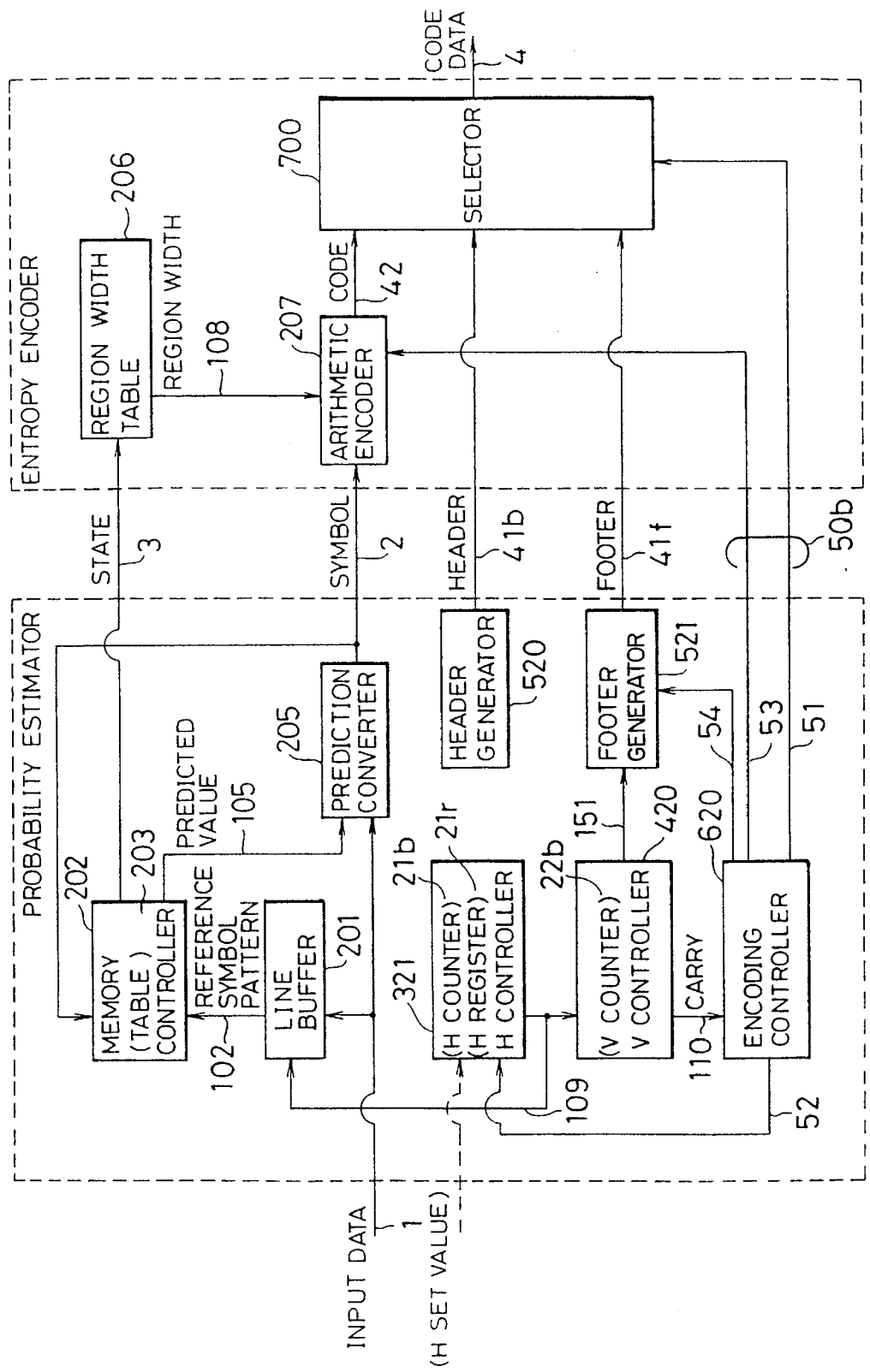
FIG. 8 shows an internal block diagram of an encoder of FIG. 7.
Figure 9:
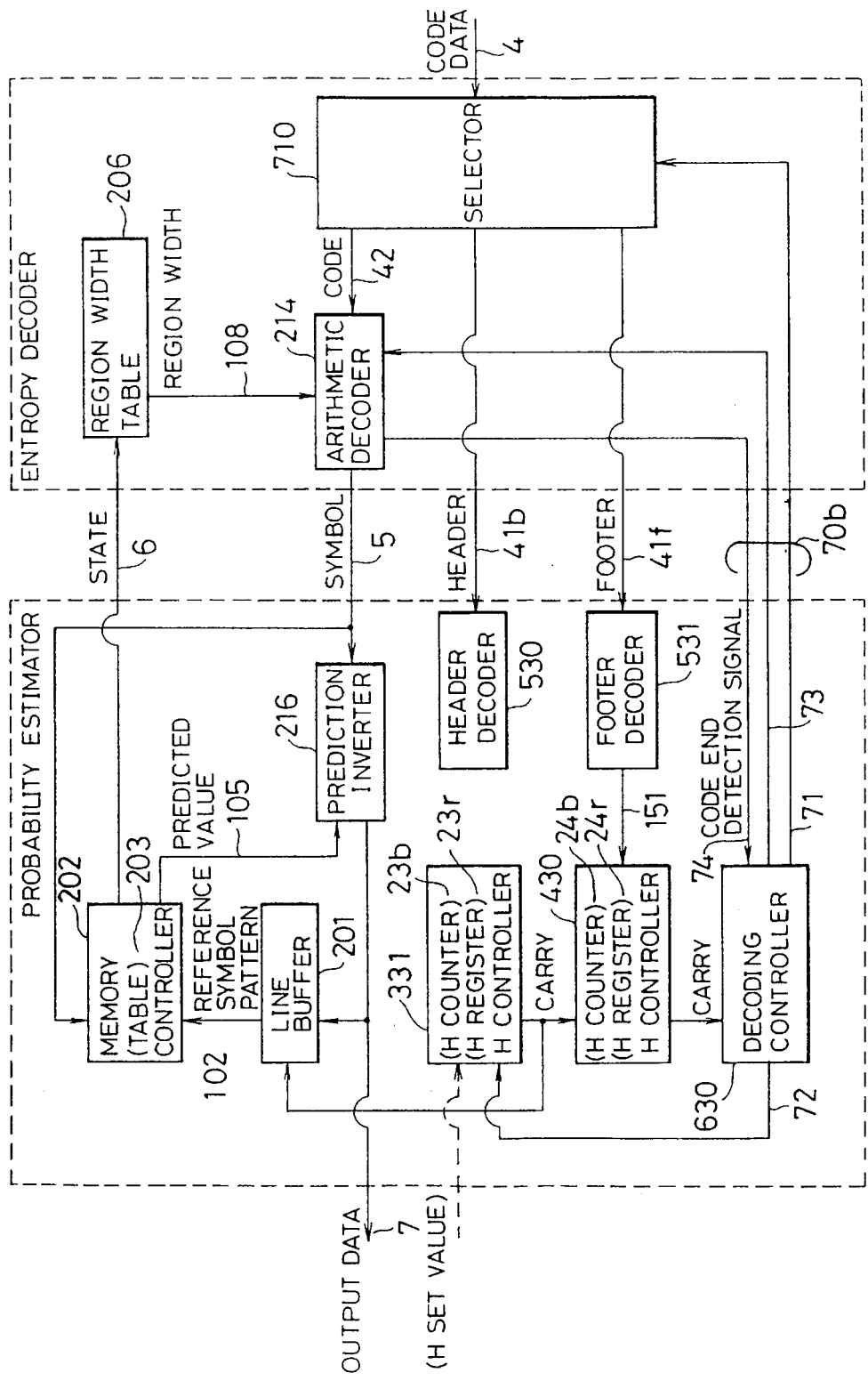
FIG. 9 shows an internal block diagram of a decoder of FIG. 7.

In FIGS. 7, 8 and 9, there are shown block diagrams of the encoder and the decoder in case that the number of horizontal pels is treated as the fixed value and isn't transmitted. An H count controller 321 previously stores the number of horizontal pels (H) at an H register 21r as the fixed value. An H count controller 331 previously registers the same value at an H register 23r. As a result, the header generator 520 generates the header 41 without including the number of horizontal pels (H) and the header decoder 530 decodes it.

Figure 10:
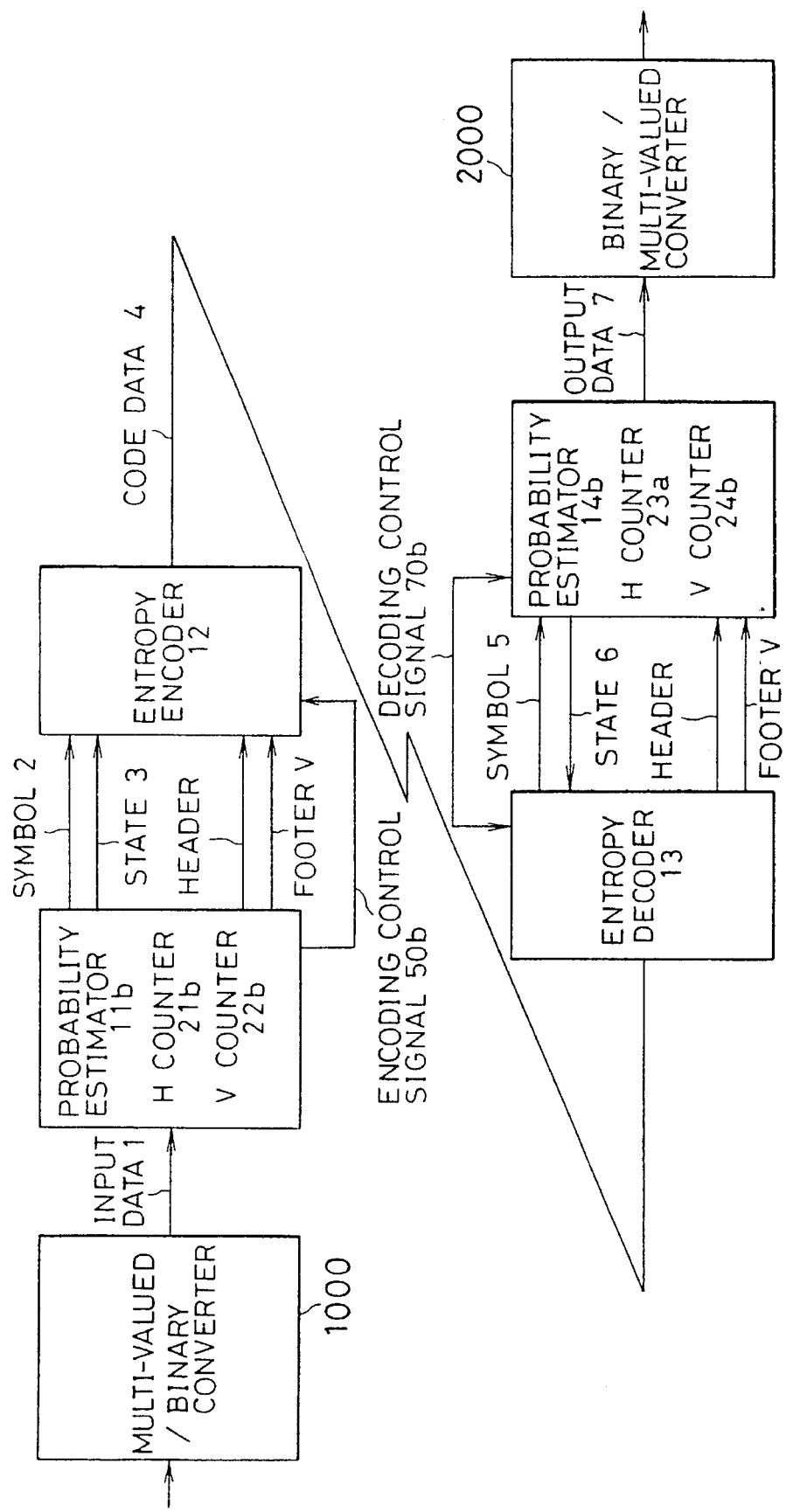
FIG. 10 shows a block diagram of a configuration of a third apparatus implementing the first embodiment of the present invention.

In FIG. 10, a multi-valued/binary convertor 1000 and a binary/multi-valued convertor 2000 are provided. In this case, the encoding process can be performed after the multi-valued data is made into the binary data. Here, the decoded binary data can be converted into the multi-valued data. By using the system shown in FIG. 10, data of a color image, gradation or gray scale can be encoded and decoded.

Embodiment 2

In a second embodiment, there is shown a system in which the end of the information source symbols can be judged by inserting End Of Sequence (EOS) symbols which indicate if it is the last stripe or not whenever the information source symbols of one stripe is encoded. The information source symbols of one stripe is given as the product of the number of horizontal pels (H) transmitted through the header by the number of stripe lines (K) forming one stripe. This system will be called an EOS system. The header transmits the number of horizontal pels (H), the number of stripe lines (K), and an EOS state (S). The EOS state (S) is output from the probability estimator to the entropy encoder in case of encoding the EOS symbol. The header also transmits the information about the method for selecting reference symbols, the method for predicting the predicted value for the pels as an object of encoding, and the method for estimating the occurrence probability ratio of the predicted pels. The decoding process is performed without missing the end of the information source symbols by judging if it is the last line or not from the inserted EOS symbol whenever the information source symbols of one stripe is decoded. In Embodiment 2, it is assumed that the method for selecting the reference symbols, the method for predicting the pels as an object of encoding, and the method for estimating the occurrence probability ratio of the predicted pels are commonly set at both the encoding site and the decoding site. Only the number of horizontal pels (H), the number of stripe lines (K), and the EOS state (S) are transmitted through the header.

Figure 11:
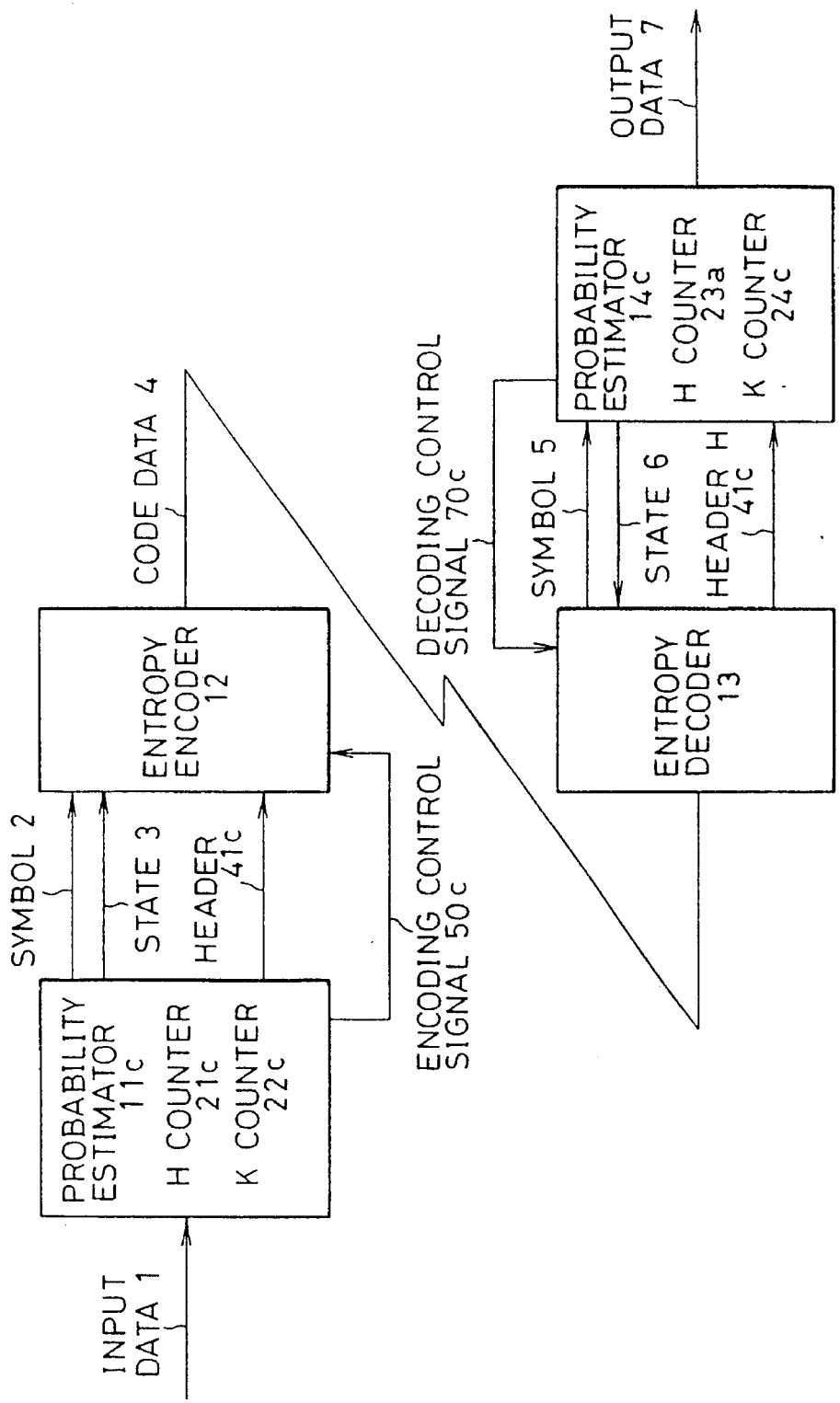
FIG. 11 shows a block diagram of a configuration of an apparatus of a second embodiment of the present invention.

There is shown in FIG. 11 a block diagram of a configuration of an apparatus based on the EOS system in case of transmitting the number of horizontal pels (H), the number of stripe lines (K), and the EOS state (S) through the header.

In FIG. 11, a probability estimator 11c outputs a symbol 2. The symbol 2 is an object of encoding which can be got after the predicted conversion of an input data 1. The probability estimator 11c outputs a state 3 which is a representative value of the estimated occurrence probability ratio for the symbol 2. The probability estimator 11c has an H counter 21c (described later) and a K counter 25c (described later) inside. A probability estimator 14c outputs a state 6 which is a representative value of the estimated occurrence probability ratio for a symbol 5 to an entropy decoder 13. The probability estimator 14c has an H counter 23c (described later) and a K counter 26c (described later) inside. The H counter 21c counts pels at every processing of output data up to the number of horizontal pels (H) transmitted through the header. The K counter counts pels at every processing of lines up to the number of stripe lines (K) transmitted through the header.

Other elements in FIG. 11 have same reference numbers as in FIG. 36 (a conventional system) and the operations are the same as in FIG. 36.

Figure 12A:
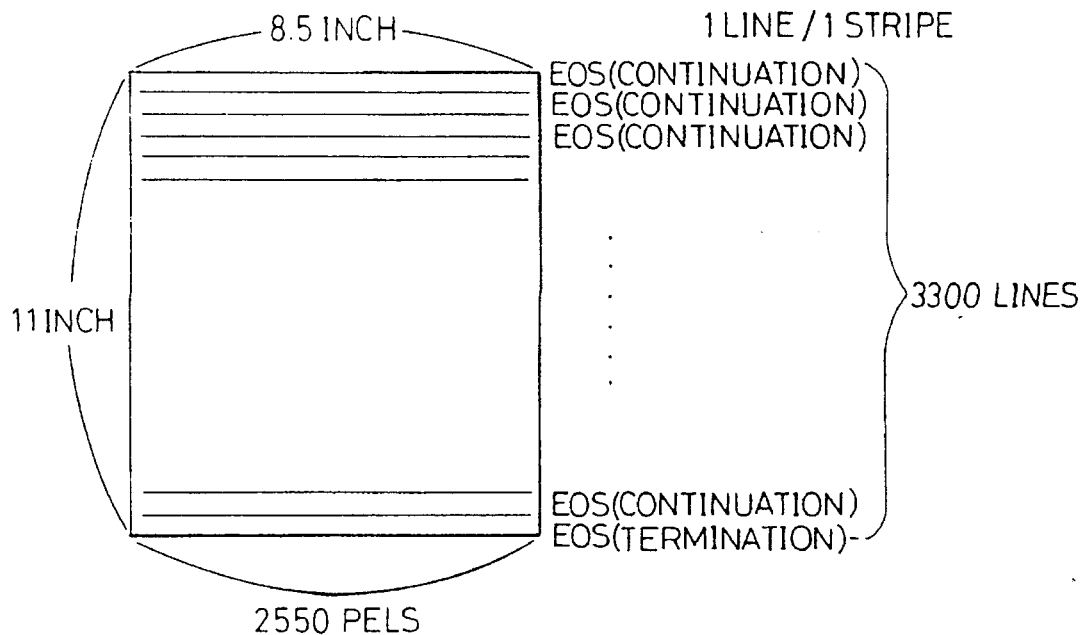
FIG. 12(a) shows an example of an input data of the second embodiment.

There is shown a conceptional view of a stripe according to this embodiment in FIG. 12. In FIG. 12(a), one stripe consists of a single line. As a result, the number of pels of one stripe is equal to the number of pels of one line. That is, 2550 pels. At the end of each stripe, the EOS symbol which indicates a continuation is coded and only at the end of the last stripe, the EOS symbol which indicates the termination is coded.

Figure 12B:
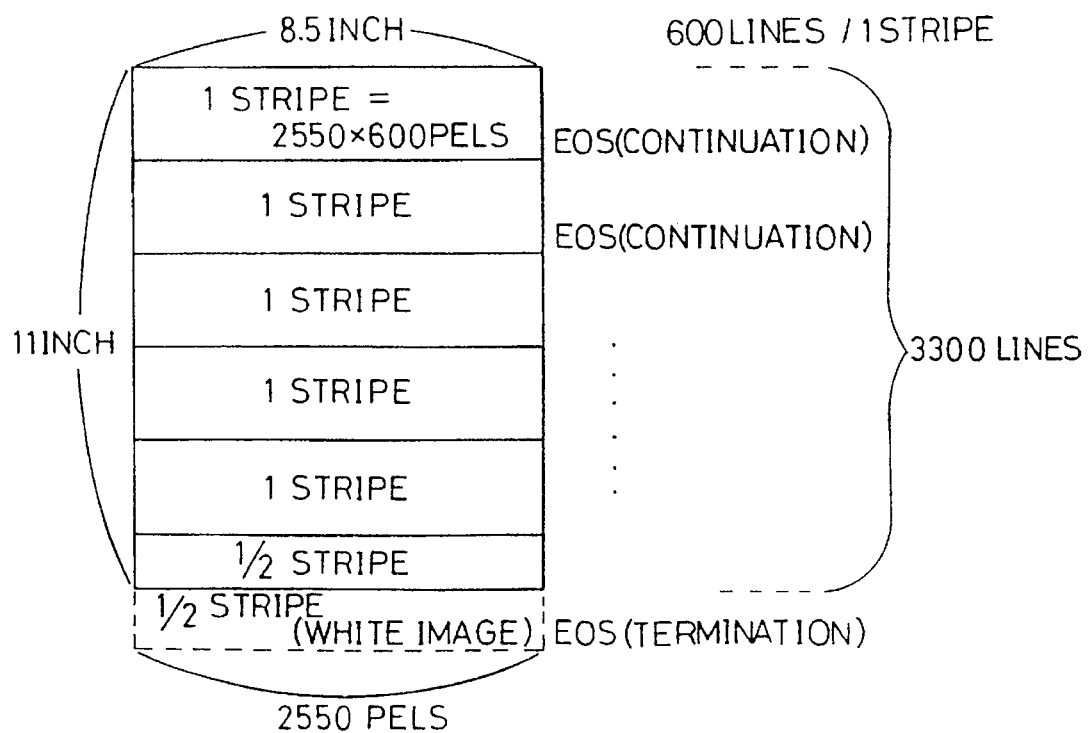
FIG. 12(b) shows another example of an input data of the second embodiment.

In FIG. 12(b), the stripe consists of 600 lines. As a result, the total number of pels of one stripe can be given according to the following formula.

the number of pels of one stripe=the number of horizontal pels (H)×the number of stripe lines (K)=2550×600=1,530,000 pels At the end of each stripe except last one, the EOS symbol which indicates the continuation is inserted. And at the end of input data 1 in the last stripe, pels which show a white image are placed to complete the stripe (only if the number of lines in the last stripe is not equal to the number of stripe lines (K)) and the EOS symbol which indicates the termination is inserted.

Figure 13:
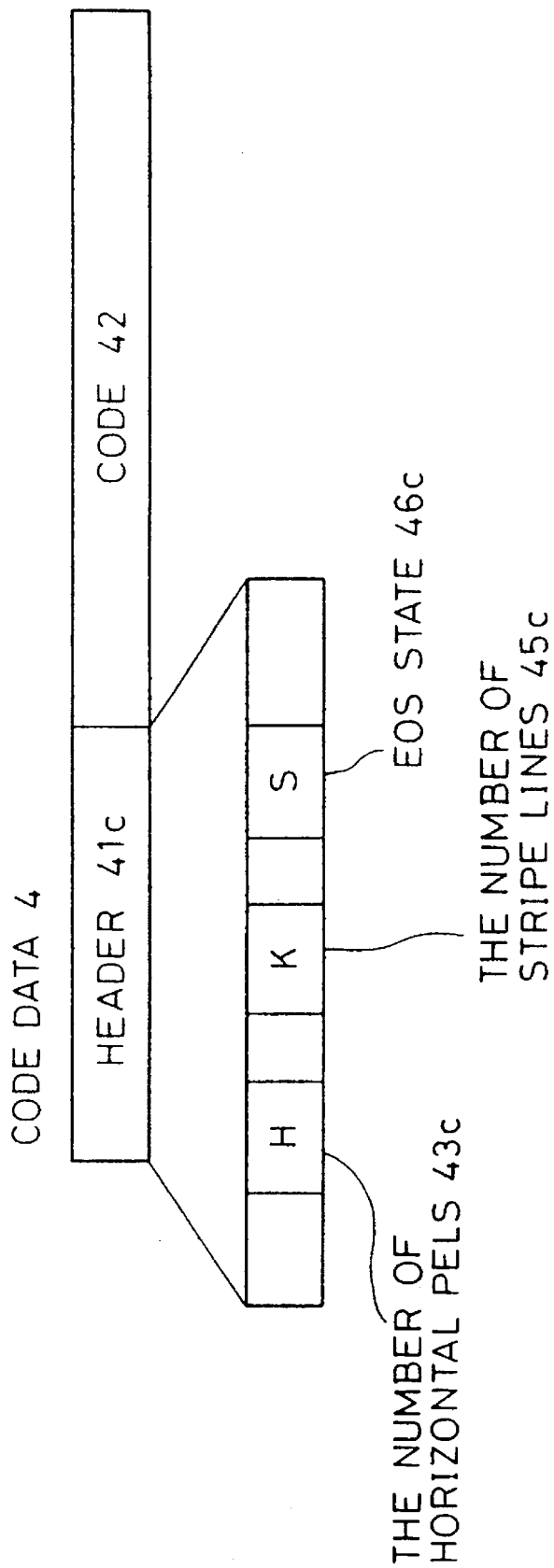
FIG. 13 shows a code data format of the second embodiment.

There is shown a configuration of a code data in case of using the above-described EOS system in FIG. 13. In FIG. 13, code data 4 contains a header 41c and a code 42 (described later). The number of horizontal pels (H) 43c, the number of stripe lines 45c, and an EOS state (S) 46c are transmitted through the header 41c.

The header 41c of the code data 4 is transmitted before the entropy encoder 12 transmits the code 42 to the entropy decoder 13. Before beginning of the decoding process, the number of horizontal pels 43c, the number of stripe lines 45c, and the EOS state 46c are transmitted. Locations of the horizontal pels 43c, the number of stripe lines 45c, and the EOS state 46c need not be shown in the figure as long as the predetermined format is used in the header 41c. If number of stripe lines 45c are treated as a fixed value, the transmission of the number of stripe lines 45c through the header can be omitted. If the EOS state 46c is not used, the transmission of the EOS state 46c through the header can be omitted. The EOS state 46c can be determined as the same state that with a representative value of the estimated occurrence probability ratio for the next symbol or the previous symbol to the EOS symbol. The EOS state 46c can also be determined as or the fixed state which does not need to be transmitted through the header.

There is shown a conceptional view of the encoding or decoding symbol stream according to the EOS system in FIG. 14. In FIG. 14, the symbol stream contains the symbol 2 for encoding and the symbol 5 for decoding. An EOS symbol E1 51 which shows the termination of the encoding and decoding process is placed at the end. An EOS symbol. E0 52 which shows the continuation of the encoding or decoding process is inserted when processing of one stripe is performed.

In the symbol stream of the symbol 2 for encoding and the symbol 5 for decoding, the EOS symbol 51 and the EOS symbol 52 are inserted when the encoding and decoding process of one stripe line is performed. The EOS symbol 51 which shows the termination of the encoding process and the EOS symbol 52 shows the continuation of the decoding process. The EOS symbol 51 which shows the termination of encoding process and the decoding process is placed only at the end of the encoding and decoding symbol stream. The true encoding symbol 2 and decoding symbol 5 can be determined by separating the EOS symbol from the symbol stream.

The number of lines cannot be transmitted when an enough memory for storing one image isn't provided. In this EOS system, the number or stripe lines is transmitted through the header. The stripe is defined according to the memory size provided in an encoding site or a transmitter site. Therefore, the number of lines is defined by the memory size provided. If the number of lines of the image is not a multiplied number of the number of stripe lines and an integer, the concealment processing, for example placing the white image, is needed so that the number of lines of the image is an integer multiple of the number of stripe lines. If the number of stripe line is one, the concealment processing isn't needed. When the number of stripe lines becomes large, the time for inserting the EOS symbol decreases. In case that the image is small enough to be stored in the provided memory, the number of stripe lines can be set as the total number of lines of the image. It is desirable to set the EOS state, which doesn't decrease the coding efficiency as far as possible.

The operation of a configuration of FIG. 11 will be explained. The probability estimator 11c performs the predicted conversion from the predicted value for the input data 1. The probability estimator 11c outputs the symbol 2 and the state 3 to the entropy encoder 12. The symbol 2 is an object of encoding which indicates conformity or nonconformity as result of comparison between a predicted value and an actual value of the information symbol 1. The state 3 is predicted for the symbol 2. The entropy encoder 12 inputs the symbol 2 and the state 3 from the probability estimator 11c as a parameter of encoding. The entropy encoder 12 outputs the code data 4 to the entropy decoder 13 after the encoding process. The entropy decoder 13 inputs the code data 4 from the entropy encoder 12. The entropy decoder 13 inputs the state 6 output from the probability estimator 14b for the symbol 5 which is an object of decoding, as a parameter of decoding. The entropy decoder 13 outputs the symbol 5 to the probability estimator 14c. The probability estimator 14c outputs the state 6 predicted for the symbol 5 to the entropy decoder 13. The probability estimator 14c performs the predicted inversion based on the symbol 5 input from the entropy decoder 13 as a result of decoding and the predicted value that was predicted for the symbol 5. If the symbol 5 indicates conformity with the predicted value, the predicted value is output as the output data 7, and if the symbol 5 indicates nonconformity with the predicted value, the non-predicted value (which is an inverted value of the predicted value) is output as the output data 7.

Figure 15:
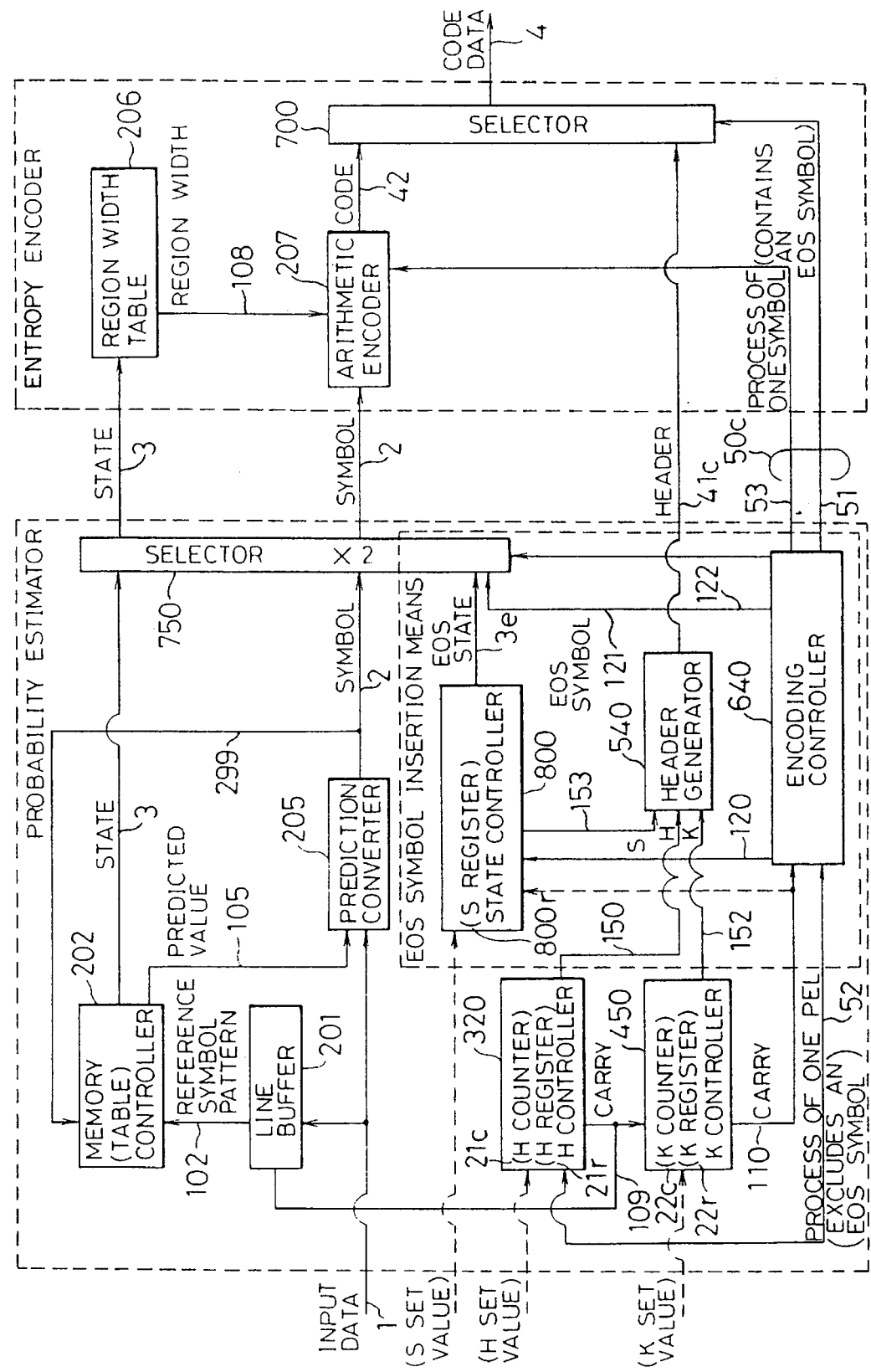
FIG. 15 shows an internal block diagram of an encoder of the second embodiment.

There is shown a block diagram of the encoder according to this embodiment in FIG. 15. In FIG. 15, a K count controller 450 inputs the carry signal 109 from an H count controller 320 and detects a boundary of the stripes. An encoding controller 640 inputs the carry signal 110 from the K count controller 450 and inserts the EOS symbol to the boundary of the stripes. A state controller 800 outputs the state of the EOS symbol as an EOS state 3e. A header generator 540 generates a header 41c from the horizontal pels (H) and the number of lines (K) and the EOS state (s).

The H count controller 320 has an H register 21r which stores the number of horizontal pels and an H counter 21c. The K count controller 450 has a K register 22r which registers the number of stripe lines and a K counter 22c.

A state controller 800 has a S register 800r which initially registers the EOS state. Here, it is assumed that the number of horizontal pels (H), the number of stripe lines (K), and the EOS state (S) are previously registered at the H register, the K register, and the S register, respectively from the outside.

A header generator 540 refers the number of horizontal pels (H) registered at the H register and the number of stripe lines (K) registered at the K register, and the EOS state (S) registered at the S register and generates the header 41c. The header 41c is selected by the selector 700 and output as the code data 4.

Next, information source symbols are encoded by an arithmetic encoder 207 and output as the code 42. The encoding controller 640 increments the value of the H counter in the H count controller 320 with a signal 52 by every processing of one pel. An H count controller 320 issues the carry signal 109 at the end of one line. A K count controller 450 increments the value of the K counter according to the carry signal 109.

The K count controller 450 issues the carry signal 110 at the end of one stripe. As shown in FIG. 12(a), in case that one line equals to one stripe, the K count controller 450 isn't needed. If the K count controller 450 isn't needed, the carry signal 109 from the H count controller 320 can be input to the encoding controller as the carry signal 110. The encoding controller 640 outputs the signal 120 for requesting to output an state to the state controller 800. A state controller 800 outputs an EOS state 3e for the EOS symbol 121 to the selector 750. Here, the EOS state is previously registered as the fixed value at the S register 800r. When the EOS symbol 121 and the EOS state 3e are input to the selector 750, the encoding controller 640 outputs the selective signal 122 to select the EOS symbol 121 and the EOS state 3e. Further, the encoding controller 640 requests the encoding process of the inserted EOS symbol to the arithmetic encoder 207 according to a signal 53. As a result, in this embodiment, the signal 52 which shows the processing of one pel issued from the encoding controller 640 is a signal without the processing of the EOS symbols. On the other hand, the signal 53 is the symbol processing signal including the EOS symbols.

Figure 16:
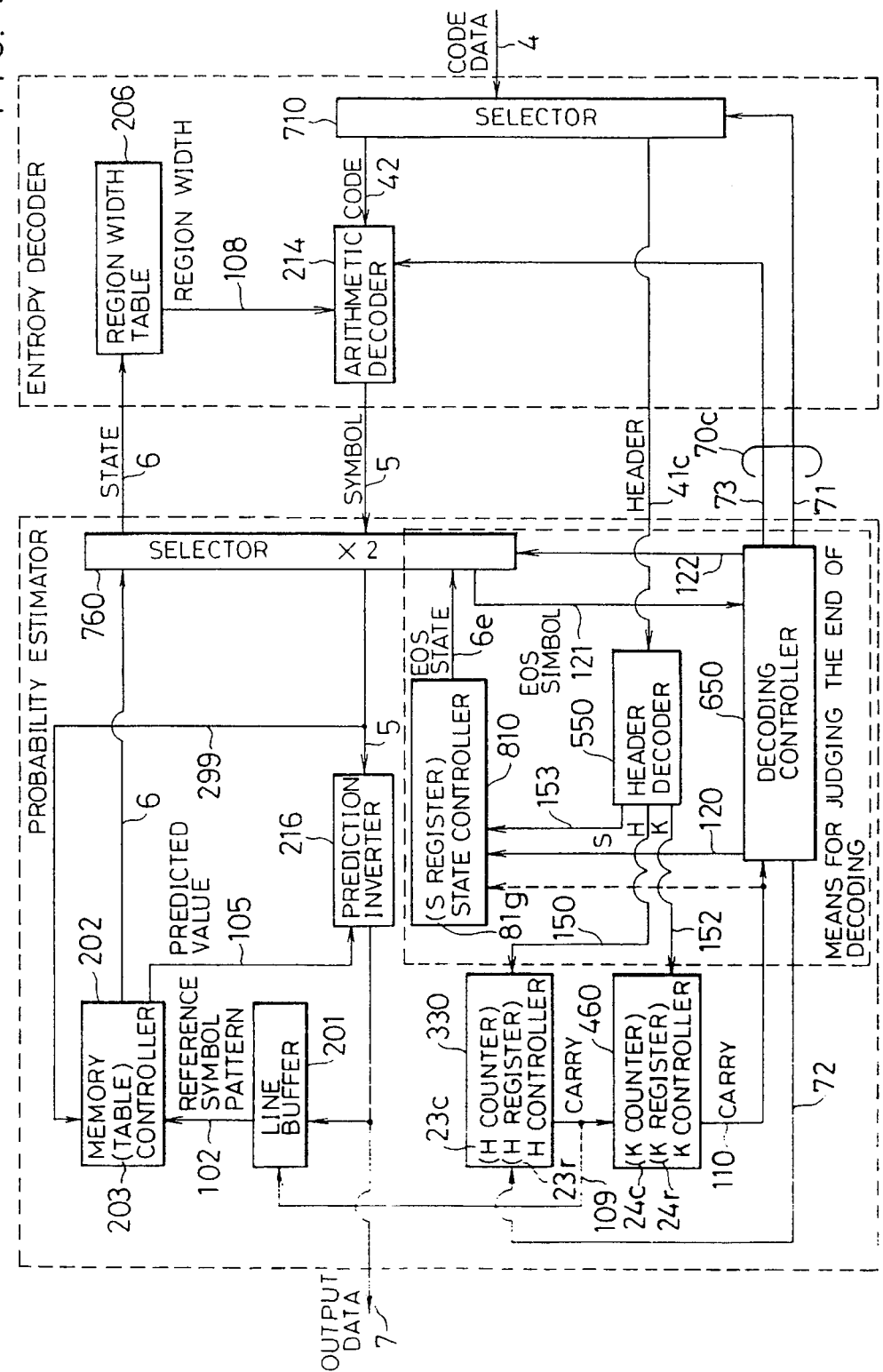
FIG. 16 shows an internal block diagram of a decoder of the second embodiment.

There is shown a block diagram of a decoder according to this embodiment in FIG. 16. In FIG. 16, a decoding controller 650 inputs a carry signal 110 from a K counter 460. The decoding controller 650 inputs the EOS symbol inserted to the boundary of the stripe from the selector 760. The decoding controller 650 judges the end of decoding process by recognizing the value of the EOS symbol.

A header decoder 550 extracts the number of horizontal pels (H) and the number of lines (K) of one stripe and the EOS state (S) notified by the header 41c. The header 41c registers each of them at the H register 23r, a K register 24r and a S register 810r, previously. The decoding controller 650 inputs the carry signal 110 from the K count controller 460. When the signal 110 is input, the decoding controller 650 judges the symbol to be decoded by an arithmetic decoder 214 is the EOS symbol 121 and requests to output an EOS state 6e to a state controller 810. The decoding controller 650 selects the selector 760 according to the selector signal 122 and sends the EOS state 6e to the table 206 for the region width. An arithmetic decoder 214 decodes the EOS symbol 121 based on the width region 108. The EOS symbol 121 decoded at the arithmetic decoder 214 is input to the decoding controller by the selection of the selector 760. The decoding controller 650 checks the value of the EOS symbol and judges whether the stripe input just before is the last stripe or not. The decoding controller requests the decoding process of the inserted EOS symbol by issuing the signal 73 to the arithmetic decoder 214. As a result, in this embodiment, the signal 72 which shows the processing of one pel issued from the decoding controller is a signal without the processing of the EOS symbols. On the other hand, the signal 73 is the symbol processing signal including the EOS symbols.

Figure 17:
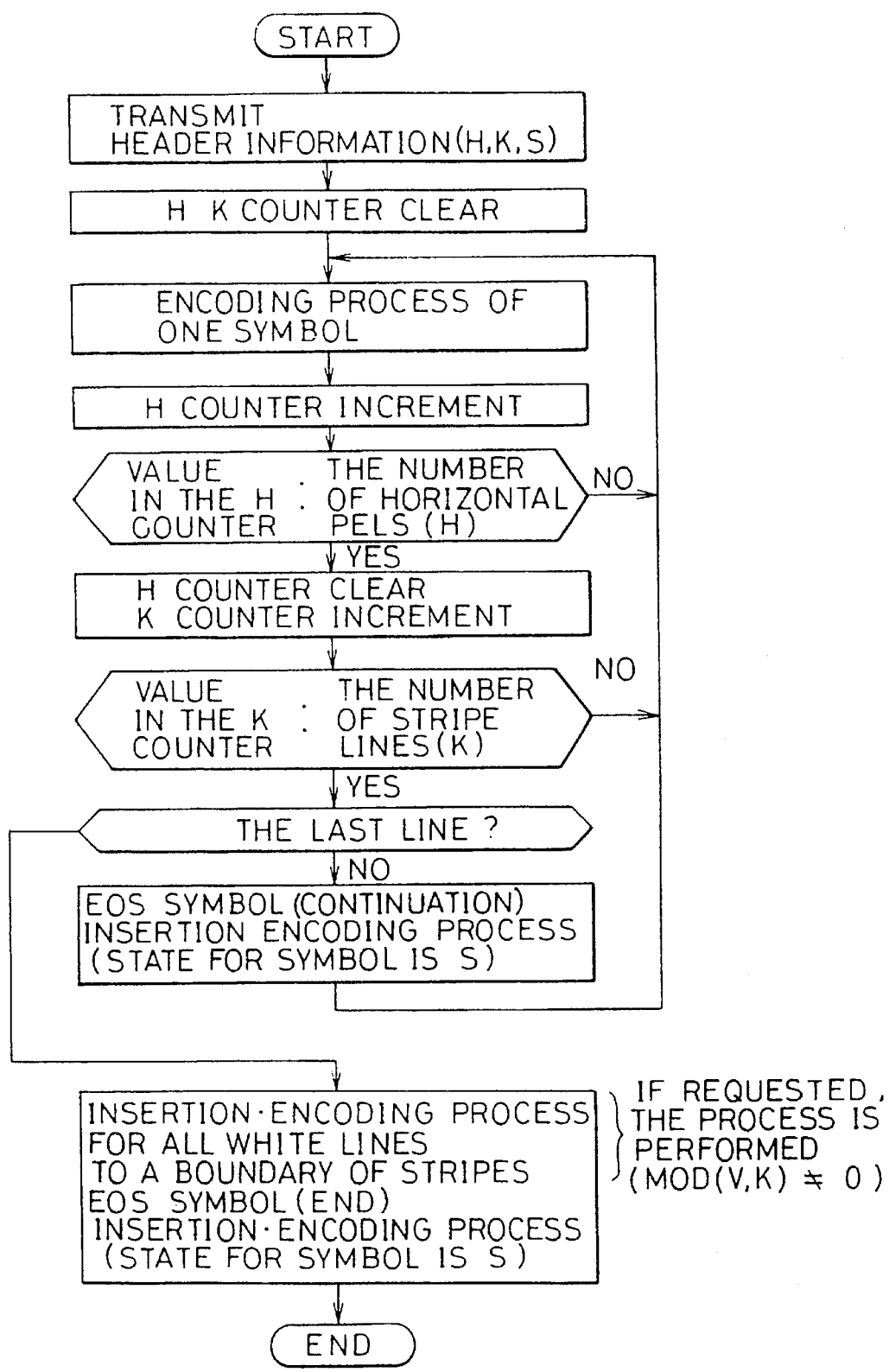
FIG. 17 shows a flow chart of an encoding site of the second embodiment.

There is shown a flow chart of the encoding process according to this embodiment in FIG. 17. As shown in FIG. 17, at the beginning of encoding process, the probability estimator 11c transmits the number of horizontal pels (H), the number of stripe lines (K), and the EOS state (S) through the header from the receiver site to the transmitter site. The probability estimator 11c clears the value in the H counter 21c and the K counter 25c. When the encoding process of the input data 1 is performed, the value in the H counter 21c is incremented. And, when the value in the H counter 21c reaches the number of horizontal pels (H) transmitted through the header, the value in the K counter 25c is incremented and the value in the H counter 21c is cleared. When the value in the K counter 25c reaches the number of stripe lines (K) transmitted through the header and the next stripe still exists, the EOS symbol which indicates the continuation of the encoding process is inserted as a boundary of the encoding process of one stripe. Then, the encoding process continues. On the other, when the value in the K counter 25c reaches the number of stripe lines (K) and the input data 1 comes to an end, that is, the next stripe doesn't exist, the EOS symbol which indicates the termination of the encoding process is placed. Then, the encoding process is completed. The EOS state (S) transmitted through the header corresponds to the EOS symbol. The EOS state (S) is output to the entropy encoder 12.

Figure 18:
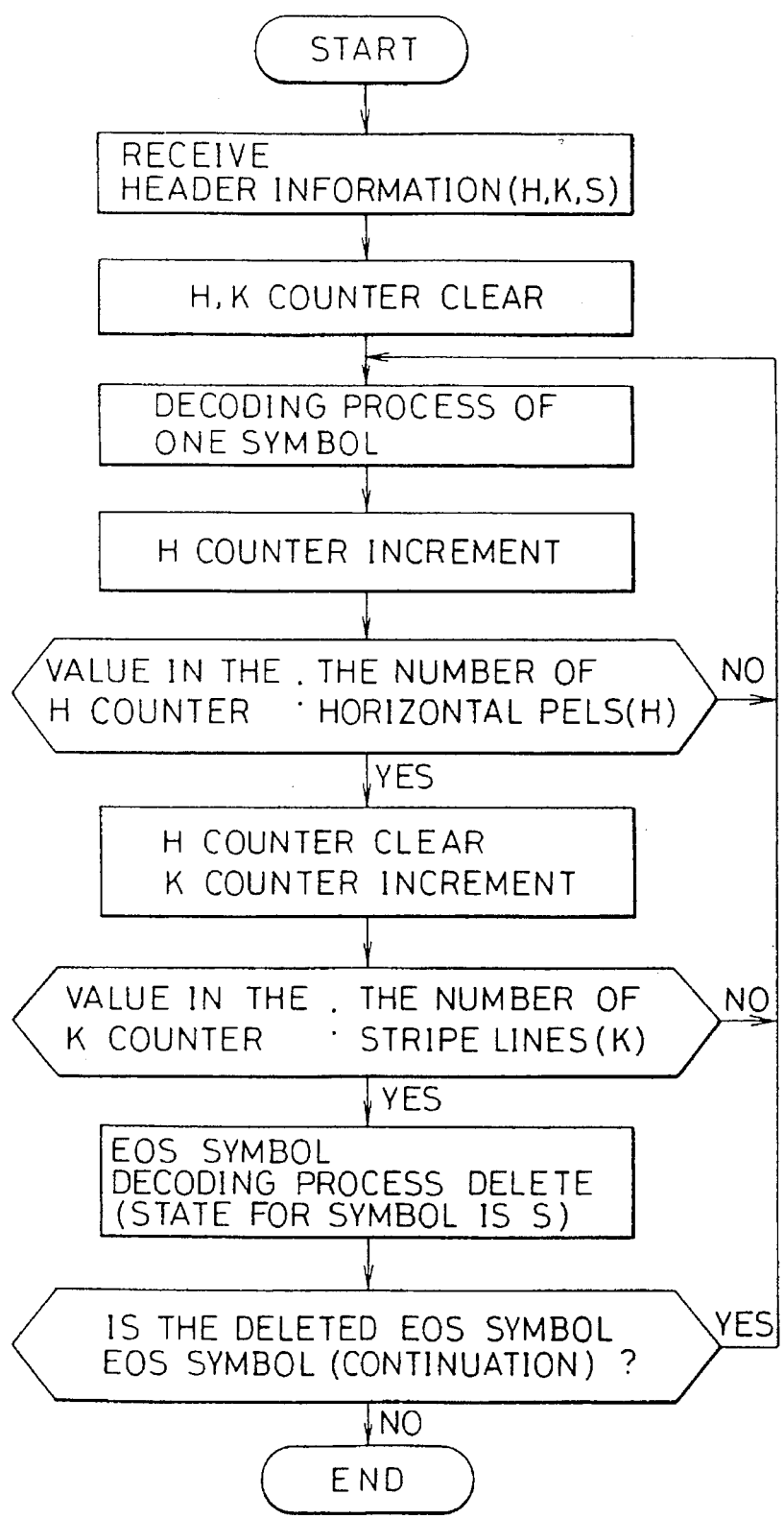
FIG. 18 shows a flow chart of a decoding site of the second embodiment.

There is shown a flow chart of the decoding process based on this embodiment in FIG. 18. As shown in FIG. 18, at the beginning of the decoding process, the probability estimator 14c refers the horizontal pels (H), the number of stripe lines (K), and the EOS state (S) from the header and stores each of them. At the beginning of the decoding process, the value in the H counter 23c and the value in the K counter 26c are cleared. Then, the value in the H counter 23c is incremented at every processing of the decoding of the output data 7. When the value in the H counter 23c reaches the number of horizontal pels (H) received through the header, the value in the K counter 26c is incremented and the value in the H counter 23c is cleared. When the value in the K counter 25c reaches the number of stripe line (K) received through the header, the symbol 5 which will be decoded next is regarded as the EOS symbol. The state 6 output from the probability estimator 14c to the entropy decoder 13 is regarded as the EOS state (S). If the decoded symbol, that is, the EOS symbol indicates the continuation of the decoding process, the decoding process continues for the next stripe. If the EOS symbol indicates the termination of the decoding process, the next stripe doesn't exist and the decoding processing is completed.

In this embodiment, it is assumed that the method for selecting reference symbols, the method for predicting the predicted value for pels as an object of encoding, and the method for estimating the occurrence probability ratio of the predicted pels are commonly set at both the encoding site and the decoding site. Therefore, they need not be transmitted through the header. If the number of horizontal pels (H), the number of stripe lines (K), and the EOS state (S) are fixed values, the transmission of the number of horizontal pels (H), the number of stripe lines (K), and the EOS state (S) isn't needed. As to the EOS state (S), it is possible to give a specific state value as stated in this embodiment. It is also possible to transmit a method for determining the EOS state (S) through the header. For example, an indication of a method to use the state of the previous symbol as the EOS state (S) can be transmitted through the header. The EOS symbol need not always have one symbol. That is, the EOS symbol can have plural symbols. For example, the following cases can be used. In the encoder, the predetermined K number of symbols are inserted. One or plural symbol streams among the $2^K$ ways of symbol streams combined with K number of the More Probable Symbols (MPSs) and the Less Probable Symbols (LPSs) are regarded as the EOS symbol stream which indicates the boundary of the stripes. On the other, in the decoder, K number of symbols are decoded as the EOS symbol stream inserted for indicating the boundary of the stripes. One or plural symbol streams predetermined in the encoder among the $2^K$ ways of symbol streams combined with the K number of the MPSs and the LPSs, can be judged as the symbol stream which indicates the boundary of the stripes.

Embodiment 3

In a third embodiment, a proper marker symbol is inserted as a dummy symbol whenever the specific symbol pattern occurs to the binary information source symbol. Then, a terminate symbol sequence which can be detected only at the end of the information source symbols is placed and the end of the information source symbols can be judged. This system will be called a marker system. In this system, the number of horizontal pels (H) is transmitted through the header if needed. And, a marker state (S), a LPS pattern length (N), and the information of the method for selecting the reference symbols, the method for predicting the predicted value for pels as an object of encoding, and the method for estimating the occurrence probability ratio of the predicted pels are transmitted through the header. Whenever the specific symbol pattern is decoded, the next decoding symbol is treated as an inserted marker symbol and it is judged if the next decoding symbol consists of the terminate symbol sequence or not. Based on the judged result, the decoding process is completed. In this embodiment, it is assumed that the method for selecting reference symbols, the method for predicting pels as an object of encoding, and the method for estimating the occurrence probability ratio of the predicted pels are commonly set previously both at the encoding site and the decoding site. It is also assumed that the number of horizontal pels (H), the marker state (S), the LPS pattern length (N) are transmitted through the header.

Figure 19:
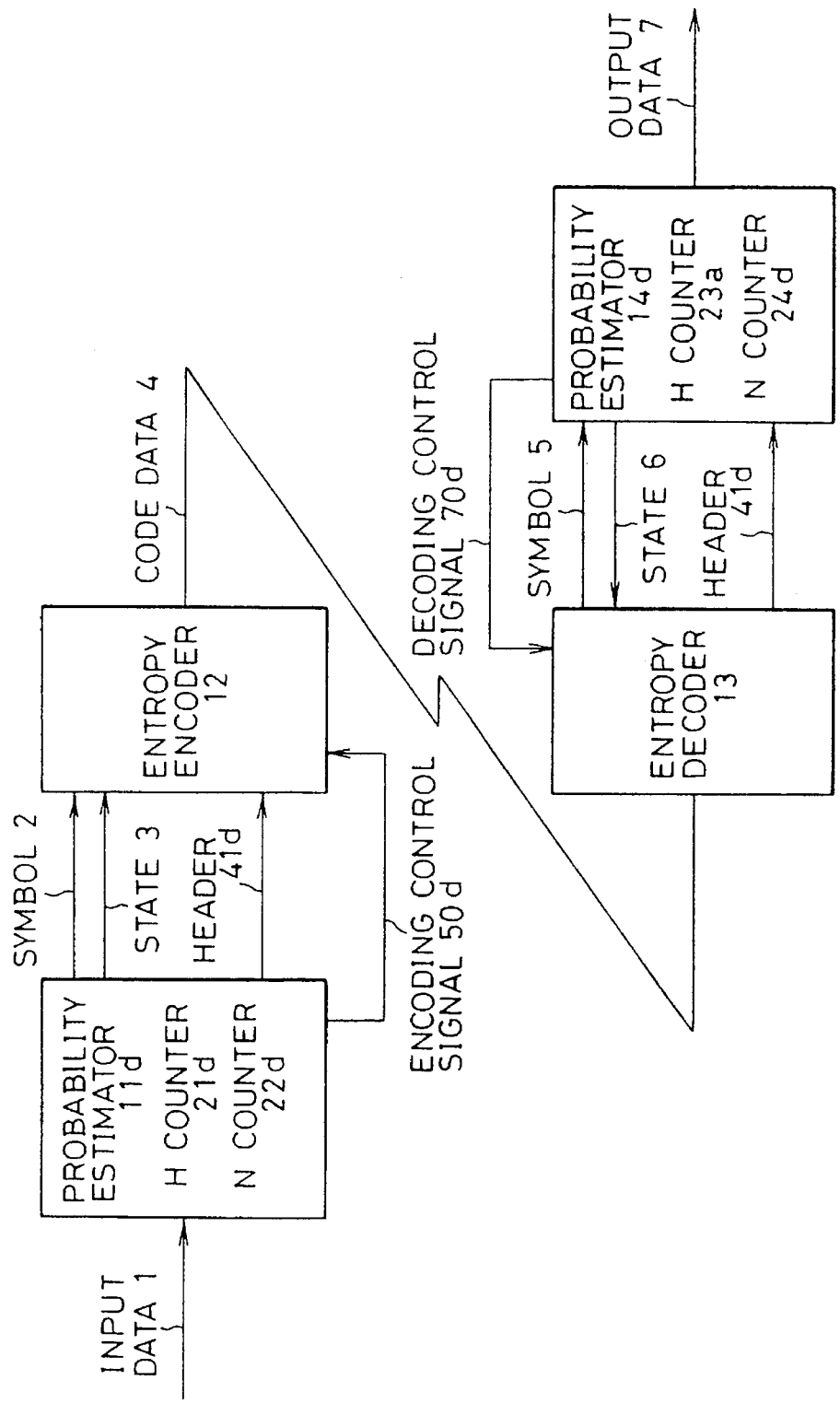
FIG. 19 shows a block diagram of a configuration of an apparatus of a third embodiment according to the present invention.

There is shown a block diagram of a configuration of an apparatus according the marker system in case of transmitting the number of horizontal pels (H), the marker state (S), and the LPS pattern length (N) in FIG. 19.

In FIG. 19, a probability estimator 11d outputs the symbol 2 and the state 3. The symbol 2 is an object of encoding which can be got after the predicted conversion is performed for the input data 1. The state 3 is a representative value of the estimated occurrence probability ratio for the symbol 2. The probability estimator 11d has an H counter 21d (described later) and a N counter 27d (described later). A probability estimator 14d outputs a state 6 to an entropy decoder 13. The state 6 is a representative value of the estimated occurrence probability ratio for the symbol 5. And, the probability estimator 14d outputs an output data 7 which can be got after the predicted inversion of the symbol 5 input from the entropy decoder 13. The probability estimator 14d has an H counter 23d (described later) and a N counter 28d (described later). The H counter 21d counts the number of horizontal pels up to the number of horizontal pels (H) transmitted through the header by every processing of the input data. The N counter 27d counts the consecutive number of the LPSs up to the LPS pattern length (N) whenever the encoding process outputs the LPS. An H counter 23d counts the number of horizontal pels up to the number of horizontal pels (H) transmitted through the header by every process of the output data. A N counter 28d counts the consecutive number of the LPSs up to the LPS pattern length (N) whenever the decoding process outputs the LPS.

Other elements in the figure have the same reference numbers as shown in FIG. 36 (conventional system) and the operations are the same as described in the conventional system.

Figure 20:
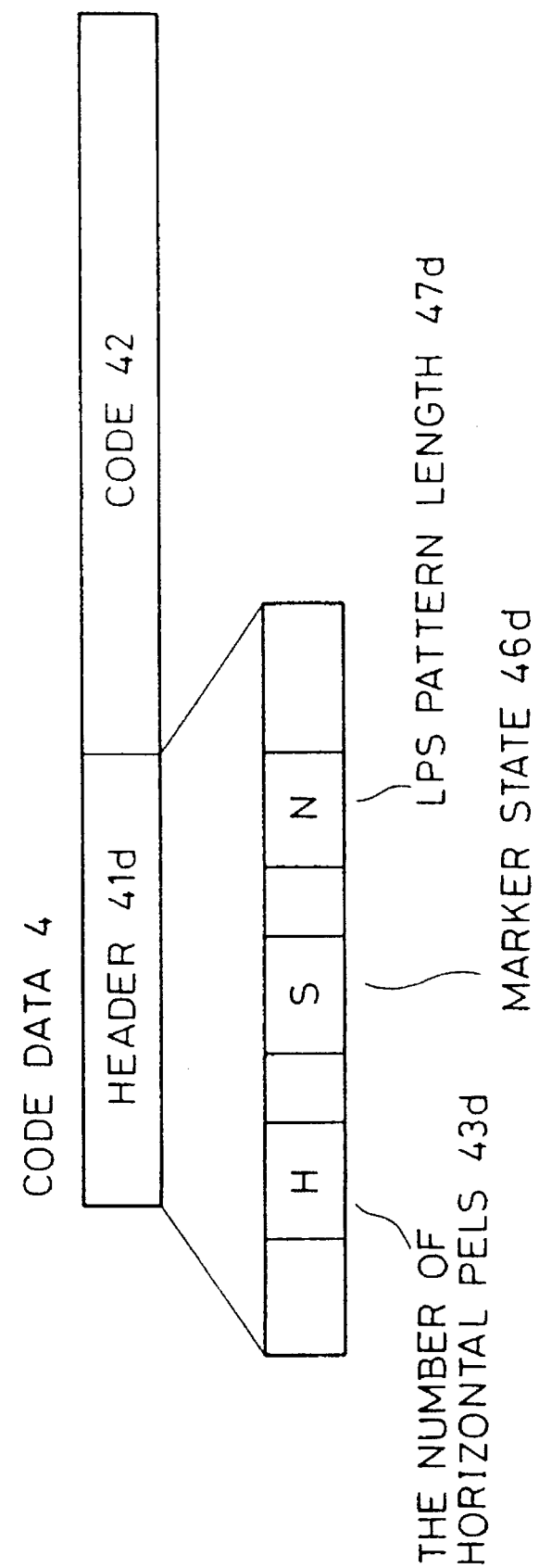
FIG. 20 shows a code data format of the third embodiment.

There is shown a code data format according to the marker system in FIG. 20.

In FIG. 20, a code data 4 contains a header 41d and a code 42 (described later). The number of horizontal pels (H) 43d, the marker state 46d, and the LPS pattern length (N) are transmitted through the header 41d.

The header 41d in the code data 4 is transmitted before the entropy encoder 12 transmits the code 42 to the entropy decoder 13. The number of horizontal pels 43d, the marker state 46d, the LPS pattern length 47d are received before beginning the decoding process of the entropy decoder 13. A location of the number of horizontal pels 43d, the marker state 46d, and the LPS pattern length 47d need not be described in the figure as long as the predetermined format is used in the header 41d. If the LPS pattern length 47d is a fixed value, it can be omitted from the header. When the marker state 46d isn't treated with the value transmitted through the header, it can be omitted. If omitted, the maker state (S) 46d should be determined as the same state with a representative value of an estimated occurrence probability ratio for the previous symbol or the next symbol to the maker symbol. Or, the maker state 46d should be determined as a fixed state which does not need to be transmitted through the header.

There is shown a conceptional view of the encoding or decoding symbol stream according to the marker symbol in FIG. 21. In FIG. 21, a value of the LPS pattern length (N) is two. The stream of the symbol 2 for encoding and the symbol 5 for decoding contains a MPS 53, and a LPS 54. The stream also contains a terminate symbol sequence 55. A marker symbol X1 56 shows the termination of encoding and decoding process. A marker symbol X0 57 shows the continuation of the encoding and decoding process.

in the stream of the symbol 2 for encoding and the symbol 5 for decoding, the marker symbol 57 as a dummy symbol is inserted just after the LPS 54 occurs consecutively up to the number shown by the LPS pattern length (N). A count of the LPS 54 is cleared whenever the MPS 53 occurs or the dummy marker symbol 57 is inserted. The terminate symbol sequence 55 is placed only at the end of the encoding and decoding symbol stream. The true encoding symbol 2 and the true decoding symbol 5 can be got by separating the dummy marker symbol 57 and the terminate symbol sequence 55 from the symbol stream. In this case, it is desirable that the dummy marker symbol 57 uses the MPS and the marker symbol which indicates the termination uses the LPS on the point of coding efficiency. Otherwise, the coding efficiency is surely reduced.

The terminate symbol sequence 55 contains (N+2) symbols or 4 symbols in FIG. 21. At the start, one MPS 53 is used and two LPSs 54 set as the LPS pattern length (N)=2, and one marker symbol 56 which shows the termination of the encoding and decoding process are used for forming the terminate symbol sequence 55.

The operation of the system of Embodiment 3 will be explained. The probability estimator 11*d* performs the predicted conversion from the predicted value that is predicted for the input data 1. The probability estimator 11*d* outputs the symbol 2. The symbol 2 is an object of encoding and indicates the conformity or nonconformity as a result of comparison between a predicted value and an actual value of the information source symbol 1. The probability estimator 11*d* outputs the state 3 predicted for the symbol 2 to the entropy encoder 12. The entropy encoder 12 inputs the symbol 2 and the state 3 from the probability estimator 11*s* as a parameter of encoding. The entropy encoder 12 produces the code data 4 to the entropy decoder 13. The entropy decoder 13 inputs the code data 4 output from the entropy encoder 12 and the state 6 output from the probability estimator 14*d* for the symbol 5 which is an object of decoding, as a parameter of decoding. The entropy decoder 13 outputs the symbol 5 to the probability estimator 14*d*. The probability estimator 14*d* outputs the state 6 predicted for the symbol 5 to the entropy decoder 13. The probability estimator 14*d* performs a prediction inversion based on the symbol 5 input from the entropy decoder 13 and a predicted value that is predicted for the symbol 5. If the symbol 5 indicates conformity with the predicted value, the predicted value is output as the output data 7. If the symbol 5 indicates nonconformity with the predicted value, the non-predicted value (which is an inverted value of the predicted value) is output as the output data 7.

Figure 22:
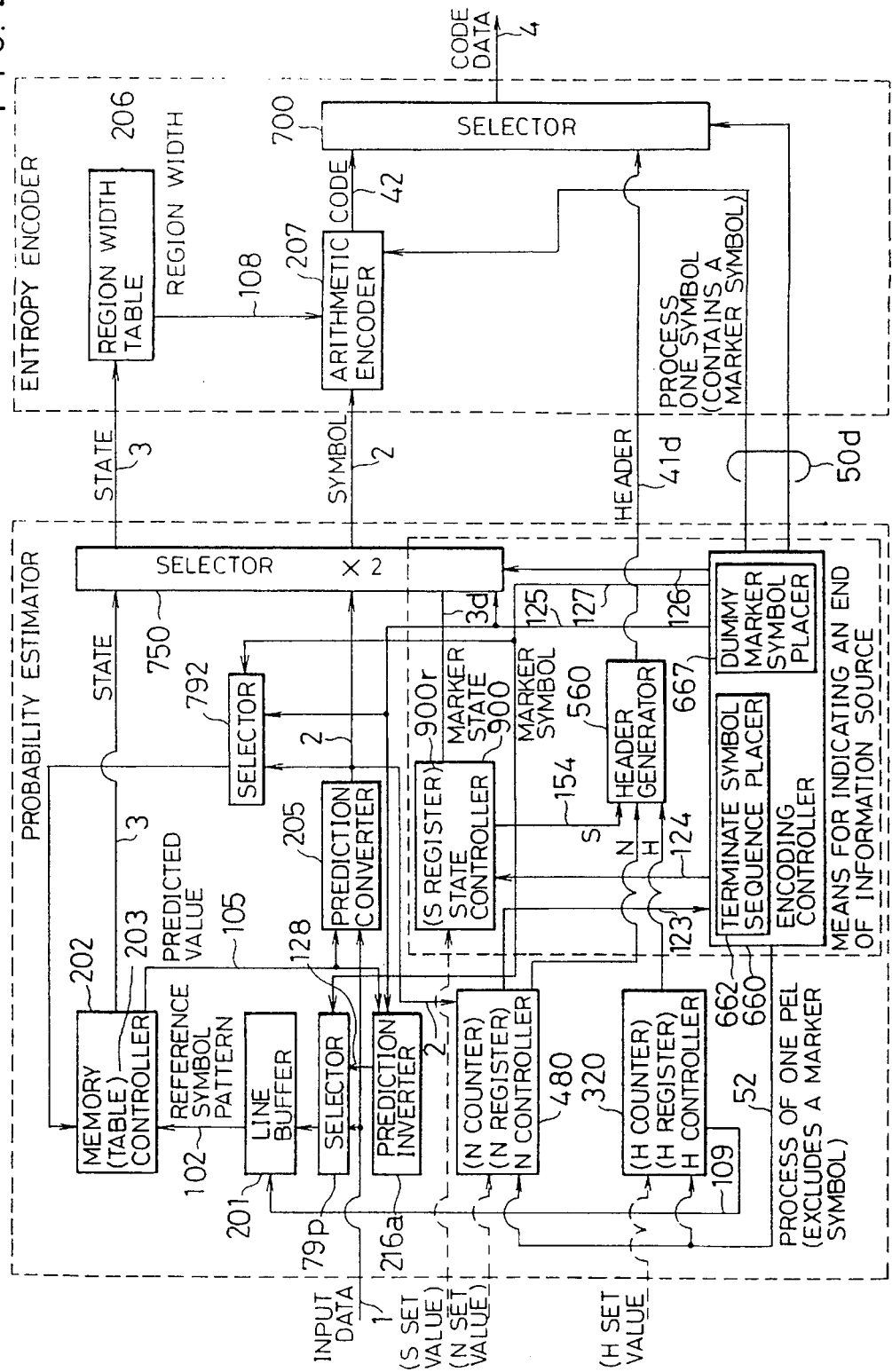
FIG. 22 shows an internal block diagram of an encoder of the third embodiment.

There is shown a block diagram of an encoder based on this embodiment in FIG. 22. In FIG. 22, a N count controller 480 makes the N counter count the consecutive number of LPSs. An encoding controller 660 inserts a dummy maker symbol in case that the LPSs occur consecutively to the number shown by the LPS pattern length (N) and places the terminate symbol sequence at the tail of the code. A state controller 900 outputs a marker state 3*d* to the marker symbol.

A prediction invertor 216*a* inputs the marker symbol 125 from the encoding controller 660 and performs a predicted inversion of a marker symbol 125 with a predicted value 105. A selector 791 selects the information source symbol 1 and a symbol 128 after the predicted inversion by a select signal 127. A selector 792 selects a predicted conversion symbol 2 and the marker symbol 125 by the select signal 127. The prediction invertor 216*a* and the selector 791 and the selector 792 are employed so that the same operation with the decoder may be performed in the encoder. That is, even in case of inserting the marker symbol, because the selector 791 and the prediction invertor 216*a* are included, the same updating process of the line buffer as in the decoder can be performed in the encoder. And, because the selector 792 is included, the same learning process of the predicted table as in the decoder can be performed in the encoder.

A dummy symbol placer 667 places the dummy maker symbol. A terminate symbol sequence placer 662 places the terminate symbol sequence at the tail of the code.

The H count controller, the N count controller and the state controller have an [r]egister, a N register, and a S register respectively. It is assumed that the number of horizontal pels (H), the LPS pattern length (N), and the marker state (S) are previously set at the H register, the N register, and the S register respectively from the outside.

A header generator 560 generates the header with the horizontal pels (H), the LPS pattern length (N), and the marker symbol state (S). The horizontal pels (H) is registered at the H register in the H count controller 320, the LPS pattern length (N) is registered at the N register in the N count controller 480, and the marker symbol state (S) is registered at the S register in the state controller 900.

The N count controller 480 receives the predicted conversion symbol 2 after the predicted conversion at the prediction convertor 205. The predicted conversion symbol has either the LPS or the MPS. The N counter counts the consecutive number of the LPS. In case that the consecutive number of the LPS occurs to the number indicated by the LPS pattern length (N), a signal 123 is issued. The encoding controller outputs the dummy marker symbol 125 by inputting the signal 123. The encoding controller outputs a signal 124 which request to output the marker state to the state controller 900.

The state controller 900 outputs the marker state 3*d* when the signal 124 is input. And, the encoding controller outputs the select signal 126 to a selector 750. The selector 750 selects the marker symbol 125 and the marker state 3*d* and outputs them. A signal 52 is output from the encoding controller for processing of one pel. In this case, the signal 52 is not output for the marker symbols. On the other, a signal 53 is output to the processing of the symbols including the marker symbols.

Figure 23:
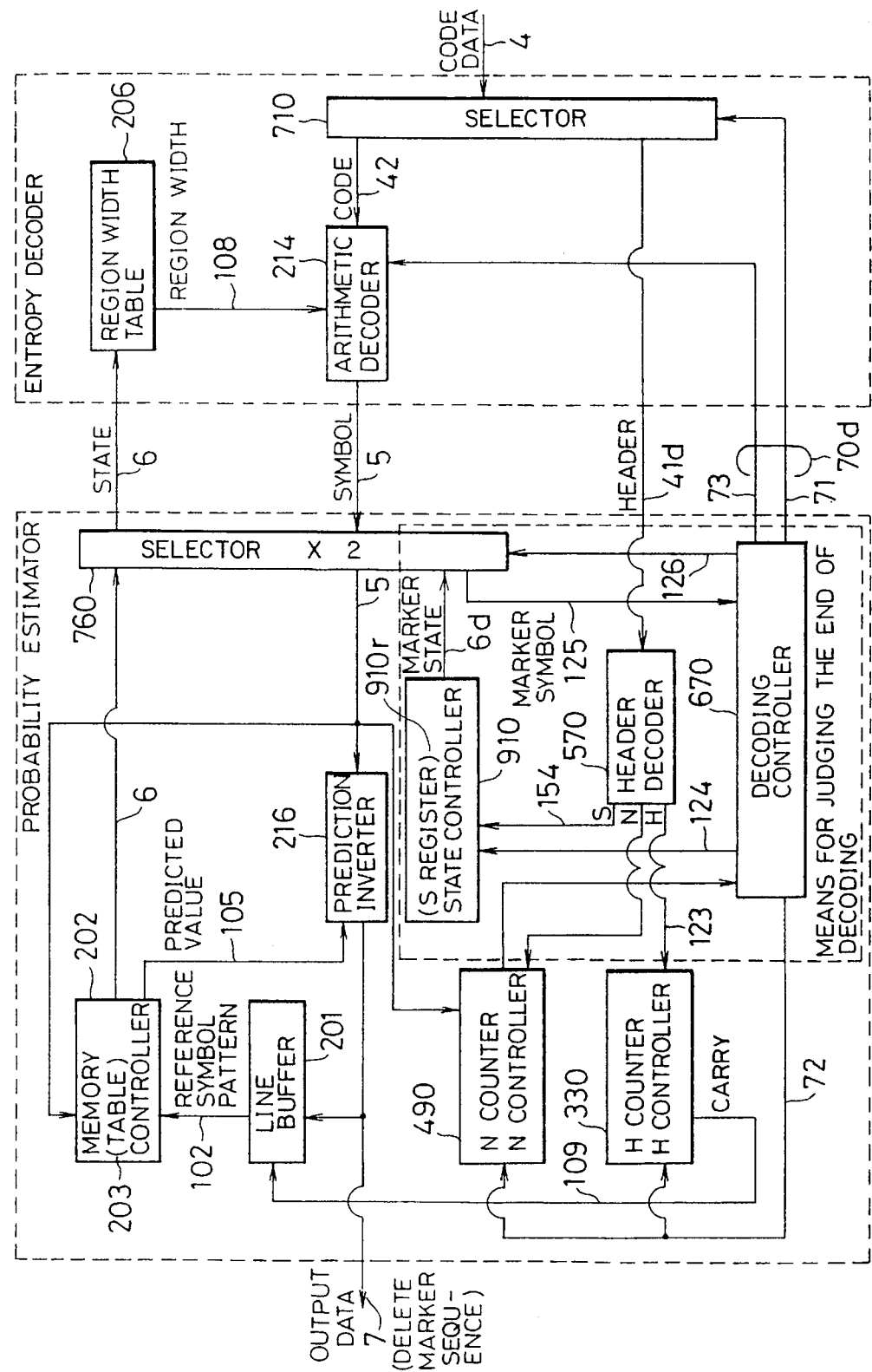
FIG. 23 shows an internal block diagram of a decoder of the third embodiment.

There is shown a block diagram of a decoder according to this embodiment In FIG. 23. In FIG. 23, a N count controller 470 controls the N counter to count the consecutive number of the LPSs. A decoding controller 670 detects the terminate symbol sequence and deletes the inserted dummy maker symbols when the LPS occurs to the number indicated by the LPS pattern length (N). The decoding controller 670 judge the end of decoding.

A header decoder 570 decodes the header and registers the horizontal pels (H), the LPS pattern length (N), and the marker state (S) at an H register in an H count controller 330, a N register in a N count controller 490 and a S register in a state controller 910 respectively.

The N count controller 490 counts the consecutive number of the LPSs. When the LPS occurs to the number indicated by the LPS pattern length (N), the signal 123 is output. When the signal 123 is input, the decoding controller 670 recognizes that the symbol which will be decoded next is the dummy marker symbol and requests the state controller 910 to output a marker state 6*d*.

The decoding controller 670 sends the marker state 6*d* through the selector 760 to the table 206 for the region width according to the select signal 126. An arithmetic decoder 214 decodes the marker symbol according to the region width given by the marker state 6*d*. The selector 760 selects the decoded marker symbol 125 according to the signal 126 and issues to the decoding controller 670. The decoding controller 670 judges the end of the decoding process by checking if the marker symbol 125 is the dummy marker symbol or the terminate symbol which shows the termination of the decoding process.

Figure 24:
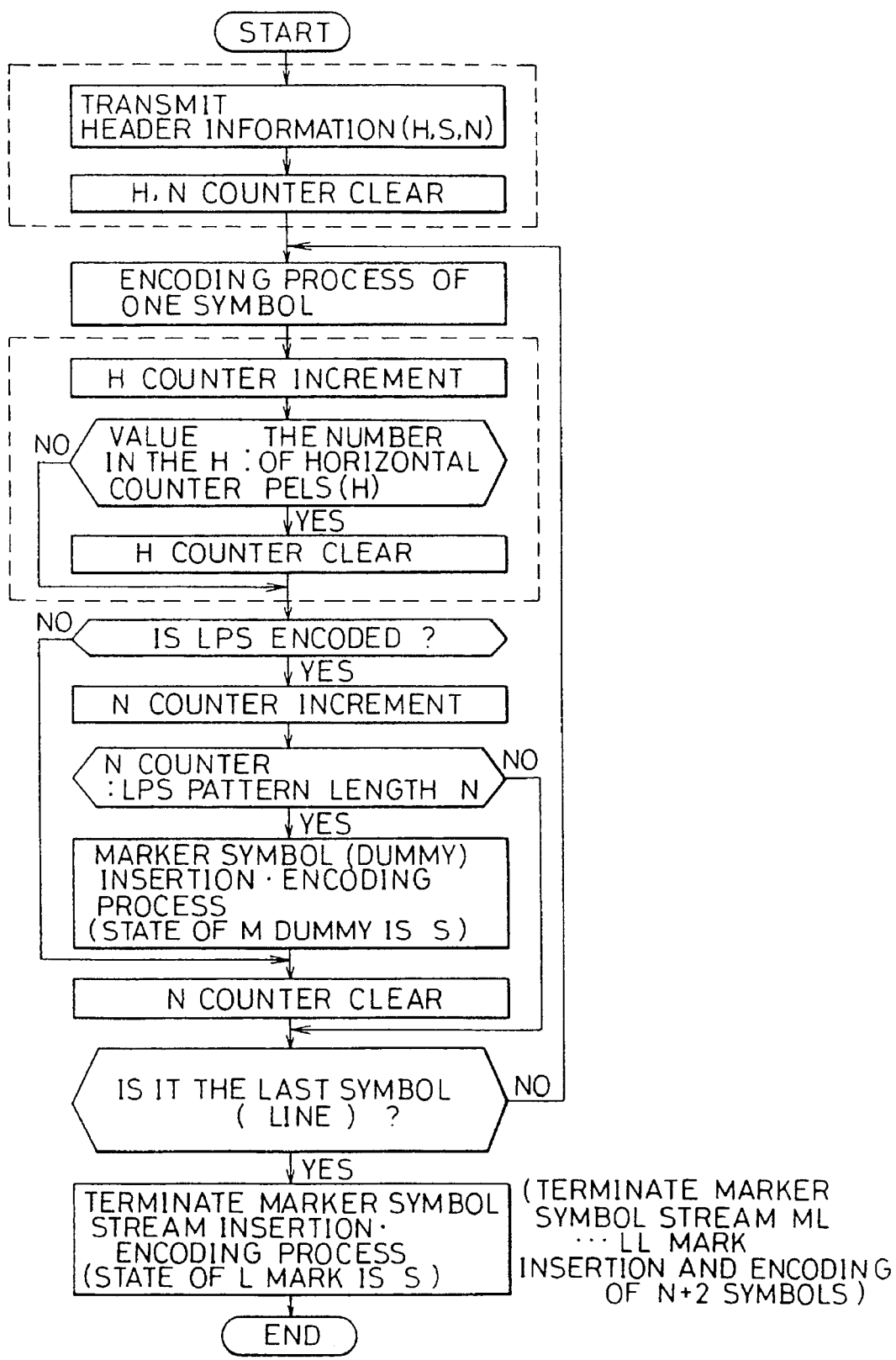
FIG. 24 shows a flow chart of an encoding site of the third embodiment.

Operation of the encoder of Embodiment 3 is shown in FIG. 24. As shown in FIG. 24, the probability estimator 11*d* transmits the header which contains the number of horizontal pels (H), the marker state (S), and the LPS pattern length (N) to the receiver site at the beginning of the encoding process. The probability estimator 11d clears the value in the H counter 21d and the N counter 27d. When the input of the encoding process is performed, the value in the H counter 21d is incremented. When the value in the H counter 21d reaches the number of horizontal pels (H), the value in the H counter 21d is cleared. When the N counter 27d outputs the LPS as the symbol 2, the value in the N counter 27d is incremented. When the value in the N counter 27d reaches the LPS pattern length (N), a dummy marker symbol is inserted and the encoding process continues, the marker state (S) transmitted through the header corresponds to the dummy marker symbol. The marker state (S) is output to the entropy encoder 12. When the encoding process of the dummy marker symbol or the MPS as the symbol 2 is performed, the value in the N counter 27d is cleared. When the input data 1 comes to an end, the terminate symbol sequence which shows the termination of the encoding process is placed and the encoding process is completed. The terminate symbol sequence contains the MPS, LPSs having LPS pattern length (N), and the marker symbol which shows the termination of the information source symbols.

Figure 25:
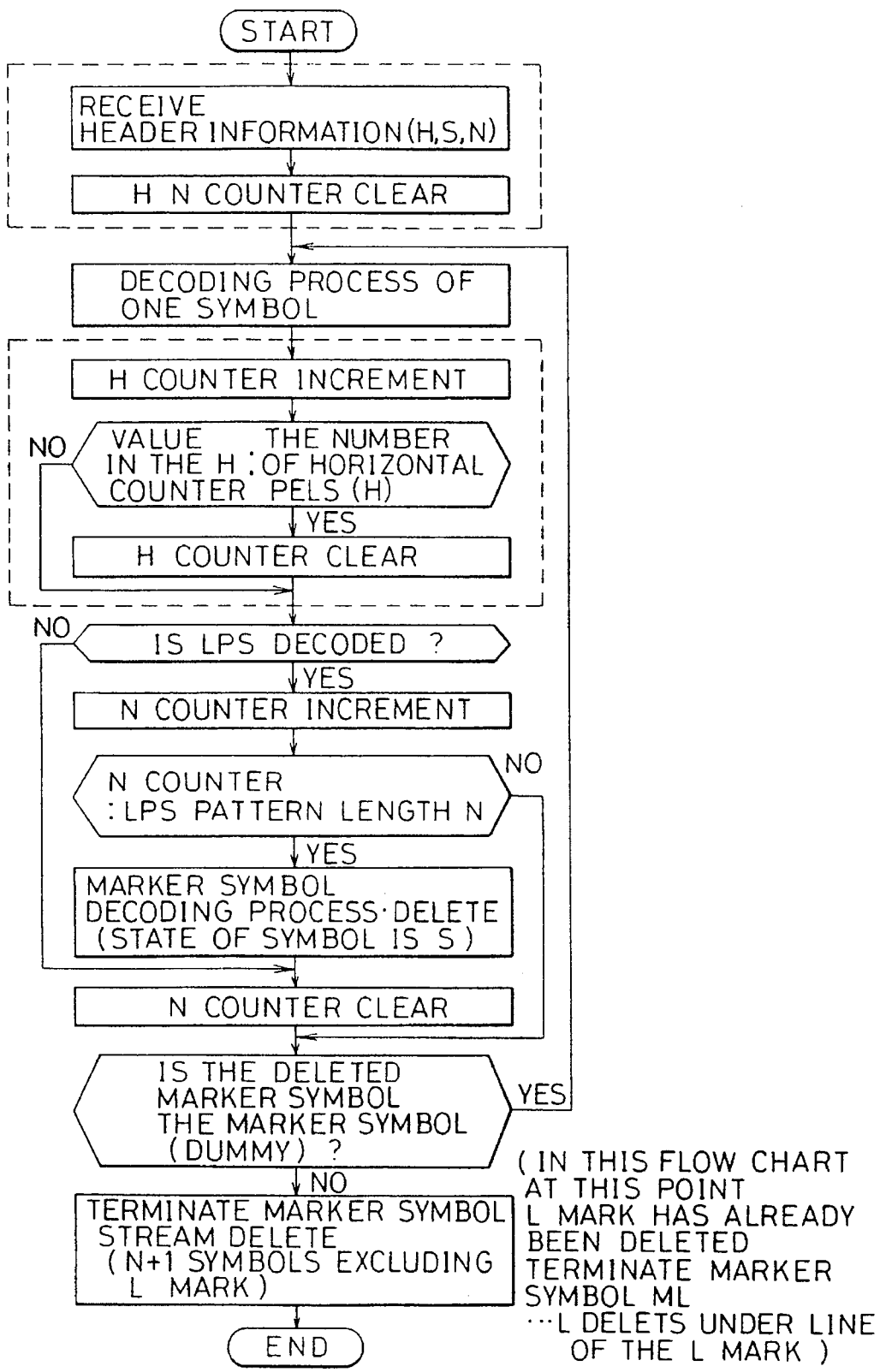
FIG. 25 shows a flow chart of a decoding site of the third embodiment.

Operation of the decoder of Embodiment 3 is shown in FIG. 25. As shown in FIG. 25, at the beginning of the decoding process, the probability estimator 14d detects the number of horizontal pels (H), the marker state (S), and the LPS pattern length (N) from the header and stores them. The probability estimator 14d clears the value in an H counter 23d and the value in a N counter 28d. And, when the decoding process of the output data 7 is performed, the value in the H counter 23d is incremented.

When the value in the H counter 23d reaches the number of horizontal pels (H), the value in the H counter 23d is cleared. When the LPS is input as the symbol 5, the value in the N counter 28d is incremented. When the value reaches the LPS pattern length (N), the symbol 5 which will be decoded next is regarded as the marker symbol. When the MPS is encoded as the symbol 2 or the dummy marker symbol is encoded, the value in the N counter 27d is cleared. The state 6 for the maker symbol is output from the probability estimator 14d to the entropy decoder 13. Such state 6 is regarded as the marker state (S). If the decoded symbol, that is, the marker symbol is a dummy maker symbol, the marker symbol is deleted and the decoding process continues. If the marker symbol indicates the termination of the decoding process, the terminate symbol sequence is detected and the decoding process is completed. In this case, the symbols contained in the terminate symbol sequence shouldn't be output as the output data 7.

In this embodiment, it is assumed that the method for selecting the reference symbols, the method for predicting the predicted pel as an object of encoding, and the method for estimating the occurrence probability ratio of the predicted pels are commonly set previously both at the encoding site and at the decoding site. If the number of horizontal pels (H), the marker state (S), the LPS pattern length (N) are a fixed value, transmission of the number of horizontal pels (H), the marker state (S), the LPS pattern length (N) isn't needed.

As to the marker state (S), it is possible to give a specific state value. It is also possible to transmit a method for determining the marker state (S) through the header. For example, an indication of a method to use the state of the previous symbol as the marker state (S) can be transmitted through the header.

Further, the marker symbol doesn't always need to be one symbol. The marker symbol can be given by plural symbols. For example, the following cases can be used. In case that the LPS occurs consecutively more than the predetermined number of N in the encoder, the predetermined K number of symbols are inserted from the next symbol of the N th LPS. And, one or plural symbol streams among the $2^K$ ways of symbol streams combined with K number of the MPSs and the LPSs are regarded as the maker symbol which indicates the termination of the information source symbols. On the other hand, in case that the consecutive occurrence number of the LPS reaches the predetermined number N in the decoder, K number of symbols from the next symbol of the N th LPS are decoded as the maker symbol stream inserted for indicating the termination of the information source symbols. And, one or plural symbol streams predetermined in the encoder among the $2^K$ ways of symbol streams combined with the K number of the MPSs and the LPSs, can be judged as the symbol stream which indicates the termination of the information source symbols.

In this embodiment, the number of horizontal pels (H) are transmitted through the header to identify each line and extract the reference symbol patterns between lines. For example, it is necessary for the prediction conversion and the probability ratio estimation for encoding and decoding to refer the lines. The number of horizontal pels (H) is needed to recognize the line.

Embodiment 4

Figure 26:
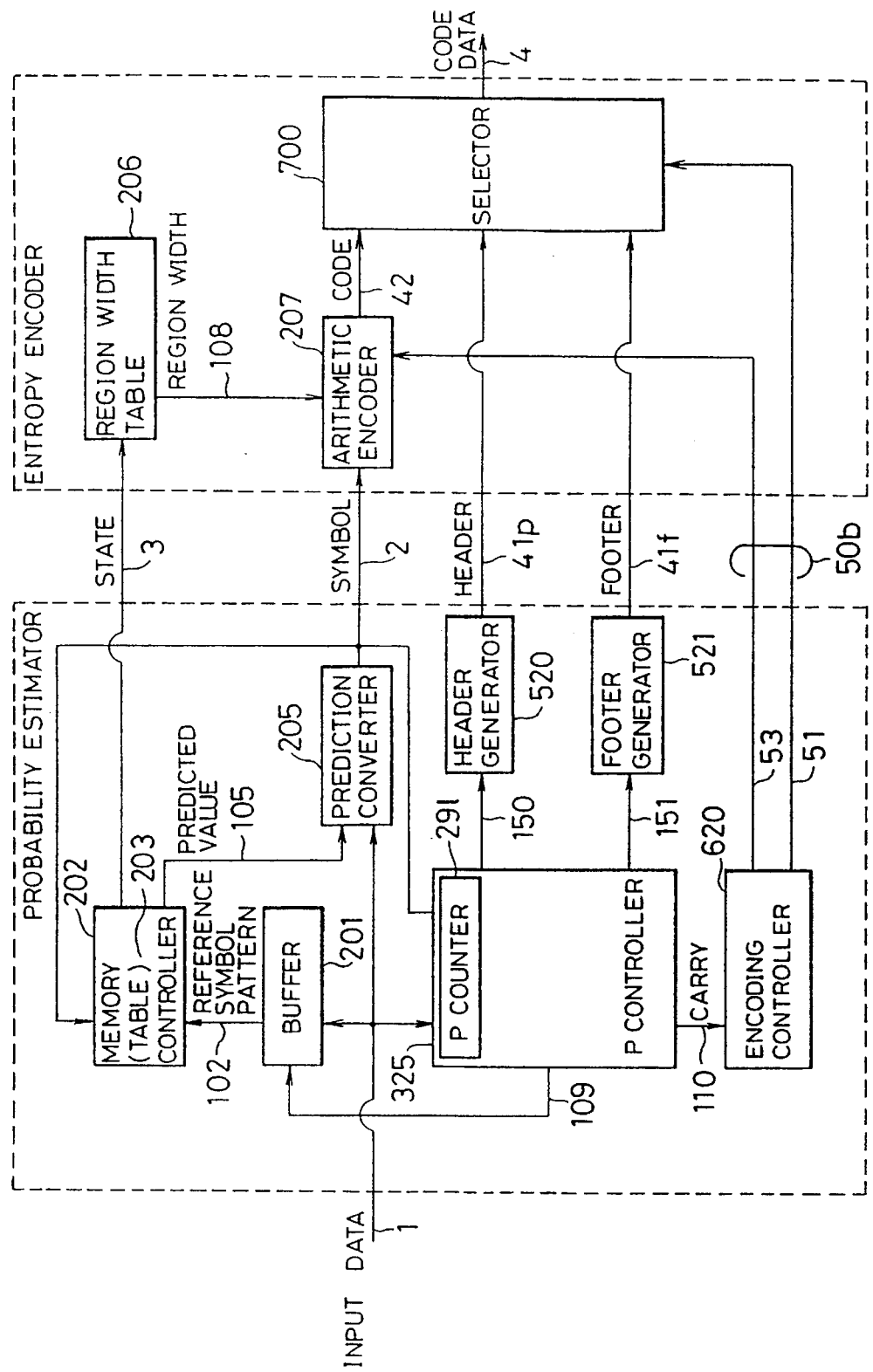
FIG. 26 shows an internal block diagram of an embodiment of an encoder according to the present invention.

There is shown a block diagram of an encoder according to a fourth embodiment in FIG. 26. In FIG. 26, a P counter 29e counts the information source symbols or the predicted conversion symbols. A P count controller 325 transmits the number of information source symbols or the predicted conversion symbols counted by the P counter 29e as the number of information source units 151.

Figure 27:
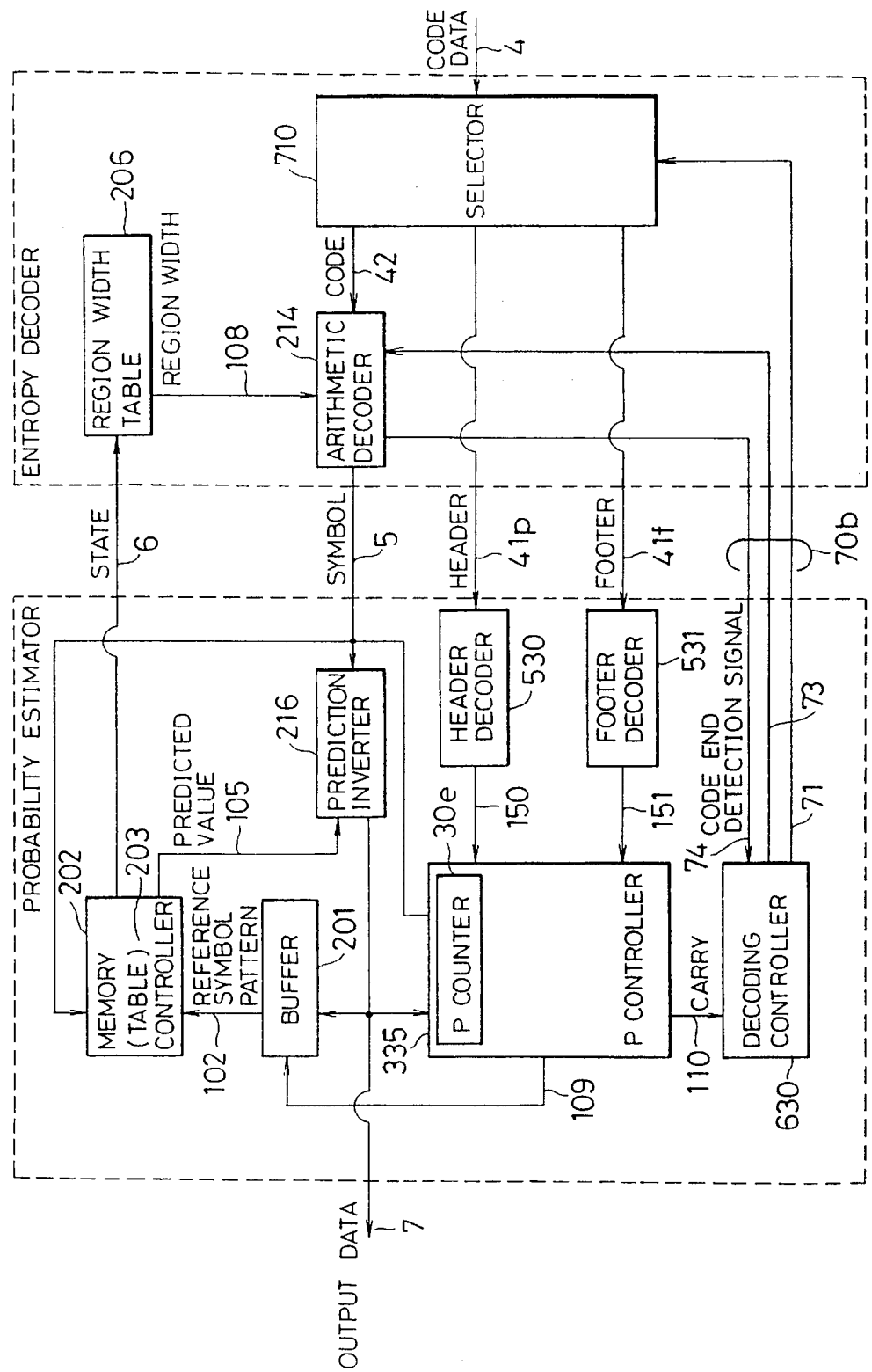
FIG. 27 shows an internal block diagram of an embodiment of a decoder according to the present invention.

There is shown a block diagram of a decoder according to this embodiment in FIG. 27. In FIG. 27, a P counter 30e counts the number of the decoded information source symbols or the predicted conversion symbols. A P count controller 335 compares the number of the Information source symbols or the predicted conversion symbols counted by the P counter 30e and the number of information source units 151 received from the transmitter site. A decoding controller 630 judges the end of the decoding process.

The P count controller 325 in the encoder transmits the total number of the information source symbols or the predicted conversion symbols as the number of the information source units to the footer generator 521 at the end of the encoding process. The selector 700 outputs the number of the information source symbols placed at the tail of the code data to the decoder.

In the decoder, the decoding process for the predicted conversion symbol 5 is carried out by the arithmetic decoder 214. The prediction invertor 216 inputs the decoded predicted conversion symbol 5 and performs the inversion according to the predicted value. The selector 710 transmits the number of information source units placed at the tall of the code data to the footer decoder 531. The P count controller 335 judges whether the number of the information source units received from the encoder and the number of the predicted conversion symbols counted by the P counter 30e match. If the number of the information source units matches the number of predicted conversion symbols, the carry signal 110 is issued. The decoding controller 630 judges the end of the decoding process when the carry signal 110 is issued. Then, the arithmetic decoder 214 completes the encoding process.

In this embodiment, the end of the decoding process can be judged, by counting the number of the information source symbols or the predicted conversion symbols. One symbol is set as the information source unit. In Embodiment 1, the number of horizontal pels (H) contained in one line was set as the information symbol unit, but as is mentioned above, one symbol can be set as the information source unit.

As described in Embodiment 4, the method which judges the end of decoding by counting the number of the predicted conversion symbols can be adopted not only in Embodiment 1 but also in Embodiment 2. In case that the P counter is used in Embodiment 2, for example, 256 symbols are set as one information source unit. The EOS symbol is inserted on the boundary of every 256 symbols. In a decoder, when the decoding process is performed for the 256 symbols, the next decoding symbol is judged as the EOS symbol and the value of the EOS symbol is checked. As a result, the end of the decoding can be detected.

Embodiment 5 in the fifth embodiment, the number of insertion times of the EOS symbol can be estimated in advance. In this embodiment, when it is possible to estimate the probability ratio of inserting EOS symbol, the optional value of the state is set and used.

The number of insertion times of the EOS symbol can be estimated when the number of lines of the page is previously known or the number of lines of the image displayed in a display apparatus is previously known. Thus, if the number of lines (V) of the image is determined, the number of insertion times m of the EOS symbol which indicates the continuation is: $m=V-1$.

The number of insertion times of the EOS symbol which indicates the termination is one. Therefore, a state controller 801, 811 calculates the insertion probability ratio p of the EOS symbol which indicates the continuation as $p=m/(m+1)$. The state controller 801, 811 calculates the insertion probability ratio q of the EOS symbol which indicates the termination as $q=1-p=1/(m+1)$. Then, the representative value for the calculated insertion probability ratio p is used as an EOS state to encode and decode EOS symbol. The code length can be minimized by insertion of the EOS symbols with optional value of the state.

Figure 28:
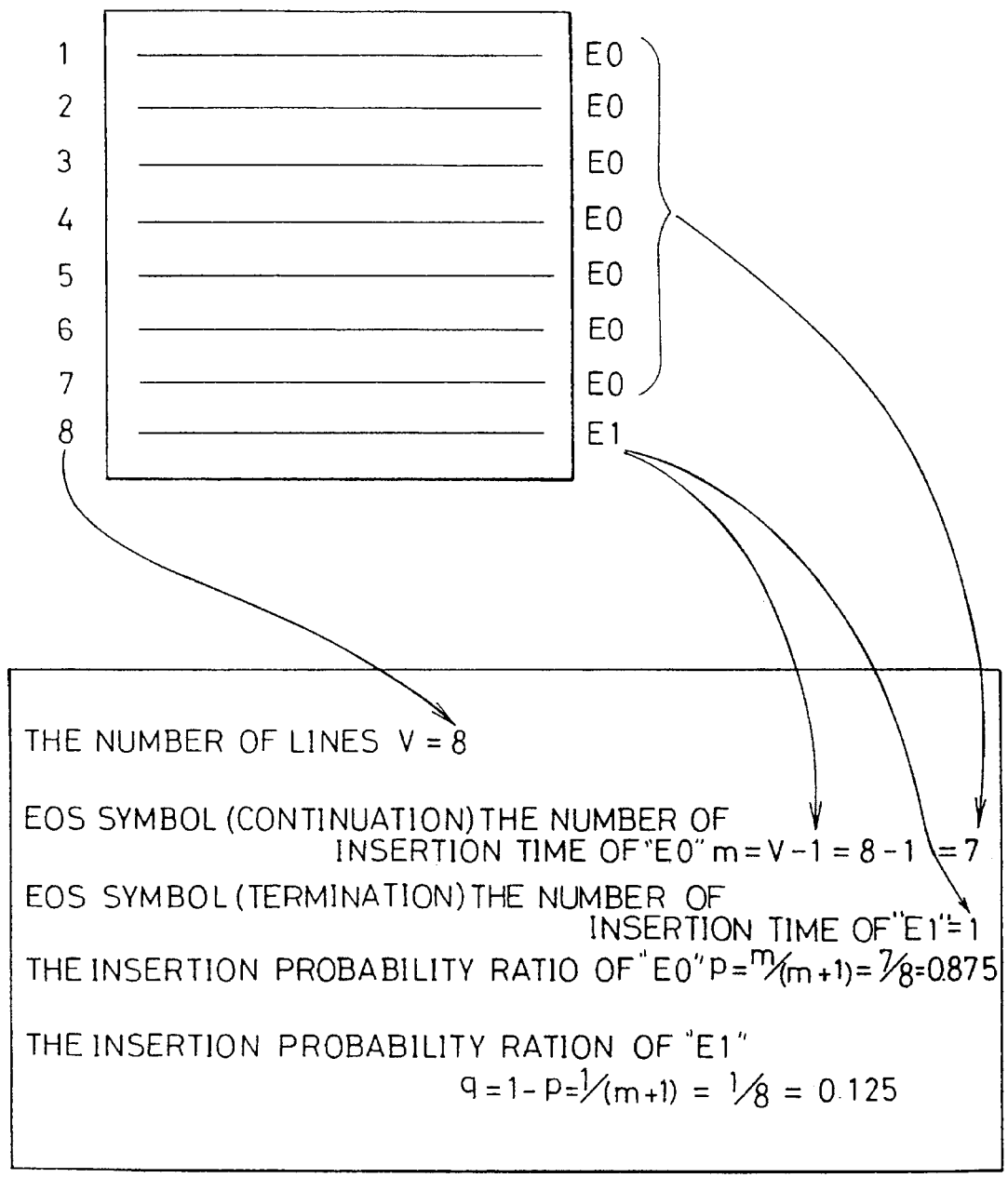
FIG. 28 shows an example of changing a state according to the present invention.

As shown in FIG. 28, the number of lines (V) of the input image is eight. Accordingly, the number of insertion times m of the EOS symbol which indicates the continuation is seven. And, the number of insertion times of the EOS symbol which shows the termination is one. Consequently, the insertion probability ratio p of the EOS symbol which indicates the continuation is $7/8=0.875$. The insertion probability ratio q of the EOS symbol which indicates the termination is $1/8=0.125$. The value of the state is selected to minimize the code length for the EOS symbol insertion wherein each of EOS symbols which indicate the continuation and the termination occurs based on the insertion probability ratio p and q respectively. In processing an image of different number of lines (V), the insertion probability ratio p and q are calculated as described before. Based on a relation between the probability ratio p and q, the value of the state which minimizes the code length for the EOS symbol insertion is determined. Thus, the determined value of the state is transmitted through the header. As the result, the determined value of the state is set at the S register 800r in the state controller 800 and at the S register 810r in the state controller 810.

Embodiment 6

In this embodiment, an explanation is made for cases that the number of insertion times of the EOS symbol in the second embodiment cannot be estimated, that the number of insertion times of the dummy marker symbol in the third embodiment cannot be estimated, and that the value of the state is changed. The change of the state described hereinafter in this embodiment is applicable to both in the EOS system in the second embodiment and the marker system in the third embodiment, wherein the insertion times cannot be known in advance. Further, in this embodiment, there is also shown a case that the value of the LPS pattern length (N) in the marker system is changed.

Figure 29:
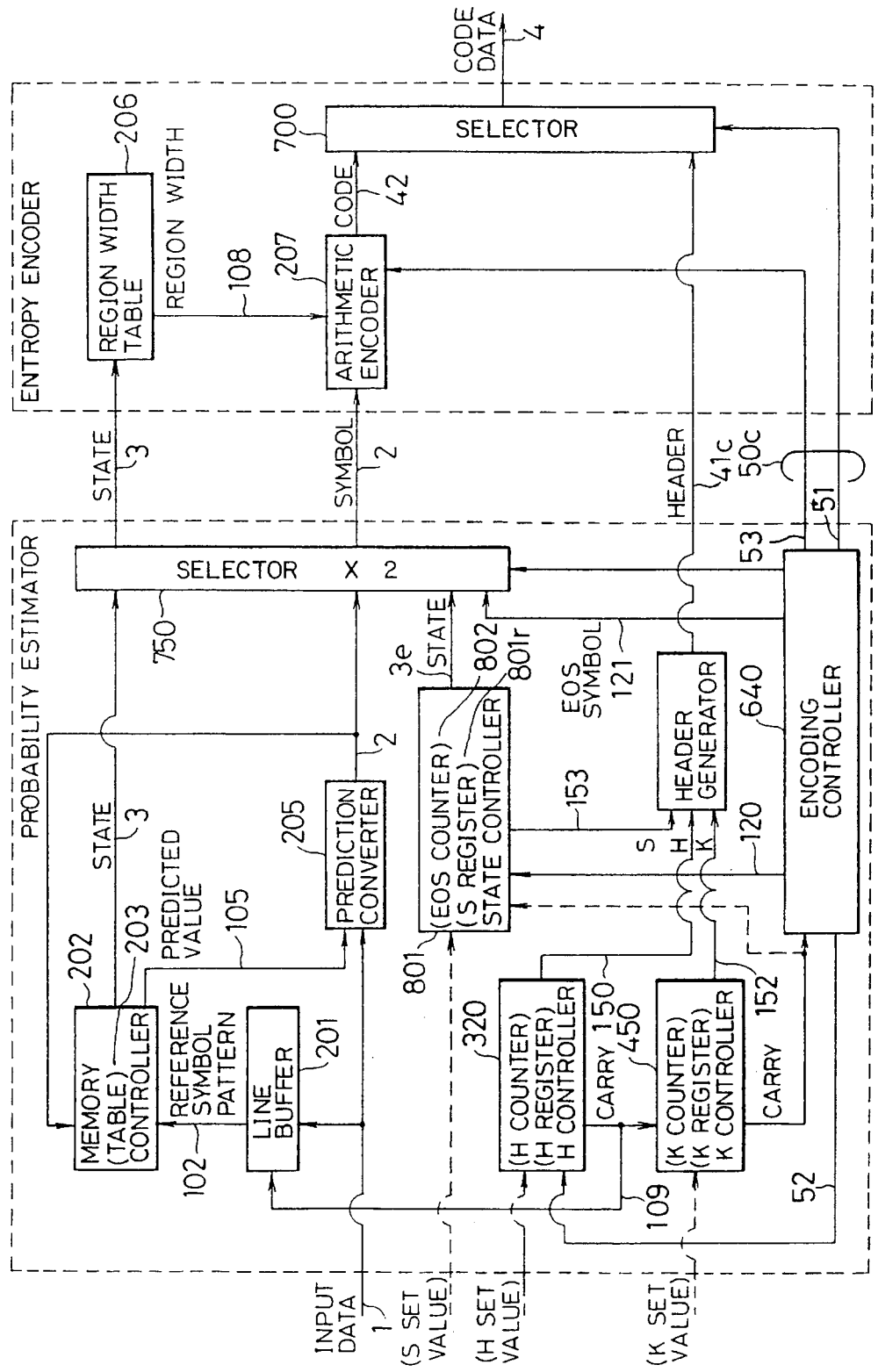
FIG. 29 shows an internal block diagram of an encoder for changing a state according to the present invention.

FIG. 29 illustrates a block diagram of an encoder based on the EOS system according to this embodiment. In an encoder according to this embodiment, a state controller 801 has an EOS counter 802 which counts the number of insertion times of the EOS symbol. The state controller 801 changes the value of the state 3e output for the EOS symbol according to the value of the EOS counter.

Figure 30:
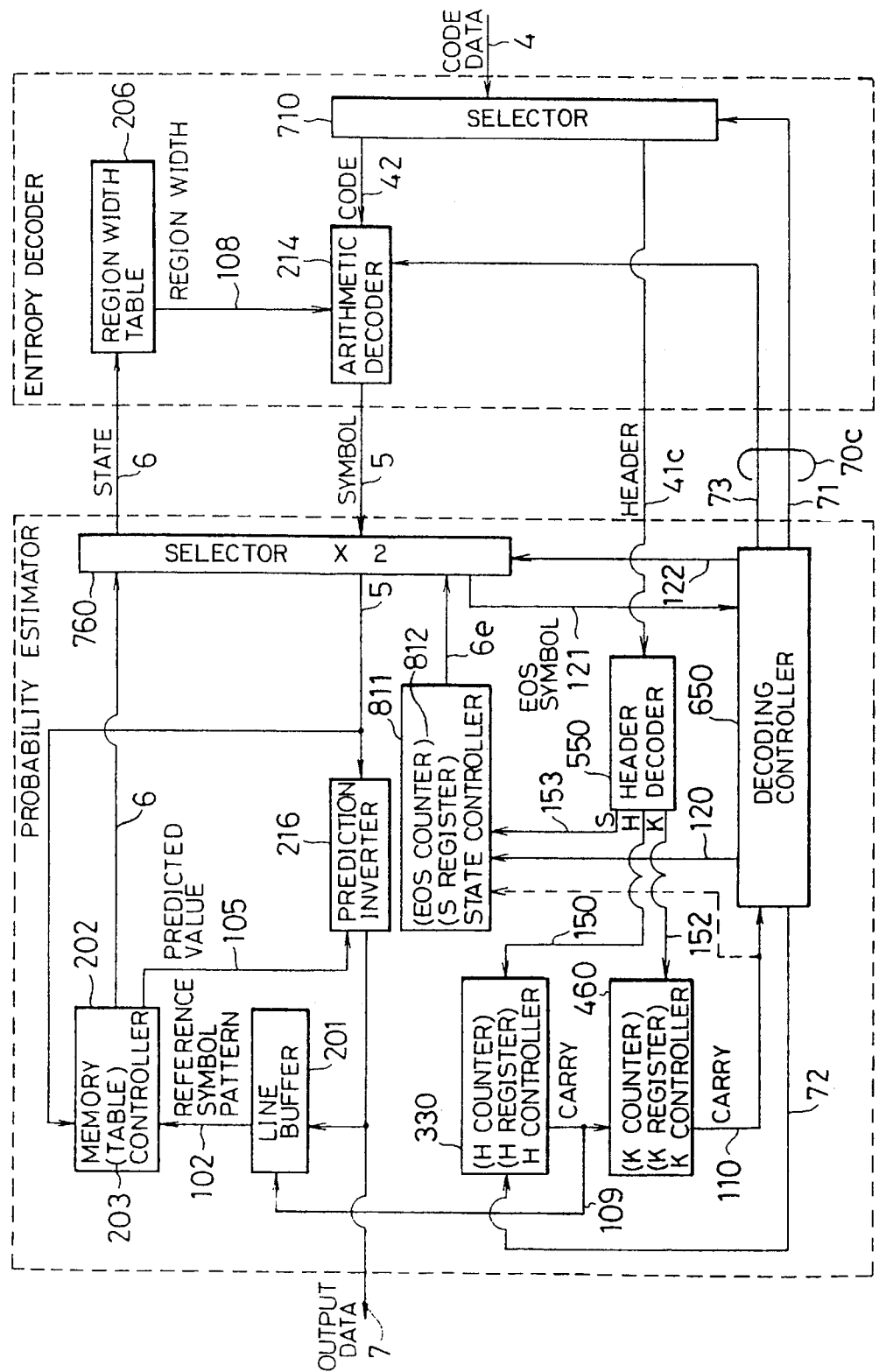
FIG. 30 shows an internal block diagram of a decoder for changing a state according to the present invention.

FIG. 30 Illustrates a block diagram of a decoder based on the EOS system according to this embodiment. The state controller 811 has the EOS counter 812. The EOS counter 812 counts the number of EOS symbols. The state controller 811 changes the value of the state 6e for the EOS symbol according to the value of the EOS counter 812.

Figure 31:
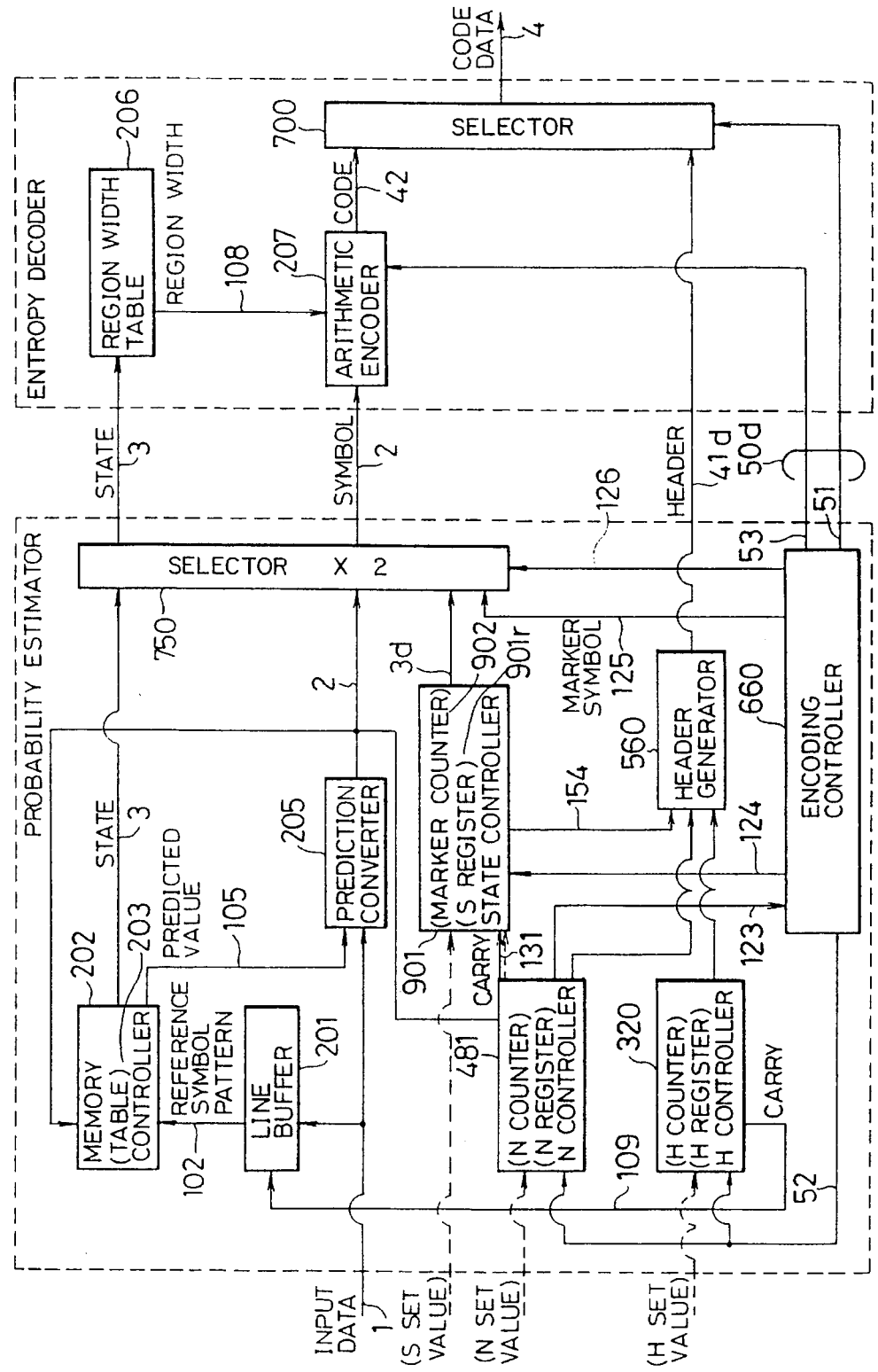
FIG. 31 shows an internal block diagram of an encoder for changing a state according to the present invention.

FIG. 31 illustrates a block diagram of an encoder based on the marker system according to this embodiment. A state controller 901 has a marker counter 902 which counts the number of marker symbols. In a state controller 901, the value of the state 3d for the marker symbol 125 is changed according to the value in the marker counter 902. An N count controller 491 counts a continuous number or LPSs and judges how the LPSs tend to continue and changes the value of the LPS pattern length (N).

Figure 32:
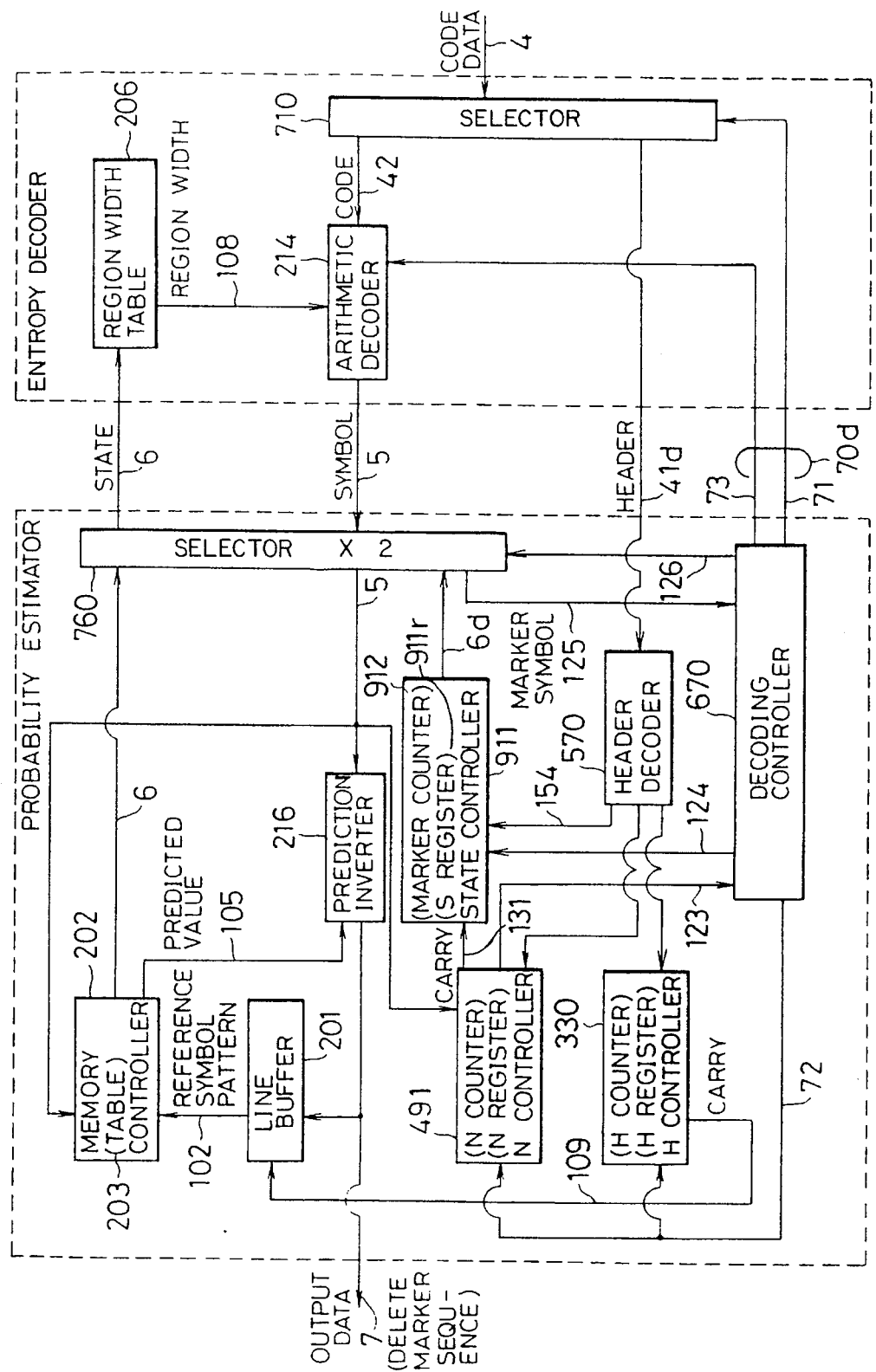
FIG. 32 shows an internal block diagram of a decoder for changing a state according to the present invention.
Figure 38:
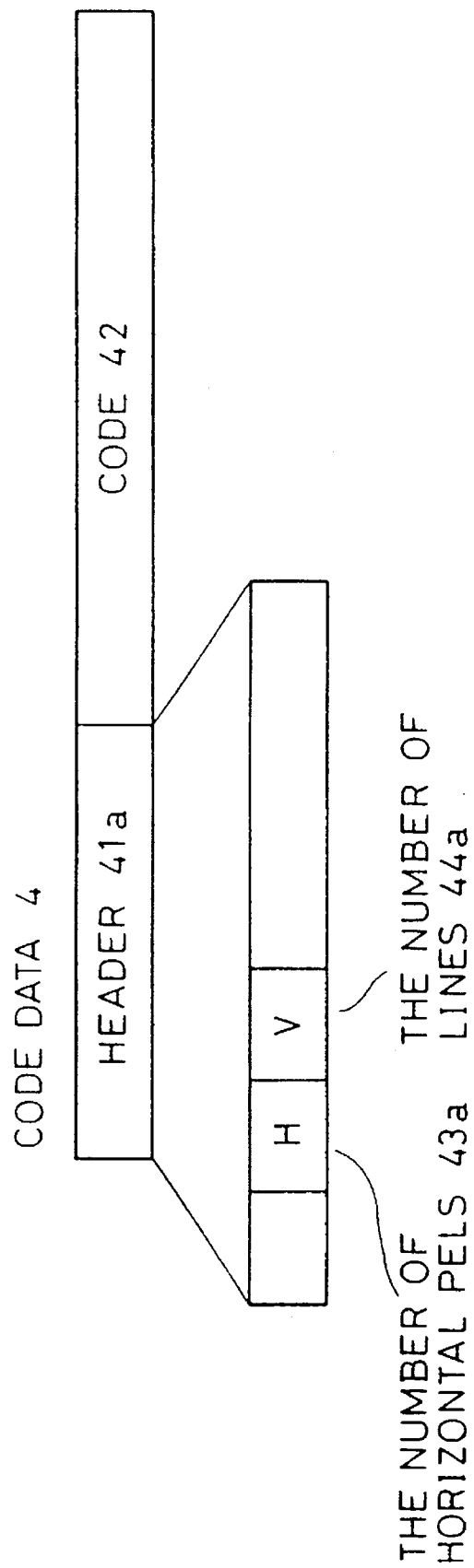
FIG. 38 shows a code data format according to the related art.
Figure 39:
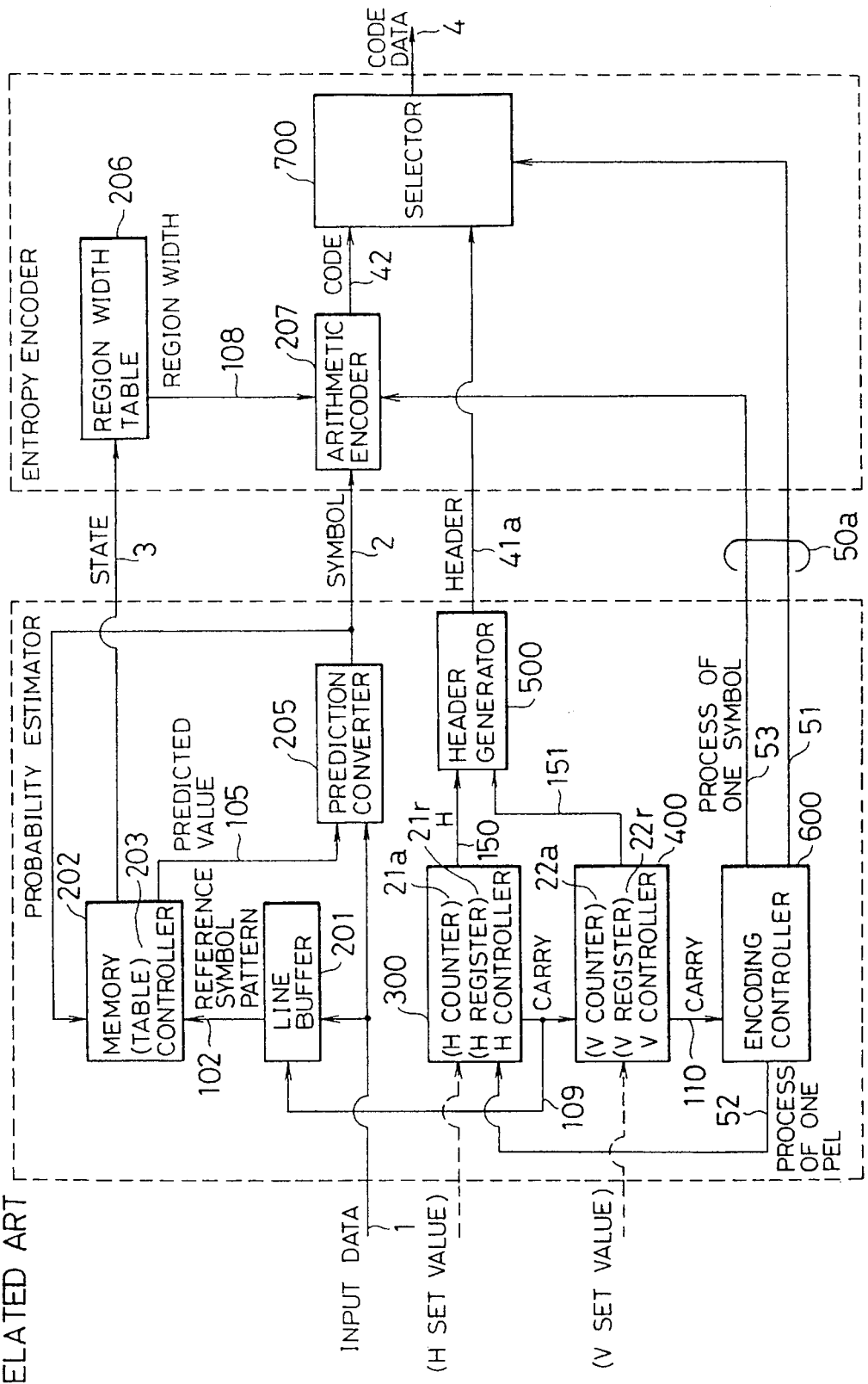
FIG. 39 shows an internal block diagram of an encoder of a conventional system.
Figure 40:
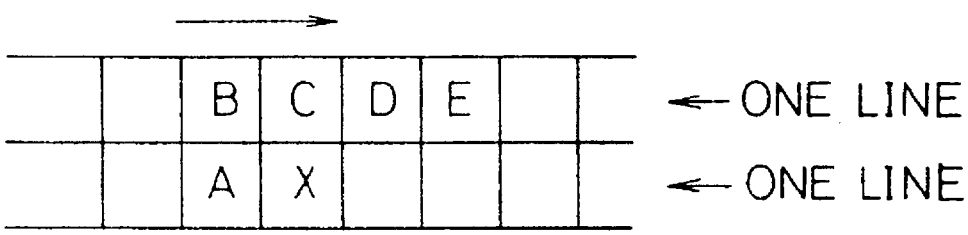
FIG. 40 shows an example of reference symbols.
Figure 43:
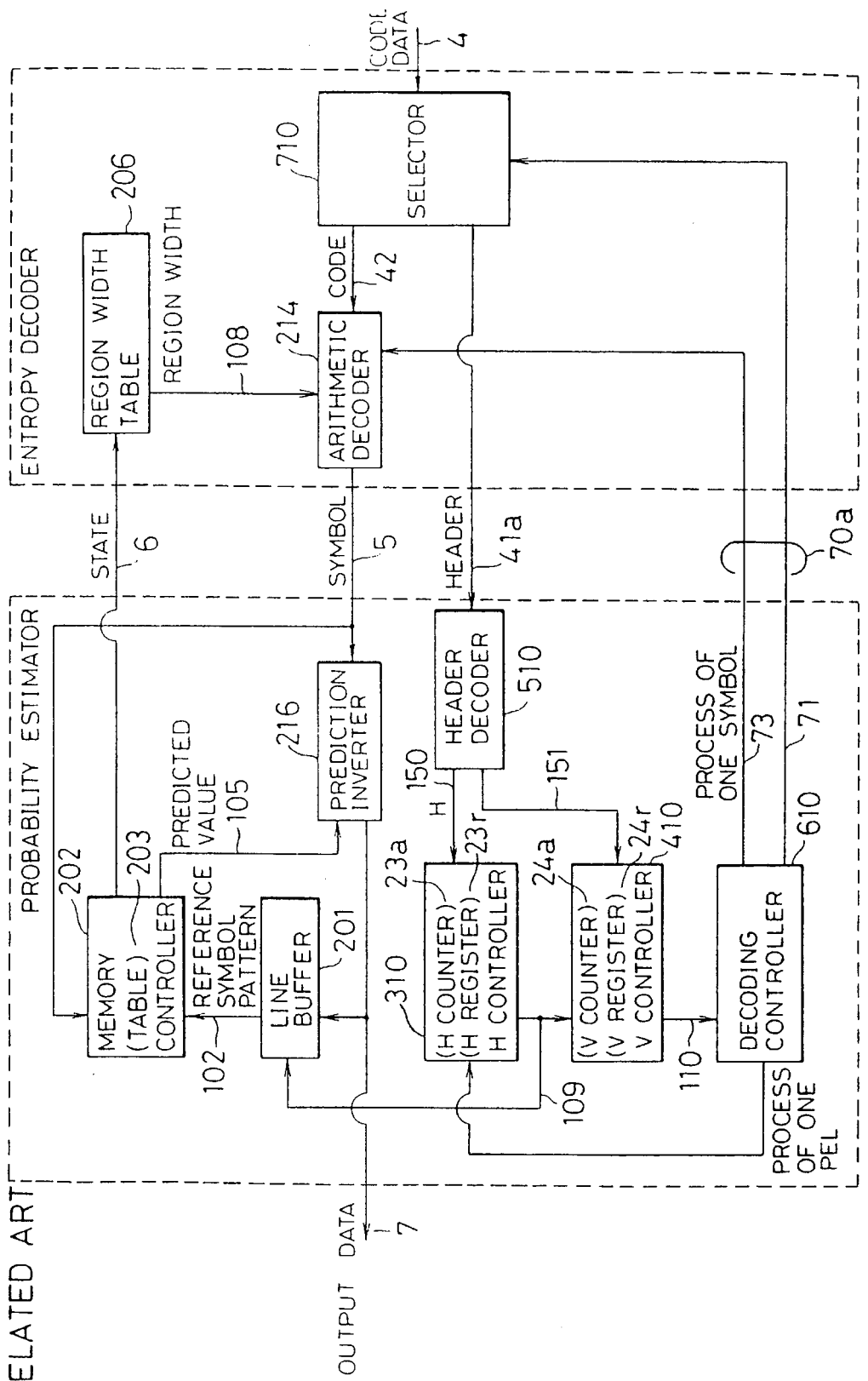
FIG. 43 shows an internal block diagram of a decoder according to a conventional system.
Figure 44:
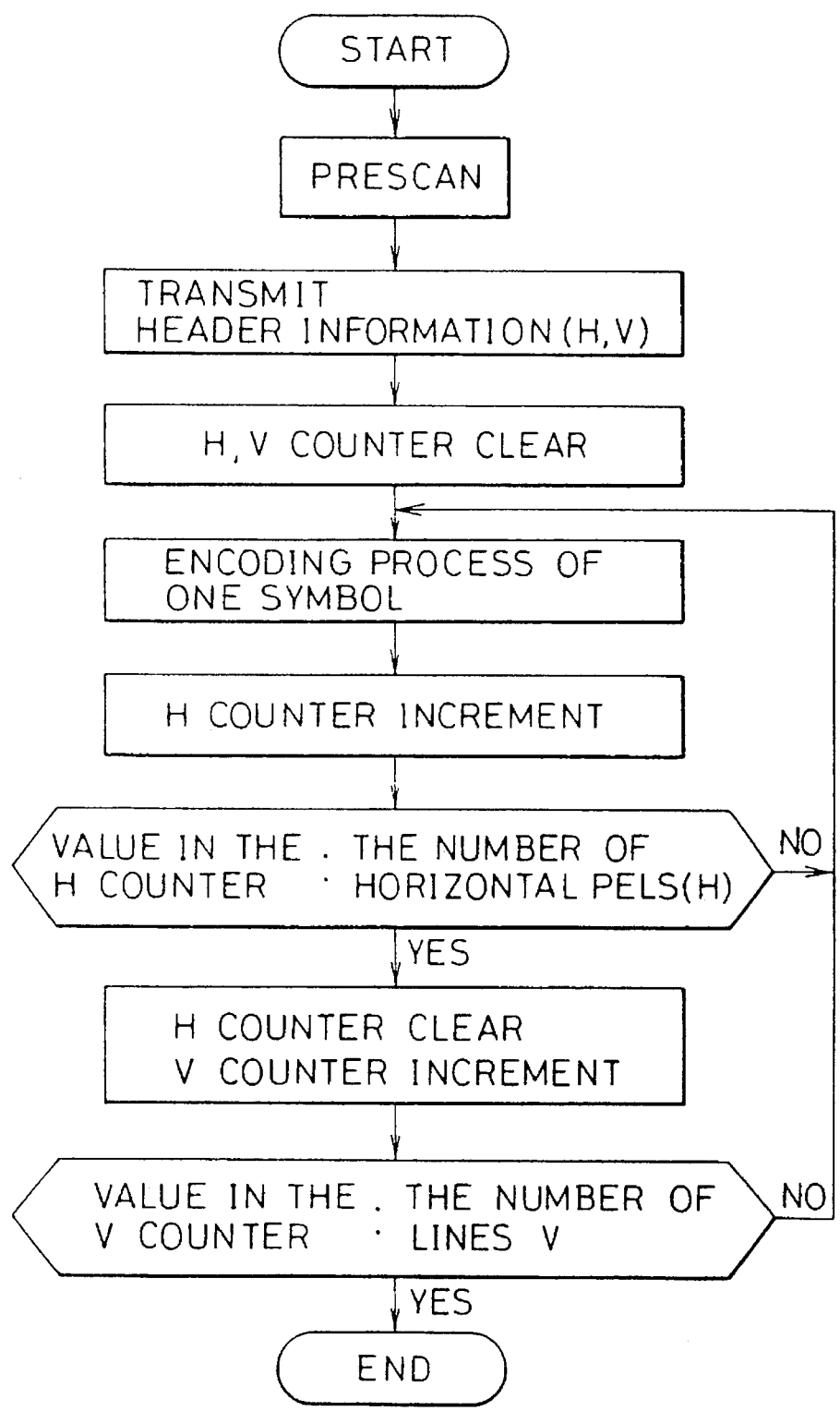
FIG. 44 shows a flow chart at an encoding site of the conventional system.
Figure 45:
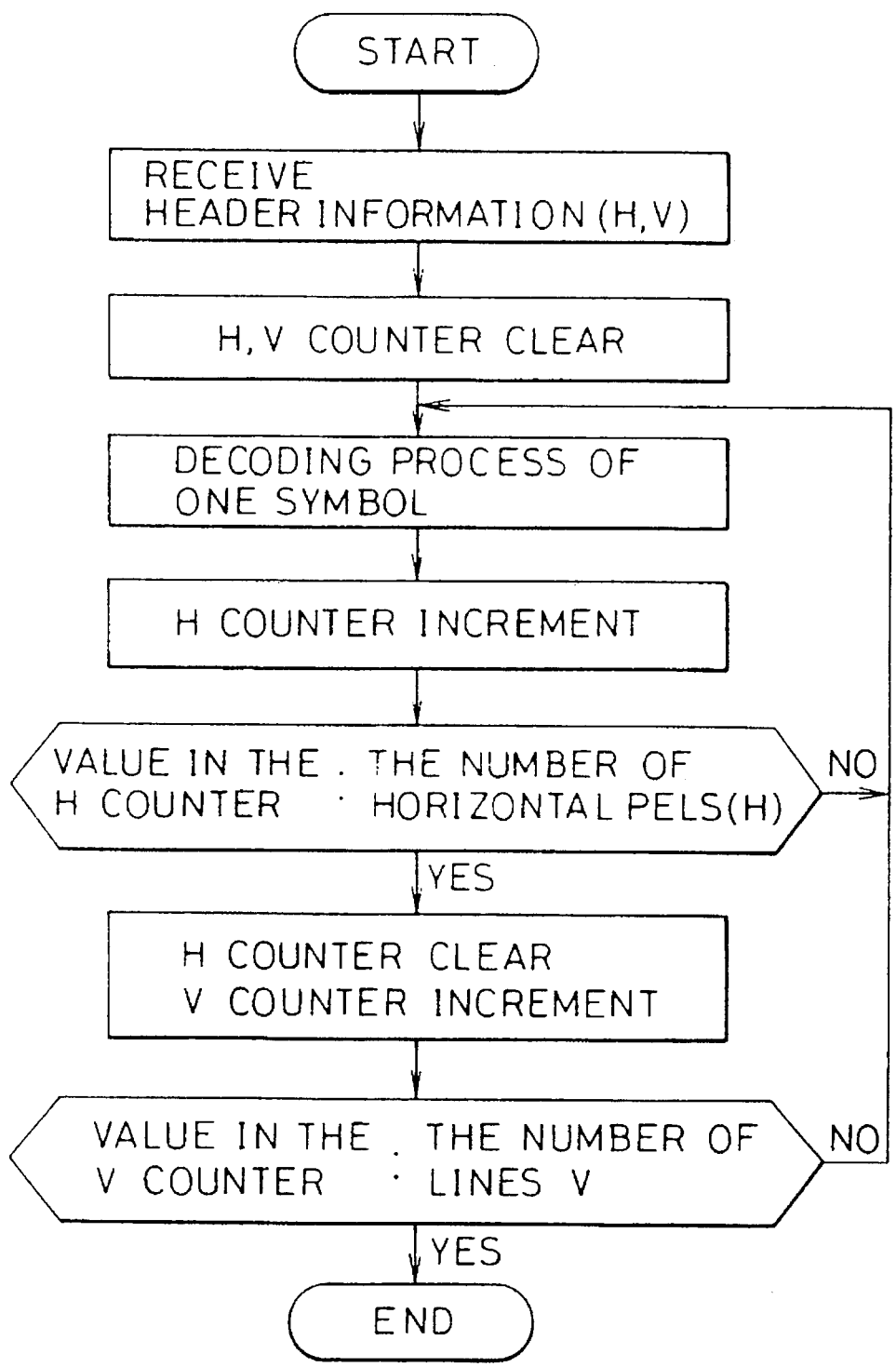
FIG. 45 shows a flow chart at a decoding site of the conventional system.

FIG. 32 illustrates a block diagram of a decoder based on the marker system according to this embodiment. A state controller 911 has a marker counter 912 which counts the number of marker symbols. In the state controller 911, according to the value in the marker counter 912, the value of a state 6d for the marker symbol 125 is changed. Further, an N count controller 491 counts a continuous number of LPSs and judges how the LPSs tend to continue and changes the value of the LPS pattern length (N).

The operation of the state controller in the EOS system shown in FIGS. 29 and 30 is equal to that of the state controller in the marker system shown in FIGS. 31 and 32. Therefore, the operation of the state controller in the marker system will be described hereinafter.

In FIG. 33(a), there is shown a case that the value of the state is changed by the number of insertion times of the marker symbol. In FIG. 33(a), when the number of insertion times of the symbol indicates one to three, the state S1 is used. When the number of insertion times of the symbol indicates four to six, the state S2 is used. As the state S goes from the S1 to the S2 and from the S2 to S3, the value of the state becomes greater. That is, as the number of insertion times of the dummy marker symbol is incremented, the value of the state S becomes greater and the code length for encoding the marker symbol is shortened.

Thus, the code length can be reduced by updating the value of the state for the inserted marker symbol based on the insertion history.

The changing the value of the state, as shown in FIG. 33(a), can be judged from the total number of insertion times of the marker symbol, or from a counting of the predefined number of insertion times of the marker symbol for each value of the state.

In this embodiment, the operation of the state controller in the marker system is described. However, as described before, it is also possible for the EOS system, that the value of state can be changed based on the number of insertion times of the EOS symbol.

Next, there is shown a case that the value of the LPS pattern length (N) is changed. If the LPS pattern length (N) becomes larger, the number of insertion times m of the dummy marker symbol is decremented while the terminate symbol sequence becomes longer. As a result, the code length increases by encoding process of the LPS in which encoding output is surely more than one bit. Therefore, if the value of the LPS pattern length (N) becomes unnecessarily larger or smaller, the code length increases. Because there are supposed to be some places that LPS tends to or doesn't tend to continue in the encoded symbol stream, it is desirable to set the value of the LPS pattern length (N) larger when the LPS tends continue and to set the value of the LPS pattern length (N) smaller when the LPS dose not tend to continue. As a result, the tendency of the LPS continuation can be judged according to the following methods.

Judgement Example 1.

In case that marker symbol is inserted in the fixed length of the stream (for example in the stream of $2^K$ number of symbols), the value of the LPS pattern length (N) is incremented. On the other hand, in case that marker symbol is not inserted in the fixed length of the stream, the value of the LPS pattern length (N) is decremented (N>0).

There is shown a concrete example of the judgement example 1 in FIGS. 33(b), (c). FIG. 33(b) illustrates a case that the value of the LPS pattern length (N) is decremented when the marker symbol is not inserted in the stream of $2^3$ (8) number of symbols. By reducing the value of the LPS pattern length (N), the number of insertion times of the marker symbol tends to be incremented but the length of the terminate symbol sequence can be reduced. Further, FIG. 33(c) illustrates a case that the value of the LPS pattern length (N) is incremented by the marker symbol insertion process in the stream of $2^3$ (8) symbols. By incrementing the value of the LPS pattern length (N), the number of insertion times of the marker symbol is decremented while the terminate symbol sequence becomes longer.

The number of insertion times of the marker symbol occurring in an interval which gives a chance to increment the value of the LPS pattern length (N) need not be one. By setting the number of insertion times as the plural number of times (it is assumed to be X), for example, two or three, the value of the LPS pattern length (N) is settled not to be changed from the first insertion up to the (X−1)th insertion. As the result, the value of the LPS pattern length (N) can be kept from changing frequently.

Judgement Example 2.

In case the insertion process of marker symbol consecutively occurs, the value of the LPS pattern length (N) is incremented.

In FIG. 33(d), when the LPS pattern length (N)=2, the run of the 2×N (4) of the continuous LPSs occurs and the marker symbol is inserted consecutively twice. Because of the consecutive insertion of the marker symbol, the LPS pattern length (N) is incremented. On the other hand, in case that the run length of the LPS is decremented, the value of the LPS pattern length (N) is decremented. The value of the LPS pattern length (N) is decremented by observing the tendency of the run length of the LPS. In FIG. 33(e), the LPS pattern length (N) is decremented from 4 to 3 because by observing three runs of the continuous LPS, each three run of the LPS has a length below 3.

In FIG. 34, there is shown a case that the value of the LPS pattern length (N) is incremented or decremented according to the relation of latest three run lengths histories. It is assumed that the run lengths of three LPSs are RL1, RL2, and RL3 hereinafter.

FIG. 34(a) illustrates a plan 1 of Judgement Example 2. In FIG. 34(a), comparison of the run length is performed and the value of the LPS pattern length is changed according to the tendency of increment or decrement of run length.

FIG. 34(b) illustrates a plan 2 of Judgement Example 2. In FIG. 34(b), the difference between RL1 and RL2 and the difference between RL2 and RL3 are compared. By comparing the differences of run lengths, it is possible to control the change of value of the LPS pattern length (N) in detail.

As has been described, it is characterized in that the value of the state and the value of the LPS pattern length (N) are changed to the more suitable value based on the occurrence tendency of the symbol.

Both at the encoding site and at the decoding site, the state (S) or the LPS pattern length (N) are updated by adopting the pre-described algorithm for the processed symbols. Therefore, the code data can de decoded to the original information source completely.

In the pre-described marker system, there is a case that both of the state (S) and the LPS pattern length (N) are updated. In this case, either of the value or both values can be updated according to the update condition of the two values. First, in case that the update condition of the two values separately occurs, the value of the state (S) and the value of the LPS pattern length (N) are separately changed, following the pre-described algorithm.

In case that the update condition of the two values occurs simultaneously, the following cases can be thought.

Selection Example 1.

Change the value of the state (S) and keep the value of the LPS pattern length (N).

Selection Example 2.

Estimate the code length of the terminate symbol sequence assuming the terminate symbol sequence occurs at once, and select the value to be changed with which the code length of the terminate symbol sequence becomes shorter. When the code length of the terminate symbol sequence is estimated, the following two examples can be used.

Estimation Example 1: the predicted conversion for each of the symbols of the terminate symbol sequence is performed in advance, and the code length of the terminate symbol sequence is estimated.

Estimation Example 2: the code length of the terminate symbol sequence is estimated with a state for all the symbols of the terminate symbol sequence.

In case that either of the estimation examples 1 or 2 is adopted, the same method should be used both at the encoding site and at the decoding site. In this case, the terminate symbol sequence is assumed to occur at once and the selection is made based on the code length of the terminate symbol sequence with hhe shortest length. Therefore, in case the terminate symbol sequence doesn't occur at once, it is not granted that the selection of state (S) or the LPS pattern length (N) and the change of its value should be the most suitable one.

Selection Example 3.

Both values of the state (S) and the LPS pattern length (N) are updated.

Thus, in case that the update condition of the state (S) and the LPS pattern length (N) occurs simultaneously, there are some selection cases.

Embodiment 7

In the above described embodiment, the reference symbol pattern is used as an index of the table 203. The predicted value and the state are cited from the table 203. The predicted conversion symbol 2 is input to the memory controller 202 to update the predicted value and the state dynamically. The memory controller 202 judges the timing point of the update and updates the predicted value and the state. Further, it is possible to adopt a configuration in which an arithmetic encoder and an arithmetic decoder notifies the timing point of the update to the probability estimator. The following method can be thought for an example. First, the arithmetic encoder and the arithmetic decoder notifies the timing point of a renormalization process as a timing point of updating the table to the probability estimator. Then, the memory controller update the table 203 by checking if the predicted conversion symbol 2 is MPS or LPS. In this case, in the marker system, in case that the renormalization process occurs for the dummy marker symbol or the marker symbol or the marker symbol which shows the termination of the symbol stream in encoding process or decoding process. The renormalization process caused by the marker symbol isn't treated as an object of learning for a dynamic update of the table 203.

Embodiment 8

As shown in FIG. 35, it is possible to adopt a configuration in which the region width table 206 is contained in the probability estimator and the region width 108 and the symbol 2 are output from the probability estimator to the entropy encoder or the entropy decoder.

Embodiment 9

In the above embodiments, there is shown a case that a total number of the encoding information source symbols cannot be determined in advance. But, it is possible to apply the embodiments in a case of encoding and decoding information source symbols whose total number can be determined in advance.

Embodiment 10

In the above embodiments, there is shown a case that an arithmetic encoder and decoder are used in the entropy encoder and decoder. But, it is possible to apply the embodiments in case that the arithmetic encoder and decoder are not used in the entropy encoder and decoder.

What is claimed is:

1. A coding system comprising: an encoder for encoding information source symbols, and a decoder for decoding information source symbols, wherein a total number of the information source symbols for encoding and decoding is not known before coding begins, wherein the encoder includes:
encoder information source unit memory means for storing a given number of information source symbols as an information source unit;
encoder information source unit count means for counting a number of information source units of the encoding information source symbols referring to the information source unit stored by the information source unit memory means; and
notify means for transmitting the number of information source units counted by the information source unit count means to the decoder after encoding has started, and wherein the decoder includes:
decoder information source unit memory means for storing the information source unit;
decoder information source unit count means for counting the number of information source units stored in the decoder information source unit memory means; and
decode terminate means receiving said number of information source units from said notify means,
for comparing the number of information source units counted by the decoder information source unit count means and the number of information source units notified by the notify means, and for terminating the decoding according to a result of the comparison.

2. A coding system comprising an encoder and a decoder, wherein the encoder includes:

encoder probability estimator means, the encoder probability estimator means including:
means for inputting a plurality of information source symbols to be encoded,
means for selecting a finite number of encoded information source symbols as reference symbols,
means for predicting an encoded information source symbol based on the reference symbols,
means for estimating an occurrence probability of the predicted symbol,
means for representing the estimated occurrence probability by one of a finite number of representing values,
means for performing a conversion from the information source symbol to a predicted conversion symbol according to the information source symbol and the predicted information source symbol, and
means for outputting the predicted conversion symbol and the representing value;

entropy encoding means, the entropy encoding means including:
means for receiving the predicted conversion symbol and the representing value from the probability estimator means,
means for performing an entropy encoding of the predicted conversion symbol according to the representing value and outputting an encoded symbol, and
means for placing a terminate code, which is distinguishable from the encoded symbol stream, at the end of the encoded symbol stream at the end of encoding; and notify means, the notify means including:
means for defining a size of an information source unit,
means for counting a total number of information source units during encoding,
means for placing the total number of information source units in the terminate code at the end of the entropy encoding; and, wherein the decoder includes:
decoder probability estimator means, the decoder probability estimator means includes:
means for selecting a finite number of decoded symbols, corresponding to said reference symbols,
means for predicting a decoding information source symbol based on the reference symbols.
means for estimating an occurrence probability of a predicted symbol
means for representing the estimated occurrence probability by one of a finite number of representing values,
means for outputting the representing value of the occurrence probability for the predicted information source symbol to an entropy decoding means,
means for estimating the conversion from the information source symbol to the predicted conversion symbol performed in the encoder based on the predicted symbol and a predicted conversion symbol received from an entropy decoding means;

means for performing an inversion from the predicted conversion symbol to the information source symbol, which is opposite of the estimated conversion, means for outputting information source symbols inverted as the original information source symbol;

wherein the entropy decoding means includes means for receiving the encoded symbol from the encoder and the representing value of the predicted occurrence probability for the decoding symbol from the probability estimator means, means for performing an entropy decoding of the encoded symbol received from the encoder based on the representing value of the predicted occurrence probability for the decoding symbol received from the probability estimator means, means for generating a predicted conversion symbol and outputting the predicted conversion symbol to the probability estimator means; and decode terminate means, the decode terminate means including:

means for determining a total number of decoded information source units, means for receiving the total number of information source units in the terminate code, and means for terminating the decoding when the determined number of information source units is equal to the total number of information source units received in said terminate code.

3. A coding system comprising an encoder for encoding information source symbols, and a decoder for decoding information source symbols, wherein a total number of the information source symbols for encoding and decoding is not known prior to commencement of encoding, wherein the encoder includes:

encoder information source unit memory means for storing an information source unit which is a number of information source symbols;

End Of Sequence symbol insert means for inserting an End Of Sequence symbol after each information source unit indicate whether the Information source unit is the last one;

encoding means for encoding the information source symbols including the End Of Sequence symbols inserted by the End Of Sequence symbol insert means; and wherein the decoder includes:

decoder information source unit memory means for storing a information source unit which corresponds to the information source unit of the encoder;

decode terminate means for recognizing the End of Sequence symbols inserted between the information source units and for deciding the termination of the information source symbols decoding based on the End Of Sequence symbols.

4. A coding system comprising an encoder and a decoder, wherein the encoder includes:

probability estimator means including means for inputting a plurality of information source symbols to be encoded, means for selecting a finite number of information source symbols as reference symbols, means for predicting an incoming information source symbol based on the reference symbols, means for estimating an occurrence probability of the predicted symbol, means for representing the estimated occurrence probability by one of a finite number of representing values, means for performing a conversion from the information source symbol to predicted conversion symbol according to the information source symbol and the predicted symbol, means for outputting the predicted conversion symbol and the representing value of the estimated occurrence probability for the predicted information source symbol to entropy encoding means;

entropy encoding means including means for receiving the predicted conversion symbol and the representing value, means for performing an entropy encoding of the predicted conversion symbol according to the representing value and outputting an encoded symbol, and End Of Sequence symbol insert means including means for defining an information source unit having a plurality of information source symbols, means for inserting an End Of Sequence symbol after each information source unit of the information source symbols during the entropy encoding, means for assigning a predefined representing value of a predicted occurrence probability to the End Of Sequence symbol and encoding the End Of Sequence symbols; and wherein the decoder includes:

probability estimator means including means for selecting a finite number of decoded symbols corresponding to the reference symbols of the decoder, means for predicting a decoding information source symbol based on the reference symbols, means for estimating an occurrence probability of a predicted symbol, means for representing the estimated occurrence probability by one of the representing values, means for outputting the representing value of the occurrence probability for the predicted information source symbol to an entropy decoding means, means for estimating the conversion from the information source symbol to the predicted conversion symbol performed in the encoder based on the predicted symbol and a predicted conversion symbol which are received from entropy decoding means, means for performing an inversion from the predicted conversion symbol to the information source symbol, which is opposite of the estimated conversion, means for outputting Information source symbols inverted as the original information source symbol;

wherein the entropy decoding means includes means for receiving the encoded symbol from the encoder and the representing value of the predicted occurrence probability for the decoding symbol from the probability estimator means, means for performing an entropy decoding of the encoded symbol received from the encoder based on the representing value of the predicted occurrence probability for the decoding symbol received from the probability estimator means, means for generating a predicted conversion symbol and outputting the predicted conversion symbol to the probability estimator means, and decode terminate means including means for counting a number of information source symbols decoded, means for recognizing that the next decoding symbol is the End Of Sequence symbol if the number of the decoded symbols is same as the predefined information source unit, means for decoding the End Of Sequence symbol based on a representative value of the predicted occurrence probability for the End Of Sequence symbol, means for ending the decoding if a value of the decoded End Of Sequence symbol indicates the termination of the information source symbols, and means for deleting the End Of Sequence symbol inserted as the predicted conversion symbol by the encoder, if the value of the decoder End Of Sequence symbols does not indicate the termination of the information source symbols.

5. A coding system comprising an encoder for encoding information source symbols, and a decoder for decoding information source symbols, wherein the total number of the information source symbols for encoding and decoding is not known prior to commencement of encoding, wherein the encoder includes:

detect means for detecting an occurrence of predefined encoding pattern during a information source symbol encoding;

dummy symbol adding means for adding a dummy symbol to the predefined encoding pattern detected by the detect means in the encoder;

terminate symbol sequence adding means for adding a terminate symbol sequence which has the predefined encoding pattern and terminate symbol indicating a termination of information source symbols at the end of the information source symbol encoding; and wherein the decoder includes:

detect means for detecting an occurrence of predefined encoding pattern during a information source symbol decoding;

decode terminate means for determining whether a symbol after the predefined encoding pattern detected by the detect means is the dummy symbol or the terminate symbol, and for terminating the information source symbol decoding based on the determination result.

6. A coding system comprising an encoder and a decoder, wherein the encoder includes:

probability estimator means including means for inputting each of information source symbols to be encoded, means for selecting a finite number of information source symbols as reference symbols from the source symbols already encoded, means for predicting a information source symbol to be encoded based on the reference symbols, means for estimating an occurrence probability of the predicted symbol, means for representing the estimated occurrence probability by one of a finite number of representing values, means for performing a conversion from the information source symbol to predicted conversion symbol according to the actual information source symbol to be encoded and the predicted information source symbol, means for outputting the predicted conversion symbol and the representing value of the estimated occurrence probability for the predicted information source symbol to entropy encoding means;

entropy encoding means including means for receiving the predicted conversion symbol and the representing value, means for performing an entropy encoding of the predicted conversion symbol according to the representing value and outputting an encoded symbol, and for placing terminate code, which is distinguishable from the encoded symbol stream, at the end of the encoded symbol stream at the end of encoding; and termination indicate means including means for receiving the information source symbol, means for classifying the received the information source symbol using the probability estimation means to a More Probable Symbol whose predicted occurrence probability is equal or more than 0.5 or a Less Probable Symbol whose predicted occurrence probability is less than 0.5, means for finding an N number of continuous Less Probable Symbols as a predefined coding pattern from the predicted conversion symbol stream, means for inserting one More Probable Symbol, when the predefined coding pattern is found, into the information source symbol stream so as to indicate the continuation of the information source symbol stream, means for outputting the predefined coding pattern of a one More Probable Symbol and N number of Less Probable Symbols and a terminate symbol of one Less Probable Symbol as a terminate symbol sequence which indicates a termination of information source symbol stream, and wherein the decoder includes:

probability estimator means including means for selecting a finite number of symbols, which are same as the one selected in the encoder as reference symbols from the information source symbols already decoded for a decoding information source symbol, means for predicting a decoding information source symbol based on the reference symbols, means for estimating an occurrence probability of a predicted symbol, means for representing the estimated occurrence probability by one of the representing values, means for outputting the representing value of the estimated occurrence probability for the predicted information source symbol to an entropy decoding means, means for estimating the conversion from the information source symbol to the predicted conversion symbol performed in the encoder based on the predicted symbol and a predicted conversion symbol which are received from an entropy decoding means, means for performing an inversion from the predicted conversion symbol to the information source symbol, which is opposite of the estimated conversion, means for outputting information source symbols inverted as the original information source symbol;

wherein the entropy decoding means includes means for receiving the encoded symbol from the encoder and the representing value of the predicted occurrence probability for the decoding symbol from the probability estimator means, means for performing an entropy decoding of the encoded symbol received from the encoder based on the representing value of the predicted occurrence probability for the decoding symbol received from the probability estimator means, means for generating a predicted conversion symbol and outputting the predicted conversion symbol to the probability estimator means;

decode terminate means including means for counting a number of continuous Less Probable Symbols and finding the N number of continuous Less Probable Symbols as the predefined coding pattern from the predicted conversion symbols, means for decoding the N+1 th symbol if the predefined coding pattern is found, means for deciding the symbol sequence after the previous More Probable Symbol as the terminate symbol sequence, deleting the terminate symbol sequence, and terminating the decoding, if the decoded symbol is a Less Probable Symbols, and means for deleting a More Probable Symbol and continuing the decoding if the decoded symbol is a More Probable Symbols.

7. The coding system according to one of claims 2, 4 or 6, wherein the entropy encoding means and entropy decoding means performs encoding and decoding based on a binary arithmetic coding method respectively.

8. The coding system according to one of claims 1, 2, 3, or 4, wherein information source symbol represents image data, and the information source unit is a number of pels in a line which is one of format information of image data.

9. The coding system according to one of claims 1, 2, 3 or 4, wherein the encoder transmits the size of the information source unit to the decoder prior to transmitting encoded data.

10. The coding system according to one of claim 3 or 4, wherein the information source symbols represent image data, and the information source unit is based on a stripe having at least single line, wherein the information source unit is a number of pels per line and a number of lines per stripe.

11. The coding system according to one of claims 3 or 4, wherein the encoder transmits the size of the information source unit and the End Of Sequence symbol to the decoder prior to transmitting encoded data.

12. The coding system according to one of claims 5 or 6, wherein the encoder transmits the predefined coding pattern and the terminate symbol to the decoder prior to transmitting encoded data.

13. The coding system of claim 4, wherein the End Of Sequence symbol insert means utilizes a representing value of the predicted occurrence probability used for encoding of the previous predicted conversion symbol as the representing value of the predicted occurrence probability to be assigned to the End Of Sequence symbol inserted into the predicted conversion symbol stream, and the decode terminate means utilizes a representing value of the predicted occurrence probability used for decoding of the previous predicted conversion symbol as the representing value of the predicted occurrence probability for the next decoding symbol which is identified as the End Of Sequence symbol.

14. The coding system of claim 6, wherein the termination indicate means assigns a representing value of the predicted occurrence probability used for encoding of the previous More Probable Symbol as the representing value of the predicted occurrence probability for the More Probable Symbol to be inserted as the N+1 th symbol if the Less Probable Symbol continuously appears more than number N, and assigns a representing value of the predicted occurrence probability used for the previous Less Probable Symbol as the representing value of the predicted occurrence probability for the Less Probable Symbol if the Less Probable Symbol is inserted, and the decode terminate means in the decoder uses a representing value of the predicted occurrence probability used for decoding of the previous symbol as the representing value of the predicted occurrence probability for each of the More Probable Symbol and the Less Probable Symbol for decoding of the N+1 th symbol if the number of the continuous Less Probable Symbols becomes the number N.

15. The coding system of claim 6, wherein the termination indicate means in the encoder inserts predefined K number of symbols from the N+1 th symbol if the Less Probable Symbol continuously appears more than predefined number N, and defines one or more than one symbol stream out of $2^K$ number of symbol streams represented by the K number of More Probable Symbols and Less Probable Symbols as a symbol stream to indicate the termination of the information source symbols, and the decode terminate means in the decoder decodes K number of symbols from N+1 th symbol as the symbol stream inserted for indicating the termination of the information source symbols if the number of continuous Less Probable Symbols becomes the predefined number N, and detects one or more than one symbol stream, defined by the encoder, out; of $2^K$ number of symbol streams represented by the K number of More Probable Symbols and Less Probable Symbols as a symbol stream to indicate the termination of the Information source symbols.

16. The coding system of claim 4, wherein the End Of Sequence symbol insert means in the encoder utilizes a predefined value as the representing value of the predicted occurrence probability to be assigned to the End Of Sequence symbol inserted into the predicted conversion symbol stream, and the decode terminate means in the decoder utilizes the predefined value as the representing value of the predicted occurrence probability for the next decoding symbol which is identified as the End Of Sequence symbol.

17. The coding system of claim 4, wherein the End Of Sequence symbol insert means in the encoder utilizes a dynamically predicted value based on an occurrence tendency of the information source symbols as the representing value of the predicted occurrence probability to be assigned to the End Of Sequence symbol inserted into the predicted conversion symbol stream, and the decode terminate means in the decoder utilizes a dynamically predicted value based on an occurrence tendency of the information source symbols as the representing value of the predicted occurrence probability for the next decoding symbol which is identified as the End Of Sequence symbol.

18. The coding system of claim 6, wherein the termination indicate means in the encoder assigns a predefined value as the representing value of the predicted occurrence probability for the More Probable Symbol to be inserted as the N+1 th symbol if the Less Probable Symbol continuously appears more than number N, and assigns a predefined value as the representing value of the predicted occurrence probability for the Less Probable Symbol if the Less Probable Symbol is inserted, and the decode terminate means in the decoder uses the predefined value as the representing value of the predicted occurrence probability for each of the More Probable Symbol and the Less Probable Symbol for decoding of N+1 th symbol if the number of the continuous Less Probable Symbols becomes the number N.

19. The coding system of claim 6, wherein the termination indicate means in the encoder assigns a dynamically predicted value based on an occurrence tendency of the information source symbols as the representing value of the predicted occurrence probability for the More Probable Symbol to be inserted as the N+1 th symbol if the Less Probable Symbol continuously appears more than number N, and assigns a dynamically predicted value based on an occurrence tendency of the information source symbols as the representing value of the predicted occurrence probability for the Less Probable Symbol if the Less Probable Symbol is inserted, and the entropy decoding means In the decoder uses a dynamically predicted value based on an occurrence tendency of the information source symbols as the representing value of the predicted occurrence probability for each the More Probable Symbol and the Less Probable Symbol for decoding of the N+1 th symbol if the number of the continuous Less Probable Symbols becomes the number N.

20. The coding system of claim 6, wherein the termination indicate means in the encoder and the decode terminate means in the decoder define the number N as a predefined fixed value.

21. The coding system of claim 6, wherein the termination indicate means in the encoder and the decode terminate means in the decoder changes the value of the number N.

22. A method for coding and decoding, comprising the steps of:

storing a common number of information source symbols as an information source unit in both of an encoder and a decoder;

counting a number of information source symbols for encoding and counting a number of information source units of the information source symbols;

transmitting the number of counted information source units to the decoder after starting the encoding;

counting a number of information source symbols decoded and counting a number of information source units of the information source symbols decoded; and terminating decoding based on a comparison of the counted number of decoded information source units and the transmitted number of Information source units.

23. A coding and decoding method of a system having an encoder and a decoder, comprising the steps of:

storing a common number of information source symbols as an information source unit in both of the encoder and decoder;

counting a number of information source symbols to detect a boundary of the information source units, and inserting a specific symbol between the information source symbols which indicates whether or not the information source unit is last, encoding the information source symbols and the specific symbol;

decoding the information source symbols and the specific symbol; and counting a number of decoded information source symbols to detect a boundary of the information source units and terminating decoding when the symbol after an information source unit indicates the last information source unit.

24. An encoding and decoding method of a system having an encoder and a decoder, comprising the steps of:

storing a common specific symbol sequence and a common termination symbol in both of the encoder and the decoder;

detecting the specific symbol sequence occurred in the information source symbol sequence during the encoding process and placing a dummy symbol, which is different from the termination symbol after the information source symbol sequence;

placing the specific symbol sequence and the termination symbol at the end of the encoding;

detecting the specific symbol sequence in the information source symbol sequence during the decoding process and terminating decoding when the next decoding symbol is the termination symbol.

25. An encoder for encoding information source symbols, comprising:

means for encoding a plurality of information source symbols in a plurality of lines;

means for transmitting said plurality of information source symbols;

counting means for counting a number of lines of information source symbols as the lines are transmitted;

transmission means transmitting the number of lines after starting transmission of the information source symbols.

26. The encoder of claim 25, further comprising means for transmitting a number of information source symbols in each line.

27. A decoder for decoding a plurality of information source symbols, comprising:

means for receiving said plurality of information source symbols;

means for counting a number of lines of said received information source symbols;

receiving means for receiving an indication of a number of lines in an image from an encoder; and termination means for ending decoding when said number of received lines is equal to the indication of the number of lines.

28. An encoder for encoding information source symbols, comprising:

means for counting the number of information source symbols;

means for adding an end of sequence symbol after a predetermined number of lines of information source symbols;

means for adding an end of image sequence symbol after a final group information source symbols;

means for encoding said information source symbols, said end of sequence symbol and said end of image sequence symbol to create encoded data; and means for transmitting the encoded data.

29. The encoder of claim 28, further comprising means for transmitting said predetermined number.

30. The encoder of claim 28, further comprising means for adding a plurality of symbols to the end of the image to complete a final group of information source symbols having a predetermined size.

31. A decoder for decoding a plurality of information source symbols, comprising:

means for receiving said plurality of information source symbols;

means for counting a number of lines of said received information source symbols;

receiving means for determining whether one of an end of sequence symbol and end of image signal is received after receipt of a predetermined number of lines; and termination means for ending decoding when said end of image symbol is received.

32. The decoder of claim 31, further comprising means for receiving a symbol representing said end of image symbol.

33. An encoder for encoding an image of a plurality of information source symbols, comprising:

means for adding a predetermined sequence of information source symbols at an end of said image;

means for encoding said plurality of information source symbols and said predetermined sequence of information source symbols;

means for determining whether said predetermined sequence of symbols is present in said plurality of information source symbols; and means for adding a dummy symbol to prevent said predetermined sequence from occurring.

34. The encoder of claim 33, further comprising:

means for transmitting said predetermined sequence of symbols prior to encoding said plurality information source symbols.

35. A decoder for decoding a plurality of information source signals, comprising:

means for receiving a plurality of information source symbols;

means for determining whether a predetermined sequence of information source symbols has occurred; and means for receiving a sequence of symbols which represent said predetermined sequence of symbols prior to receiving said plurality of information source symbols.

* * * * *